US012812905B2

(12) United States Patent
Hosaka et al.

(10) Patent No.: US 12,812,905 B2
(45) Date of Patent: Nov. 24, 2026

(54) SEMICONDUCTOR DEVICE, DISPLAY APPARATUS, AND MANUFACTURING METHOD OF THE SEMICONDUCTOR DEVICE

(71) Applicant: Semiconductor Energy Laboratory Co., Ltd., Atsugi (JP)

(72) Inventors: Yasuharu Hosaka, Tochigi (JP); Yasutaka Nakazawa, Tochigi (JP); Takashi Shiraishi, Tochigi (JP); Rai Sato, Tochigi (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 384 days.

(21) Appl. No.: 18/288,599

(22) PCT Filed: Apr. 28, 2022

(86) PCT No.: PCT/IB2022/053937
§ 371 (c)(1),
(2) Date: Oct. 27, 2023

(87) PCT Pub. No.: WO2022/238805
PCT Pub. Date: Nov. 17, 2022

(65) Prior Publication Data

US 2024/0213335 A1 Jun. 27, 2024

(30) Foreign Application Priority Data

May 13, 2021 (JP) ................................ 2021-081615

(51) Int. Cl.
*H10D 30/67* (2025.01)

(52) U.S. Cl.
CPC ..... *H10D 30/6729* (2025.01); *H10D 30/6731* (2025.01); *H10D 30/6755* (2025.01)

(58) Field of Classification Search
CPC .. H10D 30/031; H10D 30/0314; H10D 30/67; H10D 30/6729; H10D 30/6731;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 104538437 A 4/2015
CN 109937443 A 6/2019
(Continued)

OTHER PUBLICATIONS

International Search Report (Application No. PCT/IB2022/053937) Dated Aug. 16, 2022.
(Continued)

*Primary Examiner* — Eduardo A Rodela
(74) *Attorney, Agent, or Firm* — Robinson Intellectual Property Law Office, P.C.

(57) ABSTRACT

A miniaturized semiconductor device is provided. The semiconductor device includes a semiconductor layer over a substrate, a first conductive layer and a second conductive layer being apart from each other over the semiconductor layer, a mask layer in contact with a top surface of the first conductive layer, a first insulating layer covering the semiconductor layer, the first conductive layer, the second conductive layer, and the mask layer, and a third conductive layer overlapping with the semiconductor layer and being over the first insulating layer. The first insulating layer is in contact with a top surface and a side surface of the mask layer, a side surface of the first conductive layer, a top surface and a side surface of the second conductive layer, and a top surface of the semiconductor layer. The semicon-
(Continued)

ductor device includes a region in which the distance between opposite end portions of the first conductive layer and the second conductive layer is less than or equal to 1 μm.

18 Claims, 32 Drawing Sheets

(58) Field of Classification Search
CPC .... H10D 30/6755; H10D 99/00; H10D 64/62; H10D 64/011; H10D 86/423; H10D 86/60; H10D 30/6734; H10D 30/6757; H10K 59/1201; H10K 50/00; H10K 59/00; H10K 59/1213; H10K 59/871; H10K 59/873; G09F 9/30; H05B 33/12
See application file for complete search history.

(56) References Cited

U.S. PATENT DOCUMENTS

| | | | | |
|---|---|---|---|---|
| 8,174,021 | B2 | 5/2012 | Oikawa et al. | |
| 8,324,626 | B2 | 12/2012 | Kimura et al. | |
| 8,653,514 | B2 | 2/2014 | Yamazaki | |
| 8,680,529 | B2 | 3/2014 | Kimura | |
| 8,759,132 | B2 | 6/2014 | Kimura et al. | |
| 8,877,569 | B2 | 11/2014 | Oikawa et al. | |
| 9,040,995 | B2 | 5/2015 | Kimura | |
| 9,076,877 | B2 | 7/2015 | Yamazaki | |
| 9,171,867 | B2 | 10/2015 | Kimura et al. | |
| 9,431,427 | B2 | 8/2016 | Oikawa et al. | |
| 9,496,408 | B2 | 11/2016 | Yamazaki et al. | |
| 9,496,416 | B2 | 11/2016 | Yamazaki | |
| 9,508,862 | B2 | 11/2016 | Kimura | |
| 9,525,073 | B2 | 12/2016 | Atsumi et al. | |
| 9,741,865 | B2 | 8/2017 | Yamazaki et al. | |
| 9,899,536 | B2 | 2/2018 | Yamazaki et al. | |
| 9,954,005 | B2 | 4/2018 | Kimura et al. | |
| 10,068,926 | B2 | 9/2018 | Kimura | |
| 10,158,008 | B2 | 12/2018 | Koezuka et al. | |
| 10,283,530 | B2 | 5/2019 | Kimura | |
| 10,854,756 | B2 | 12/2020 | Saitoh et al. | |
| 11,785,827 | B2 | 10/2023 | Yamazaki et al. | |
| 2002/0072139 | A1 | 6/2002 | Kashiwabara | |
| 2005/0255257 | A1* | 11/2005 | Choi | H01J 37/32082 257/E21.279 |
| 2008/0258143 | A1* | 10/2008 | Kim | H10D 30/0316 257/E29.147 |
| 2008/0278649 | A1* | 11/2008 | Koike | H10D 86/60 438/30 |
| 2009/0159880 | A1* | 6/2009 | Honda | H10D 30/6755 438/795 |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0221343 | A1* | 8/2013 | Son | H10D 30/6713 257/43 |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0302622 | A1 | 10/2014 | Kimura et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2015/0280000 | A1* | 10/2015 | Seon | H10D 30/6755 257/66 |
| 2015/0311352 | A1 | 10/2015 | Yamazaki | |
| 2015/0349131 | A1 | 12/2015 | Atsumi et al. | |
| 2016/0086802 | A1* | 3/2016 | Hong | H10D 99/00 438/104 |
| 2016/0172595 | A1 | 6/2016 | Malinowski et al. | |
| 2016/0315133 | A1 | 10/2016 | Sato | |
| 2016/0343740 | A1 | 11/2016 | Oikawa et al. | |
| 2017/0045791 | A1* | 2/2017 | Cheng | H10D 86/00 |
| 2017/0141167 | A1 | 5/2017 | Naganuma | |
| 2017/0194360 | A1 | 7/2017 | Kimura | |
| 2017/0256754 | A1 | 9/2017 | Defranco et al. | |
| 2018/0190908 | A1 | 7/2018 | Ke et al. | |
| 2018/0350994 | A1* | 12/2018 | Hosaka | H10D 99/00 |
| 2019/0081082 | A1 | 3/2019 | Kimura | |
| 2019/0206901 | A1* | 7/2019 | Chen | H10D 30/6743 |
| 2019/0273167 | A1 | 9/2019 | Saitoh et al. | |
| 2019/0393356 | A1* | 12/2019 | Le | H10D 30/6728 |
| 2020/0057330 | A1 | 2/2020 | Yamazaki et al. | |
| 2020/0203662 | A1 | 6/2020 | Mollard et al. | |
| 2021/0158751 | A1* | 5/2021 | Cha | G09G 3/3233 |
| 2021/0202644 | A1* | 7/2021 | Wang | H10K 59/1216 |
| 2021/0313193 | A1* | 10/2021 | Yamazaki | H10D 30/6755 |
| 2022/0238563 | A1 | 7/2022 | Kimura | |

FOREIGN PATENT DOCUMENTS

| | | | |
|---|---|---|---|
| CN | 110223985 | A | 9/2019 |
| JP | 2000-036385 | A | 2/2000 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2010-206187 | A | 9/2010 |
| JP | 2014-007399 | A | 1/2014 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-058711 | A | 4/2016 |
| JP | 2016-127117 | A | 7/2016 |
| JP | 2016-197494 | A | 11/2016 |
| JP | 2017-011286 | A | 1/2017 |
| JP | 2017-076787 | A | 4/2017 |
| JP | 2017-108158 | A | 6/2017 |
| JP | 2018-189937 | A | 11/2018 |
| JP | 2019-153656 | A | 9/2019 |
| JP | 2019-179696 | A | 10/2019 |
| JP | 2020-160305 | A | 10/2020 |
| JP | 2020-170845 | A | 10/2020 |
| KR | 2015-0138029 | A | 12/2015 |
| KR | 2019-0000878 | A | 1/2019 |
| KR | 2019-0076045 | A | 7/2019 |
| KR | 2020-0044770 | A | 4/2020 |
| WO | WO-2018/087625 | | 5/2018 |

OTHER PUBLICATIONS

Written Opinion (Application No. PCT/IB2022/053937) Dated Aug. 16, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID

(56) References Cited

OTHER PUBLICATIONS

International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

SEMICONDUCTOR DEVICE, DISPLAY APPARATUS, AND MANUFACTURING METHOD OF THE SEMICONDUCTOR DEVICE

TECHNICAL FIELD

One embodiment of the present invention relates to a semiconductor device and a fabrication method of the semiconductor device. One embodiment of the present invention relates to a transistor and a fabrication method of the transistor. One embodiment of the present invention relates to a display apparatus and a manufacturing method of the display apparatus.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility or μFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; thus, a high-performance display device provided with driver circuits can be obtained.

REFERENCE

Patent Document

[Patent Document 1] Japanese Published Patent Application No. 2014-7399

SUMMARY OF THE INVENTION

Problems to be Solved by the Invention

An object of one embodiment of the present invention is to provide a miniaturized semiconductor device. Another object of one embodiment of the present invention is to provide a semiconductor device with favorable electrical characteristics. Another object of one embodiment of the present invention is to provide a semiconductor device with a high on-state current. Another object of one embodiment of the present invention is to provide a highly reliable semiconductor device. Another object of one embodiment of the present invention is to provide a semiconductor device having a novel structure. Another object of one embodiment of the present invention is to provide a method of manufacturing the semiconductor device.

Another object of one embodiment of the present invention is to provide a display apparatus with high display quality. Another object of one embodiment of the present invention is to provide a highly reliable display apparatus. Another object of one embodiment of the present invention is to provide a display apparatus that can easily achieve higher resolution. Another object of one embodiment of the present invention is to provide a display apparatus having a novel structure.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a semiconductor device including a semiconductor layer over a substrate, a first conductive layer and a second conductive layer being apart from each other over the semiconductor layer, a mask layer in contact with a top surface of the first conductive layer, a first insulating layer covering the semiconductor layer, the first conductive layer, the second conductive layer, and the mask layer, and a third conductive layer being over the first insulating layer and overlapping with the semiconductor layer. The first insulating layer is in contact with a top surface and a side surface of the mask layer, a side surface of the first conductive layer, a top surface and a side surface of the second conductive layer, and a top surface of the semiconductor layer. The semiconductor device includes a region in which the distance between opposite end portions of the first conductive layer and the second conductive layer is less than or equal to 1 μm.

The above semiconductor device preferably includes a fourth conductive layer and a second insulating layer. The fourth conductive layer is preferably provided between the semiconductor layer and the substrate. The second insulating layer is preferably provided between the semiconductor layer and the second conductive layer. Furthermore, in the above semiconductor device, an opening is preferably formed in the first insulating layer and the second insulating layer, and the third conductive layer is preferably in contact with the fourth conductive layer through the opening.

In the semiconductor device, the semiconductor layer and the mask layer preferably contain metal oxide, and the first conductive layer and the second conductive layer preferably contain a metal. In the semiconductor device, the metal oxide preferably contains indium, an element M (the element M is one or more selected from gallium, aluminum, and yttrium), and zinc. In the semiconductor device, the metal preferably contains tungsten.

Another embodiment of the present invention is a display apparatus including the above-described semiconductor device. The display apparatus preferably includes a first pixel and a second pixel adjacent to the first pixel. The first pixel preferably includes a first pixel electrode, a first EL layer over the first pixel electrode, and a common electrode over the first EL layer. The second pixel preferably includes a second pixel electrode, a second EL layer over the second pixel electrode, and the common electrode over the second EL layer. The display apparatus preferably includes a region in which the distance between the first pixel electrode and the second pixel electrode is less than or equal to 8 μm.

Another embodiment of the present invention is a method of manufacturing a semiconductor device, including the steps of: forming a semiconductor layer containing metal oxide over a substrate; forming a conductive film to cover the semiconductor layer; forming a mask film containing metal oxide over the conductive film; forming a first resist mask over the mask film; processing the mask film with use of the first resist mask to form a mask layer; forming a second resist mask over the conductive film; processing the conductive film with use of the mask layer and the second resist mask to form a first conductive layer and a second conductive layer; forming an insulating layer to cover the first conductive layer, the second conductive layer, the mask layer, and the semiconductor layer; and forming, over the insulating layer, a third conductive layer to overlap with the semiconductor layer. The distance between opposite end portions of the first conductive layer and the second conductive layer is less than or equal to 1 μm.

In the method of manufacturing a semiconductor device, the mask film is preferably processed by a wet etching method. Furthermore, the conductive film is preferably processed by a dry etching method.

In the method of manufacturing a semiconductor device, each of the semiconductor layer and the mask film preferably contains indium, an element M (the element M is one or more selected from gallium, aluminum, and yttrium), and zinc.

In the method of manufacturing a semiconductor device, the conductive film preferably contains tungsten.

Effect of the Invention

One embodiment of the present invention can provide a miniaturized semiconductor device. Another embodiment of the present invention can provide a semiconductor device with favorable electrical characteristics. Another embodiment of the present invention can provide a semiconductor device with a high on-state current. Another embodiment of the present invention can provide a highly reliable semiconductor device. Another embodiment of the present invention can provide a semiconductor device having a novel structure. Another embodiment of the present invention can provide a method of manufacturing the semiconductor device.

Another embodiment of the present invention can provide a display apparatus with high display quality. Another embodiment of the present invention can provide a highly reliable display apparatus. Another embodiment of the present invention can provide a display apparatus that can easily achieve higher resolution. Another embodiment of the present invention can provide a display apparatus having a novel structure.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 11A to FIG. 11D are diagrams illustrating structure examples of a display apparatus.

MODE FOR CARRYING OUT THE INVENTION

Figure 1A:
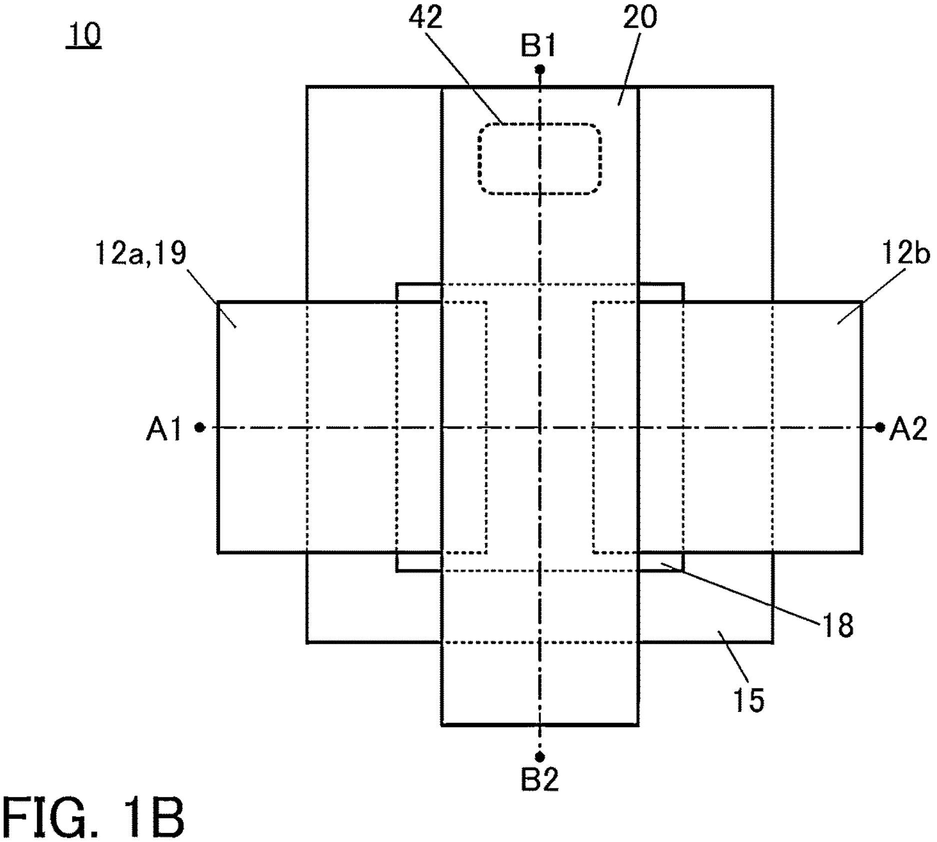
FIG. 1A is a top view illustrating a structure example of a transistor.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

In each drawing described in this specification, the size, the layer thickness, or the region of each component is exaggerated for clarity in some cases.

Ordinal numbers such as "first", "second", and "third" used in this specification are used in order to avoid confusion among components, and the terms do not limit the components numerically.

In this specification, terms for describing arrangement, such as "over" and "under," are used for convenience to describe the positional relationship between components with reference to drawings. The positional relationship between components is changed as appropriate in accordance with a direction in which each component is described. Thus, terms for the description are not limited to those used in this specification, and the description can be rephrased appropriately depending on the situation.

Furthermore, in this specification and the like, functions of a source and a drain of a transistor are sometimes switched from each other depending on the polarity of the transistor, a change in the direction of current flow in circuit operation, or the like. Therefore, the terms "source" and "drain" can be used interchangeably.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to drain current of a transistor in an off state (also referred to as a non-conducting state or a cutoff state). Unless otherwise specified, an off state refers to a state where the voltage Vgs between a gate and a source is lower than the threshold voltage Vth in an n-channel transistor (higher than Vth in a p-channel transistor).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can also be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel. In this specification and the like, a substrate of a touch panel on which a connector and an IC are mounted is referred to as a touch panel module, a display module, or simply a touch panel or the like in some cases.

Embodiment 1

In this embodiment, a semiconductor device of one embodiment of the present invention, a manufacturing method thereof, and the like will be described.

One embodiment of the present invention is a transistor including a semiconductor layer over a substrate, a source electrode and a drain electrode provided to be apart from each other over the semiconductor layer, a mask layer provided in contact with a top surface of one of the source electrode and the drain electrode, a gate insulating layer provided to cover the semiconductor layer, the source electrode, the drain electrode, and the mask layer, and a gate electrode provided over the gate insulating layer to overlap with the semiconductor layer. The semiconductor layer preferably contains a metal oxide exhibiting semiconductor characteristics (hereinafter also referred to as an oxide semiconductor). Note that in this specification and the like, a mask layer may be referred to as a sacrificial layer.

In one embodiment of the present invention, a conductive film over the semiconductor layer is etched with use of a mask layer containing an inorganic material and a resist mask containing an organic material to form the source electrode and the drain electrode. Thus, the distance between opposite end portions of the source electrode and the drain electrode can be reduced not to the light exposure limit of photolithography but to the limit of the alignment accuracy of the mask layer and the resist mask.

Accordingly, a region in which the distance between the opposite end portions of the source electrode and the drain electrode (channel length L) is less than or equal to 3 μm, preferably less than or equal to 2 μm, further preferably less than or equal to 1 μm, still further preferably less than or equal to 0.7 μm, yet still further preferably less than or equal to 0.5 μm can be included. In particular, the channel length L is preferably less than or equal to 1 μm. Such a structure can increase the on-state current of the transistor. Alternatively, the channel width can be reduced in a state where the on-state current of the transistor is relatively high.

A semiconductor device of one embodiment of the present invention and a manufacturing method thereof are described below with reference to FIG. 1 to FIG. 9.

Structure Example

Figure 1B:
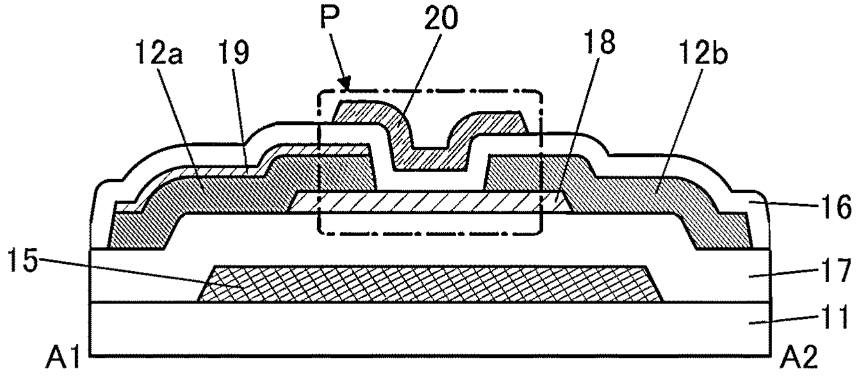
FIG. 1B and FIG. 1C are cross-sectional views illustrating the structure example of the transistor.
Figure 1C:
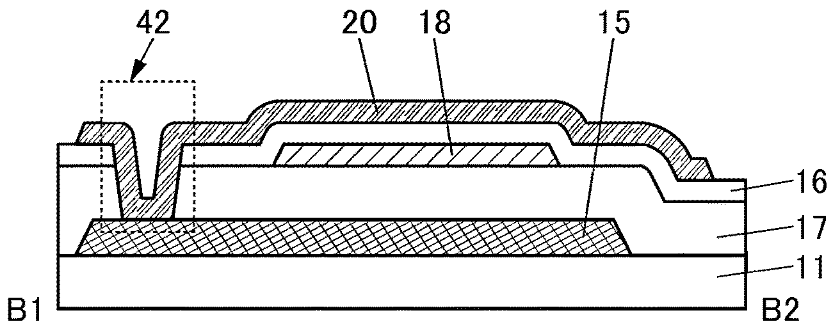
Figure 2A:
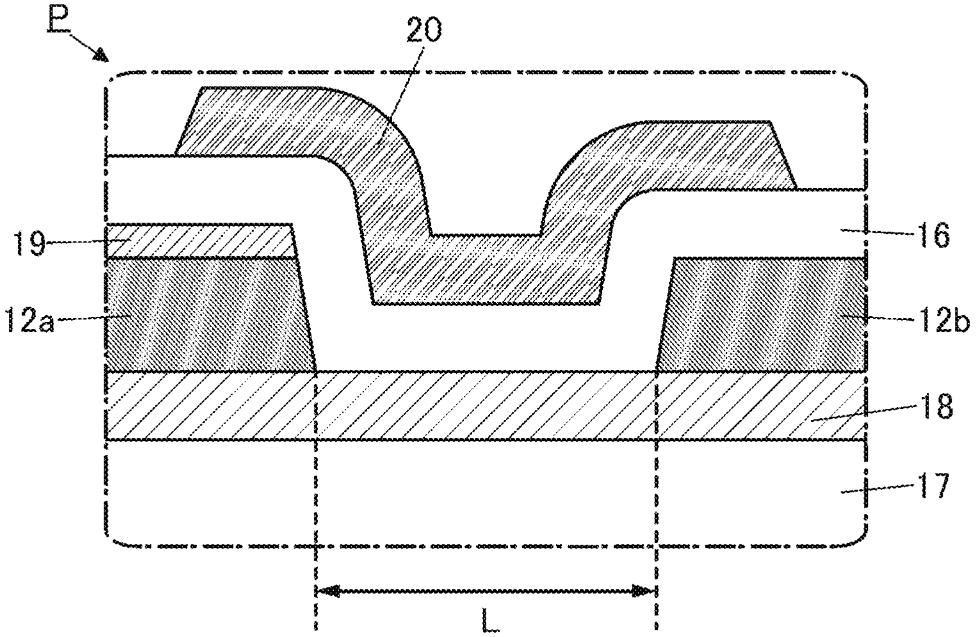
FIG. 2A and FIG. 2B are cross-sectional views illustrating structure examples of a transistor.

FIG. 1A is a top view of a transistor 10, FIG. 1B corresponds to a cross-sectional view of a cut plane along the dashed-dotted line A1-A2 shown in FIG. 1A, and FIG. 1C corresponds to a cross-sectional view of a cut plane along the dashed-dotted line B1-B2 shown in FIG. 1A. The direction of the dashed-dotted line A1-A2 corresponds to a channel length direction, and the direction of the dashed-dotted line B1-B2 corresponds to a channel width direction. Note that in FIG. 1A, some components (e.g., a gate insulating layer) of the transistor 10 are not illustrated. Some components are not illustrated in top views of transistors in the following drawings, as in FIG. 1A. FIG. 2A illustrates an enlarged cross-sectional view of a region P surrounded by a dashed-dotted line in FIG. 1B.

A transistor 10 is provided over a substrate 11, and includes a conductive layer 15, an insulating layer 17, a semiconductor layer 18, a conductive layer 12*a*, a conductive layer 12*b*, a mask layer 19, an insulating layer 16, a conductive layer 20, and the like. The insulating layer 17 is provided to cover the conductive layer 15. The semiconductor layer 18 has an island shape and is provided over the insulating layer 17. The conductive layer 12*a* and the conductive layer 12*b* are each in contact with a top surface of the semiconductor layer 18 and are apart from each other over the semiconductor layer 18. The mask layer 19 is provided in contact with a top surface of the conductive layer 12*a*. The insulating layer 16 is provided to cover the insulating layer 17, the conductive layer 12*a*, the conductive layer 12*b*, the mask layer 19, and the semiconductor layer 18. The conductive layer 20 is provided over the insulating layer 17 and overlaps with a region of the semiconductor layer 18 which does not overlap with the conductive layer 12*a* and the conductive layer 12*b*, with the insulating layer 17 therebetween.

In the transistor 10, the conductive layer 20 functions as a top gate electrode (sometimes referred to as a first gate electrode) and the conductive layer 15 functions as a bottom gate electrode (sometimes referred to as a second gate electrode). The insulating layer 16 functions as a gate insulating layer with respect to the top gate electrode and the insulating layer 17 functions as a gate insulating layer with respect to the bottom gate electrode. The conductive layer 12*a* functions as one of a source electrode and a drain electrode and the conductive layer 12*b* functions as the other of the source electrode and the drain electrode.

The conductive layer 15 is preferably formed with a conductive film containing a metal or an alloy, in which case the electric resistance can be reduced. For example, tungsten or the like can be used for the conductive layer 15. Note that a conductive metal oxide film may be used as the conductive layer 15.

It is preferable to use an oxide film as the insulating layer 17. It is particularly preferable to use an oxide film for a portion in contact with the semiconductor layer 18.

The insulating layer 17 preferably has high withstand voltage. The high withstand voltage of the insulating layer 17 results in a transistor with high reliability.

The stress of the insulating layer 17 is preferably small. The small stress of the insulating layer 17 can inhibit occurrence of problems during the process caused by stress such as warpage of the substrate.

The insulating layer 17 preferably functions as a barrier film that inhibits diffusion of impurities such as water, hydrogen, and sodium into the transistor 10 from the substrate 11 side. In addition, the insulating layer 17 preferably functions as a barrier film that inhibits diffusion of a component of the conductive layer 15 into the transistor 10. The insulating layer 17 functions as a barrier film that inhibits diffusion of impurities and the like; thus, the transistor can have favorable electrical characteristics and high reliability.

Moreover, the amount of impurities such as water and hydrogen released from the insulating layer 17 itself is preferably small. With the insulating layer 17 from which a small amount of impurities is released, diffusion of impurities to the transistor 10 side is inhibited, and the transistor can have favorable electrical characteristics and high reliability.

Furthermore, the insulating layer 17 preferably functions as a barrier film that inhibits diffusion of oxygen. The insulating layer 17 having a function of inhibiting diffusion of oxygen inhibits diffusion of oxygen into the conductive layer 15 from above the insulating layer 17 and thus can inhibit oxidation of the conductive layer 15. Consequently, the transistor can have favorable electrical characteristics and high reliability.

A region of the semiconductor layer 18 which overlaps with the conductive layer 20 functions as a channel formation region. The transistor 10 is what is called a dual-gate transistor including the conductive layer 20 functioning as a top gate electrode and the conductive layer 15 functioning as a bottom gate electrode over and under the semiconductor layer 18. The transistor 10 has what is called a channel-etched structure in which no protective layer is provided between a top surface of the channel formation region of the semiconductor layer 18 and the source and drain electrodes.

In the semiconductor layer 18, a pair of low-resistance regions, which are positioned in portions in contact with the conductive layer 12*a* and the conductive layer 12*b* and in the vicinity thereof and function as a source region and a drain region, may be formed. The regions are part of the semiconductor layer 18 and have lower resistance than the channel formation region. The low-resistance regions can also be referred to as regions with high carrier concentrations, n-type regions, or the like. In the semiconductor layer 18, a region that is sandwiched between the pair of low-resistance regions and overlaps with the conductive layer 20 functions as a channel formation region.

The semiconductor layer 18 contains a metal oxide exhibiting semiconductor characteristics (hereinafter, also referred to as an oxide semiconductor). Oxide semiconductors can be classified into a single crystal oxide semiconductor and a non-single-crystal oxide semiconductor. Examples of a non-single-crystal oxide semiconductor include a CAAC-OS, a polycrystalline oxide semiconductor, an nc-OS, an amorphous-like oxide semiconductor (a-like OS), and an amorphous oxide semiconductor.

It is preferable to use a metal oxide film having crystallinity as the semiconductor layer 18. The semiconductor layer 18 preferably contains at least indium and oxygen. When the semiconductor layer 18 contains an oxide of indium, the carrier mobility can be increased; accordingly, for example, a transistor enabling higher current flow than a transistor containing amorphous silicon can be obtained.

Here, the composition of the semiconductor layer 18 is described. The semiconductor layer 18 preferably contains a metal oxide containing at least indium and oxygen. Moreover, the metal oxide contained in the semiconductor layer 18 may contain zinc additionally. The metal oxide contained in the semiconductor layer 18 may contain gallium. Specifically, an oxide containing indium, gallium, and zinc is preferably used for the semiconductor layer 18.

For example, the semiconductor layer 18 preferably contains indium, an element M (the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc. In particular, the element M is preferably aluminum, gallium, yttrium, or tin.

Typically, an indium oxide, an indium zinc oxide (In—Zn oxide), an indium gallium zinc oxide (also denoted as In—Ga—Zn oxide or IGZO), or the like can be used for the semiconductor layer 18. Alternatively, an indium tin oxide (In—Sn oxide), an indium tin oxide containing silicon, or the like can be used. The material that can be used for the semiconductor layer 18 is described in detail later.

It is preferable to use a metal oxide film having crystallinity as the semiconductor layer 18. For example, a metal oxide film having a CAAC (c-axis aligned crystal) structure, which is described later, a polycrystalline structure, a nanocrystal (nc) structure, or the like can be used. By using a metal oxide film having crystallinity as the semiconductor layer 18, the density of defect states in the semiconductor layer 18 can be reduced, which enables the semiconductor device to have high reliability.

The crystallinity of the semiconductor layer can be analyzed with X-ray diffraction (XRD), a transmission electron microscope (TEM), electron diffraction, or the like, for example.

As the semiconductor layer 18 has higher crystallinity, the density of defect states in the film can be lower. By contrast, the use of a metal oxide film with low crystallinity enables a transistor to flow a large amount of current.

In the case where the metal oxide film is formed by a sputtering method, the crystallinity of the formed metal oxide film can be increased as the substrate temperature (the stage temperature) at the time of formation is higher. The crystallinity of the formed metal oxide film can be increased as the proportion of a flow rate of an oxygen gas in the whole film formation gas (also referred to as oxygen flow rate ratio) used at the time of formation is higher.

With the semiconductor layer 18 having high crystallinity, the semiconductor layer 18 can be inhibited from being partly etched and lost at the time of processing the conductive layer 12*a* and the conductive layer 12*b*.

The semiconductor layer 18 may have a stacked-layer structure in which an upper layer and a lower layer are different in at least one of composition, crystallinity, and impurity concentration. Note that a boundary (interface) between the upper layer and the lower layer of the semiconductor layer 18 cannot be clearly observed in some cases. A stacked-layer structure of three or more layers may also be employed.

In the case where the semiconductor layer 18 has a stacked-layer structure, the layers can be formed separately in different formation conditions, for example. The flow rate of oxygen gas in the film formation gas can be made different between the upper layer and the lower layer, for example.

In the case where the semiconductor layer 18 has a stacked-layer structure, successive formation is preferably performed using the same sputtering target in the same treatment chamber because the interface can be favorable. Although the formation conditions such as pressure, temperature, and power at the time of the formation may vary between the metal oxide films, it is particularly preferable to employ the same conditions except for the oxygen flow rate ratio because the time required for formation steps can be shortened. The semiconductor layer 18 may have a stacked-layer structure of metal oxide films with different compositions. In the case where metal oxide films with different compositions are stacked, successive formation without exposure to the air is preferably performed.

The substrate temperature at the time of forming the semiconductor layer 18 is preferably higher than or equal to room temperature (25° C.) and lower than or equal to 200° C., further preferably higher than or equal to room temperature and lower than or equal to 130° C. With the substrate temperature in the above range, the bending or warpage of the substrate can be inhibited in the case where a large-area glass substrate is used. When the semiconductor layer 18 has a stacked-layer structure and the upper layer and the lower layer are formed at the same substrate temperature, the productivity can be increased.

Here, oxygen vacancies that might be formed in the semiconductor layer 18 will be described.

In the case where the semiconductor layer 18 includes an oxide semiconductor, particularly, hydrogen contained in the oxide semiconductor reacts with oxygen bonded to a metal atom to be water, and thus sometimes forms an oxygen vacancy ($V_O$) in the oxide semiconductor. In some cases, a defect where hydrogen enters an oxygen vacancy (hereinafter, referred to as $V_OH$) functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

$V_OH$ can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the semiconductor layer 18, the amount of $V_OH$ in the semiconductor layer 18 is preferably reduced as much as possible so that the semiconductor layer 18 becomes a highly purified intrinsic or substantially highly purified intrinsic semiconductor layer. In order to obtain such an oxide semiconductor with sufficiently reduced $V_OH$, it is important to remove impurities such as water and hydrogen in the oxide semiconductor (this treatment is sometimes referred to as dehydration or dehydrogenation treatment) and supply oxygen to the oxide semiconductor to compensate for oxygen vacancies (this treatment is sometimes referred to as oxygen adding treatment). When an oxide semiconductor with sufficiently reduced impurities such as $V_OH$ is used for a channel formation region of a transistor, stable electrical characteristics can be given.

When an oxide semiconductor is used for the semiconductor layer 18, the carrier concentration of the oxide semiconductor in a region functioning as a channel formation region is preferably lower than or equal to $1\times10^{18}$ $cm^{-3}$, further preferably lower than $1\times10^{17}$ cm$^{-3}$, still further preferably lower than $1\times10^{16}$ cm$^{-3}$, yet still further preferably lower than $1\times10^{13}$ cm$^{-3}$, yet still further preferably lower than $1\times10^{12}$ cm$^{-3}$. Note that the lower limit of the carrier concentration of the oxide semiconductor in the region functioning as the channel formation region is not particularly limited and can be, for example, $1\times10^{-9}$ cm$^{-3}$.

The conductive layer 12*a* and the conductive layer 12*b* function as a source electrode and a drain electrode. The conductive layer 12*a* and the conductive layer 12*b* are preferably formed using a conductive film containing a metal or an alloy, in which case the electric resistance can be reduced. Note that a conductive metal oxide film may be used as the conductive layer 12*a* and the conductive layer 12*b*.

Here, the conductive layer 12*a* and the conductive layer 12*b* are formed with a material having a high etching selectivity at the time of processing the mask layer 19. For example, tungsten can be used for the conductive layer 12*a* and the conductive layer 12*b*.

Note that although the conductive layer 12*a* and the conductive layer 12*b* in FIG. 1A have island shapes, one embodiment of the present invention is not limited thereto, and at least one of the conductive layer 12*a* and the conductive layer 12*b* may be extended to form a wiring.

The mask layer 19 functions as a hard mask when a conductive film is processed to form the conductive layer 12*a*. For this reason, it is preferable that the mask layer 19 be formed in contact with the top surface of the conductive layer 12*a* and a side surface of the mask layer 19 be substantially aligned with a side surface of the conductive layer 12*a*. In a top view, the side surface of the conductive layer 12*a* is positioned on an inner side of the side surface of the mask layer 19 in some cases. Although FIG. 1A and FIG. 1B illustrate a structure in which the mask layer 19 is provided over the conductive layer 12*a*, one embodiment of the present invention is not limited thereto, and the mask layer 19 may be provided over the conductive layer 12*b*.

The mask layer 19 is preferably formed with a material having high etching selectivity at the time of processing the conductive layer 12*a* and the conductive layer 12*b*. As the mask layer 19, an inorganic film such as a metal film, an alloy film, a metal oxide film, a semiconductor film, or an inorganic insulating film can be suitably used.

Alternatively, an oxide film can be used as the mask layer 19. Typically, an oxide film or an oxynitride film such as silicon oxide, silicon oxynitride, aluminum oxide, aluminum oxynitride, hafnium oxide, or hafnium oxynitride can be used. Alternatively, a nitride film can be used as the mask layer 19, for example. Specifically, a nitride such as silicon nitride, aluminum nitride, hafnium nitride, titanium nitride, tantalum nitride, tungsten nitride, gallium nitride, or germanium nitride can be used. Such an inorganic material can be formed by a deposition method such as a sputtering method, a chemical vapor deposition (CVD) method, or an atomic layer deposition (ALD) method, for example.

For example, a metal material such as gold, silver, platinum, magnesium, nickel, tungsten, chromium, molybdenum, iron, cobalt, copper, palladium, titanium, aluminum, yttrium, zirconium, and tantalum, or an alloy material containing the metal material can be used for the mask layer 19. It is particularly preferable to use a low-melting-point material such as aluminum or silver.

Alternatively, the mask layer 19 can be formed using a metal oxide such as an indium-gallium-zinc oxide (also referred to as In—Ga—Zn oxide or IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, an indium tin oxide containing silicon or the like can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium.

For example, indium gallium zinc oxide which contains the same metal element as the semiconductor layer 18 is preferably used for the mask layer 19. With the use of the mask layer 19, the etching selectivity with respect to the mask layer 19 and the semiconductor layer 18 can be increased easily at the time of processing the conductive layer 12*a* and the conductive layer 12*b*.

In the transistor 10 described in this embodiment, the conductive layer 12*a* and the conductive layer 12*b* are formed by patterning with use of different masks (hereinafter referred to as double patterning in some cases). Thus, the distance between opposite end portions of the conductive layer 12*a* and the conductive layer 12*b* can be reduced not to the light exposure limit of photolithography but to the limit of the alignment accuracy of the mask layer 19 and the resist mask 40.

Accordingly, as illustrated in FIG. 2(A), a region in which the distance between the opposite end portions of the conductive layer 12*a* and the conductive layer 12*b* (channel length L) is less than or equal to 3 μm, preferably less than or equal to 2 μm, further preferably less than or equal to 1 μm, still further preferably less than or equal to 0.7 μm, yet still further preferably less than or equal to 0.5 μm can be included. Such a structure can increase the on-state current (in other words, improve on-state characteristics) of the transistor 10. Alternatively, the channel width can be reduced in a state where the on-state current of the transistor 10 is relatively high.

In this manner, a semiconductor device including the transistor 10 can be miniaturized. For example, even in the display apparatus including ultra-high-resolution pixels, the pixel circuit can also be sufficiently miniaturized with use of the transistor 10. The transistor 10 has favorable on-state characteristics and thus can be used as, for example, a driving transistor that requires a large amount of current even in the miniaturized pixel circuit. For example, in the case where a scan line driver circuit (referred to as a gate driver in some cases) is formed with the miniaturized transistor 10, the scan line driver circuit can be reduced in size. Therefore, the display apparatus can have a narrower frame.

Figure 2B:
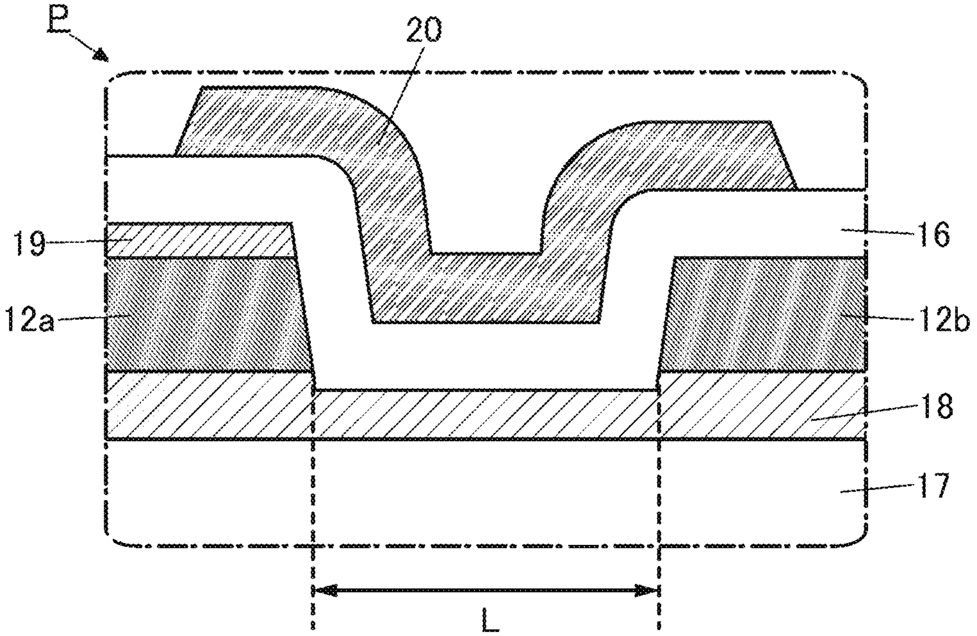

The surface of the semiconductor layer 18 might be damaged at the time of forming the conductive layer 12*a* and the conductive layer 12*b*. The damaged layer is preferably removed because $V_O$ is formed in the damaged semiconductor layer 18 and hydrogen in the semiconductor layer 18 enters $V_O$ to form $V_OH$ in some cases. Removing the damaged layer allows the transistor to have favorable electrical characteristics and high reliability. FIG. 2B illustrates an example of a structure in which the damaged layer is removed. FIG. 2B is an enlarged cross-sectional view of the region P surrounded by the dashed-dotted line in FIG. 1B. FIG. 2B illustrates an example in which the thickness of a region of the semiconductor layer 18 that overlaps with neither the conductive layer 12*a* nor the conductive layer 12*b* is smaller than the thickness of a region that overlaps with either the conductive layer 12*a* or the conductive layer 12*b*.

The insulating layer 16 functions as a gate insulating layer with respect to the top gate electrode. The insulating layer 16 is in contact with a top surface and the side surface of the mask layer 19, the side surface of the conductive layer 12*a*, a top surface and a side surface of the conductive layer 12*b*, and the top surface of the semiconductor layer 18. It is preferable to use an oxide film as the insulating layer 16. It is particularly preferable to use an oxide film for a portion in contact with the semiconductor layer 18.

The insulating layer 16 preferably has high withstand voltage. The high withstand voltage of the insulating layer 16 results in a transistor with high reliability.

As the insulating layer 16, for example, an oxide film such as a silicon oxide film or a silicon oxynitride film is preferably formed with a plasma-enhanced chemical vapor deposition apparatus (a PECVD apparatus or simply referred to as a plasma CVD apparatus).

The insulating layer 16 preferably has a low defect density. When the defect density of the insulating layer 16 is high, oxygen is bonded to the defects and the oxygen permeability of the insulating layer 16 decreases. With the use of the insulating layer 16 having a low defect density, the transistor with a small change in the threshold voltage and excellent electrical characteristics can be obtained. In the case where an insulating film containing silicon is used as the insulating layer 16, for example, the spin density of a signal that appears at g=2.001 due to a dangling bond of silicon is preferably lower than or equal to $3\times10^{17}$ spins/cm$^3$ in ESR measurement.

The insulating layer 16 is formed over the semiconductor layer 18, and thus is preferably a film formed under conditions where damage to the semiconductor layer 18 is small. For example, the insulating layer 16 can be formed at a sufficiently low film formation rate. For example, when the insulating layer 16 is formed by a plasma CVD method under a low-power condition, damage to the semiconductor layer 18 can be extremely small.

For example, a source gas that contains a silicon-containing deposition gas such as silane or disilane and an oxidizing gas such as oxygen, ozone, dinitrogen monoxide, or nitrogen dioxide can be used as a film formation gas for formation of a silicon oxynitride film. A dilution gas such as argon, helium, or nitrogen may be contained in addition to the source gas.

When the proportion of the flow rate of the deposition gas in the total flow rate of the film formation gas (hereinafter, also simply referred to as a flow rate ratio) is low, for example, the film formation rate can be made low, which allows formation of a dense film with few defects.

The insulating layer 16 may be a stacked-layer film. 1. The stacked-layer film is preferably formed without being exposed to the air by changing the flow rate ratio of a film formation gas, electric power at the time of deposition, and the like. For example, the above-described film formed under the conditions that are less likely to damage the semiconductor layer 18 may be formed as a lower layer, and a film with a high deposition rate (a thick film) may be formed thereover. In that case, the film with a high deposition rate may be formed by increasing the proportion of the deposition gas rate and increasing the electric power.

An extremely dense film that has fewer defects on the surface and is less likely to adsorb impurities contained in the air, such as water, is preferably formed over the film with a high deposition rate in the stacked-layer film. The dense film can be formed under a condition that the film formation rate is sufficiently low as well as the film formed under the conditions that are less likely to damage the semiconductor layer 18.

The conductive layer 20 functions as a top gate electrode and includes a region overlapping with the semiconductor layer 18 with the insulating layer 16 positioned therebetween. The region is positioned between the conductive layer 12*a* and the conductive layer 12*b*.

As illustrated in FIG. 1C, the conductive layer 20 may be electrically connected to the conductive layer 15 through an opening 42 provided in the insulating layer 16 and the insulating layer 17. Accordingly, the same potential can be supplied to the conductive layer 20 and the conductive layer 15, which enables a transistor having high on-state current to be provided.

As illustrated in FIG. 1C, the conductive layer 15 and the conductive layer 20 preferably extend beyond the end portion of the semiconductor layer 18 in the channel width direction. In that case, as illustrated in FIG. 1C, the semiconductor layer 18 in the channel width direction is entirely surrounded by the conductive layer 15 and the conductive layer 20.

With such a structure, the semiconductor layer 18 can be electrically surrounded by electric fields generated by the pair of gate electrodes. In that case, it is particularly preferable that the same potential be supplied to the conductive layer 15 and the conductive layer 20. In that case, electric fields for inducing a channel can be effectively applied to the semiconductor layer 18, whereby the on-state current of the transistor 10 can be increased. Thus, the transistor 10 can also be miniaturized.

In the transistor 10, a potential for controlling the threshold voltage can be supplied to one of the conductive layer 15 and the conductive layer 20, and a potential for controlling an on/off state of the transistor 10 can be supplied to the other.

With such a structure, a transistor that has favorable electrical characteristics and extremely high reliability can be provided.

The conductive layer 20 is preferably formed using a conductive film containing a metal or an alloy, in which case the electric resistance can be reduced. Note that a conductive metal oxide film may be used as the conductive layer 20.

The conductive layer 20 may have a stacked-layer structure. For example, the conductive layer 20 may have a stacked-layer structure of a metal oxide layer and a metal layer over the metal oxide layer. The metal oxide layer has a function of supplying oxygen into the insulating layer 16. In the case where a conductive film containing a metal or an alloy that is easily oxidized is used as the metal layer, the metal oxide layer can function as a barrier layer that prevents the metal layer from being oxidized by oxygen in the insulating layer 16. Note that the metal oxide layer may be in contact with the insulating layer 16 by removing the metal oxide layer before the formation of the metal layer. For the metal oxide layer, a metal oxide that can be used for the semiconductor layer 18 may be used.

Modification Example

Modification examples of the structure example of the transistor described above are described below. Note that in the following description, portions similar to those of the transistor 10 illustrated in FIG. 1A to FIG. 1C are not described in some cases.

Modification Example 1

Figure 3A:
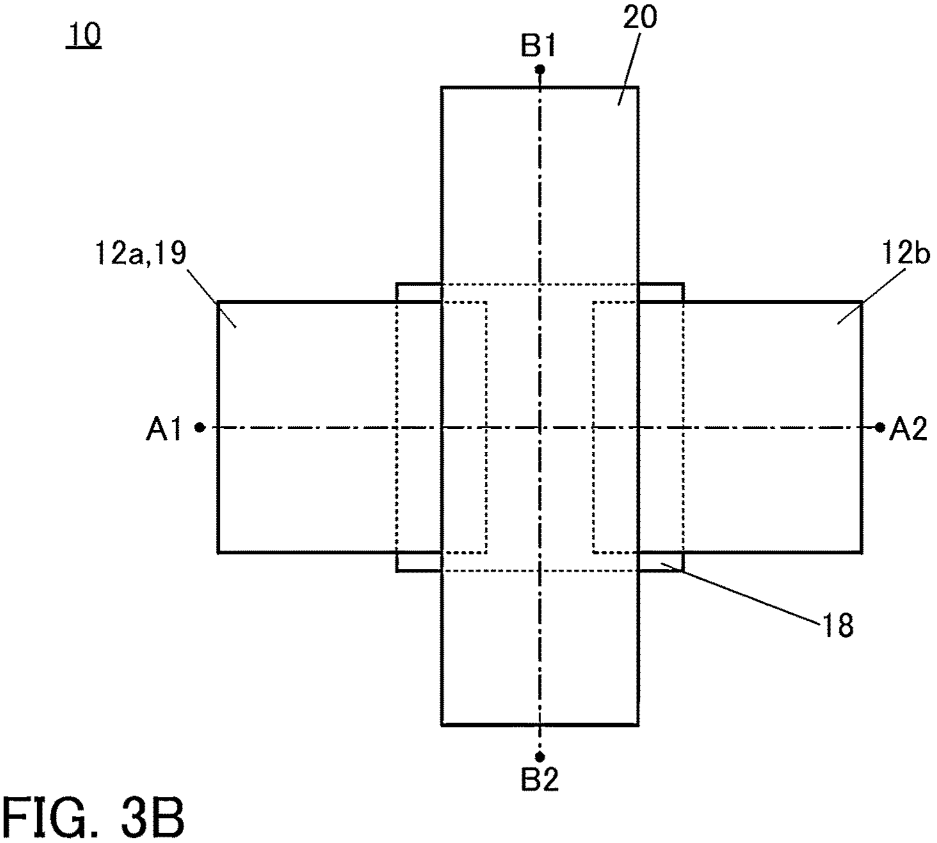
FIG. 3A is a top view illustrating a structure example of a transistor.
Figure 3B:
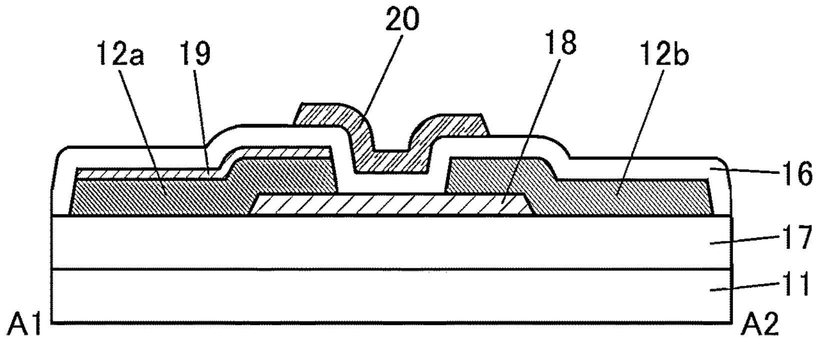
FIG. 3B and FIG. 3C are cross-sectional views illustrating the structure example of the transistor.
Figure 3C:
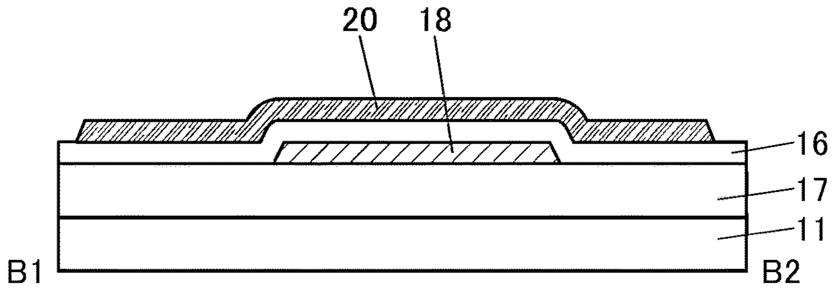

The transistor 10 illustrated in FIG. 3A to FIG. 3C is different from the transistor 10 illustrated in FIG. 1A to FIG. 1C in not including the conductive layer 15. Note that FIG. 3A to FIG. 3C correspond to FIG. 1A to FIG. 1C, respectively.

The transistor 10 illustrated in FIG. 3A to FIG. 3C is what is called a top-gate transistor, in which the conductive layer 20 functioning as the gate electrode is provided over the semiconductor layer 18. The transistor 10 has what is called a channel-etched structure in which no protective layer is provided between a top surface of the channel formation region of the semiconductor layer 18 and the source electrode and the drain electrode.

Note that although the conductive layer 20 in FIG. 3A has an island shape, one embodiment of the present invention is not limited to this and the conductive layer 20 may be extended to form a wiring.

Modification Example 2

Figure 4A:
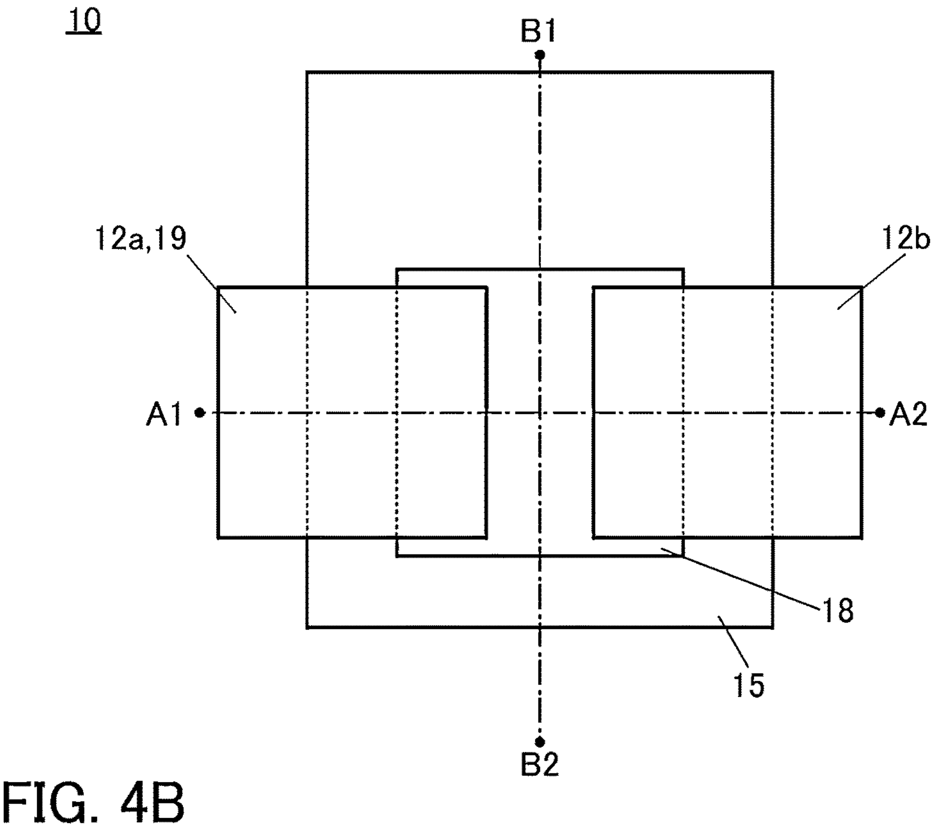
FIG. 4A is a top view illustrating a structure example of a transistor.
Figure 4B:
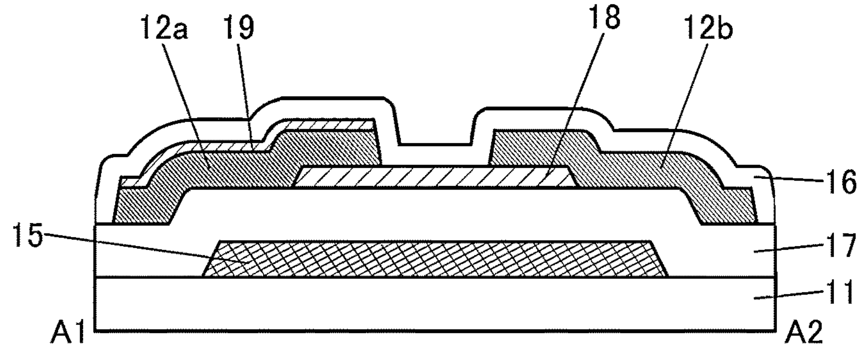
FIG. 4B and FIG. 4C are cross-sectional views illustrating the structure example of the transistor.
Figure 4C:
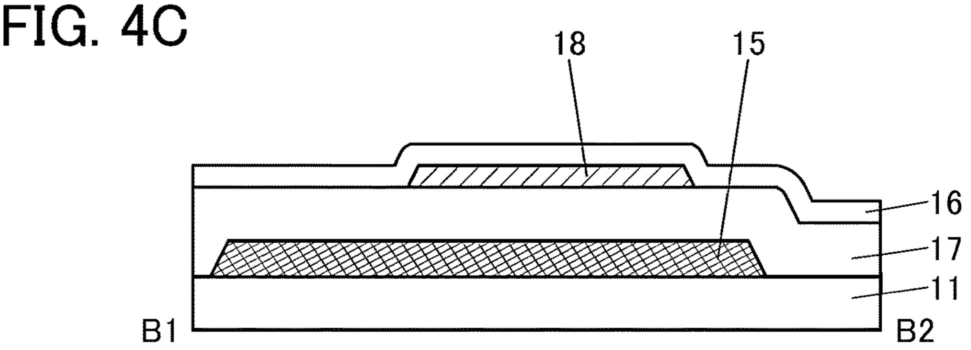

The transistor 10 illustrated in FIG. 4A to FIG. 4C is different from the transistor 10 illustrated in FIG. 1A to FIG. 1C in not including the conductive layer 20. Note that FIG. 4A to FIG. 4C correspond to FIG. 1A to FIG. 1C, respectively.

A region of the semiconductor layer 18 which overlaps with the conductive layer 15 functions as a channel formation region. The transistor 10 is what is called a bottom-gate transistor in which the gate electrode is provided closer to a formation surface side than the semiconductor layer 18 is. Here, a side of the semiconductor layer 18 opposite to the conductive layer 15 side is sometimes referred to as a back channel side. The transistor 10 has what is called a channel-etched structure in which no protective layer is provided between the back channel side of the semiconductor layer 18 and the source and drain electrodes.

Note that although the conductive layer 15 in FIG. 4A has an island shape, one embodiment of the present invention is not limited to this and the conductive layer 15 may be extended to form a wiring.

Modification Example 3

Figure 5A:
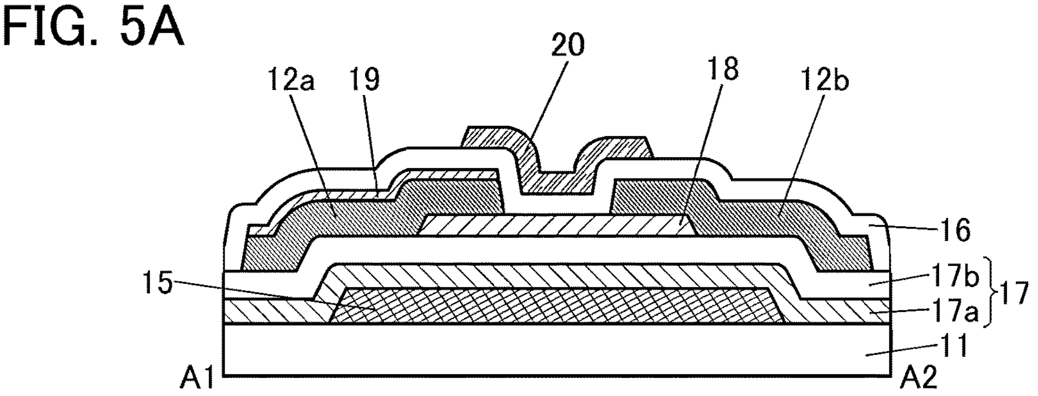
FIG. 5A to FIG. 5D are cross-sectional views illustrating structure examples of a transistor.
Figure 5B:
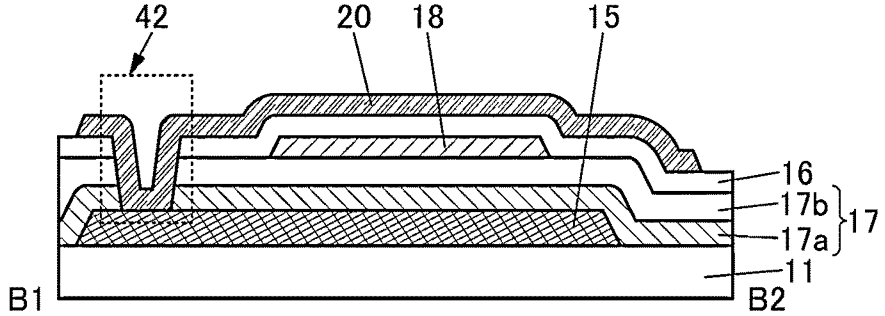

The transistor 10 illustrated in FIG. 5A and FIG. 5B is different from the transistor 10 illustrated in FIG. 1A to FIG. 1C in that the insulating layer 17 is a stacked-layer film including an insulating layer 17*a* and an insulating layer 17*b* over the insulating layer 17*a*. Note that FIG. 5A and FIG. 5B correspond to FIG. 1B and FIG. 1C, respectively.

For example, a nitride film can be used as the insulating layer 17*a* positioned on the substrate 11 side, and an oxide film can be used as the insulating layer 17*b* in contact with the semiconductor layer 18.

The insulating layer 17*a* preferably has high withstand voltage. The high withstand voltage of the insulating layer 17 results in a transistor with high reliability.

The stress of the insulating layer 17*a* is preferably small. The small stress of the insulating layer 17 can inhibit occurrence of problems during the process caused by stress such as warpage of the substrate.

The insulating layer 17*a* preferably functions as a barrier film that inhibits diffusion of impurities such as water, hydrogen, and sodium into the transistor 10 from the substrate 11 side. In addition, the insulating layer 17 preferably functions as a barrier film that inhibits diffusion of a component of the conductive layer 15 into the transistor 10. The insulating layer 17 has a function of inhibiting diffusion of impurities and the like; thus, the transistor can have favorable electrical characteristics and high reliability.

Moreover, the amount of impurities such as water and hydrogen released from the insulating layer 17*a* itself is preferably small. With the insulating layer 17*a* from which a small amount of impurities is released, diffusion of impurities to the transistor 10 side is inhibited, and the transistor can have favorable electrical characteristics and high reliability.

Furthermore, the insulating layer 17*a* preferably functions as a barrier film that inhibits diffusion of oxygen. The insulating layer 17*a* having a function of inhibiting diffusion of oxygen inhibits diffusion of oxygen into the conductive layer 15 from above the insulating layer 17*a* and thus can inhibit oxidation of the conductive layer 15. Consequently, the transistor can have favorable electrical characteristics and high reliability.

As the insulating layer 17*a*, for example, an oxide film of aluminum oxide, aluminum oxynitride, hafnium oxide, hafnium oxynitride, gallium oxide, gallium oxynitride, yttrium oxide, yttrium oxynitride, or the like or a nitride film of silicon nitride, silicon nitride oxide, aluminum nitride, aluminum nitride oxide, or the like can be used. It is particularly suitable to use silicon nitride for the insulating layer 17*a*.

The insulating layer 17*b* includes a region in contact with the channel formation region of the semiconductor layer 18. The insulating layer 17*b* preferably has a low defect density. Moreover, the amount of impurities including hydrogen, such as water and hydrogen, released from the insulating layer 17*b* itself is preferably small. An oxide film of silicon oxide, silicon oxynitride, or the like can be suitably used as the insulating layer 17*b*.

Furthermore, treatment of adding oxygen to the insulating layer 17*b* is preferably performed to form a region containing oxygen. As the treatment of adding oxygen, heat treatment or plasma treatment in an oxygen-containing atmosphere, ion doping treatment, or the like can be performed.

The insulating layer 17 having the stacked-layer structure as illustrated in FIG. 5A and FIG. 5B allows the transistor to have favorable electrical characteristics and high reliability.

A nitride film may be formed as the insulating layer 17*a*, and then oxygen may be added to an upper portion of the insulating layer 17*a* to form an oxygen-containing region; the oxygen-containing region may be regarded as the insulating layer 17*b*. Examples of treatment for adding oxygen include heat treatment or plasma treatment in an oxygen-containing atmosphere, and ion doping treatment.

Note that in this specification and the like, oxynitride refers to a substance that contains more oxygen than nitrogen in its composition, and oxynitride is included in oxide. Nitride oxide refers to a substance that contains more nitrogen than oxygen in its composition, and nitride oxide is included in nitride. For example, in the case where silicon oxynitride is described, it refers to a substance that contains more oxygen than nitrogen in its composition. In the case where silicon nitride oxide is described, it refers to a substance that contains more nitrogen than oxygen in its composition.

Although the insulating layer 17 has a two-layer structure of the insulating layer 17*a* and the insulating layer 17*b* in FIG. 5A, one embodiment of the present invention is not limited thereto. The insulating layer 17 may have a single-layer structure or a stacked-layer structure of three or more layers. Each of the insulating layer 17*a* and the insulating layer 17*b* may have a stacked-layer structure of two or more layers.

Figure 5C:
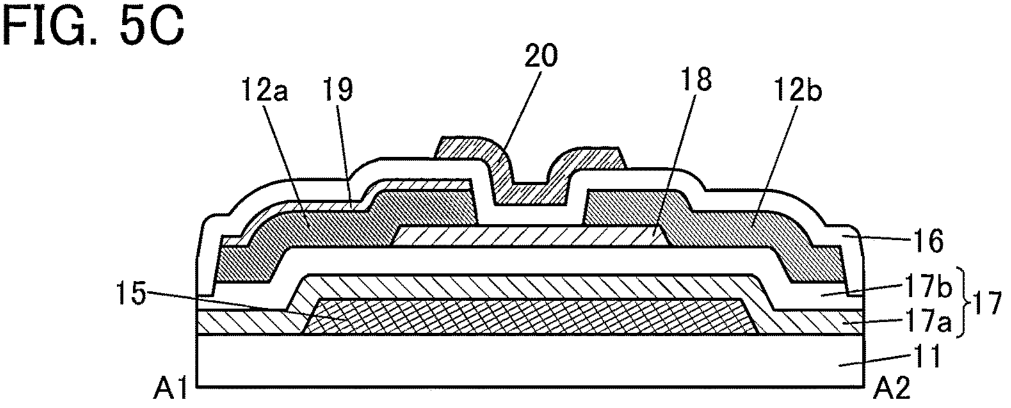

As illustrated in FIG. 5C, the insulating layer 17*a* has a smaller thickness in a region that does not overlap with the semiconductor layer 18, the conductive layer 12*a*, and the conductive layer 12*b* than in the other regions in some cases.

The insulating layer 17*a* preferably functions as an etching stopper at the time of forming the conductive layer 12*a* and the conductive layer 12*b*. With the insulating layer 17*a* functioning as an etching stopper, steps in the end portions of the conductive layer 12*a* and the conductive layer 12*b* become small and the step coverage with the layers (e.g., the insulating layer 16) formed over the conductive layer 12*a* and the conductive layer 12*b* is improved, which can inhibit generation of defects such as disconnection and voids in the layers.

Figure 5D:
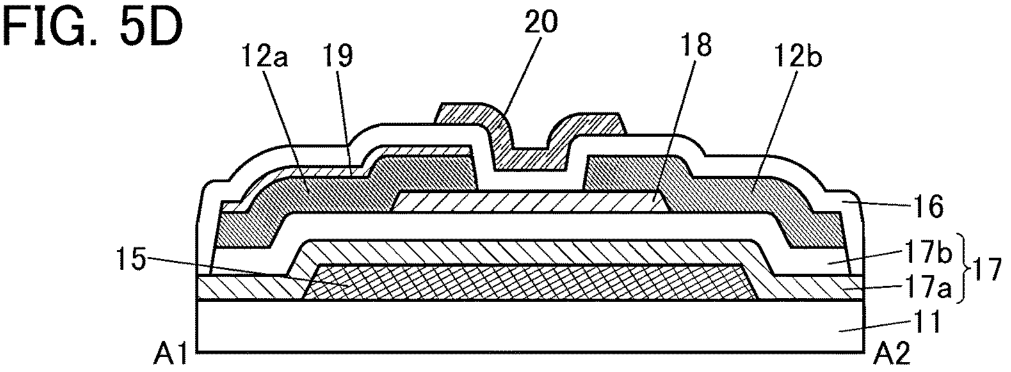

At this time, as illustrated in FIG. 5D, the insulating layer 17*a* includes a region in contact with the insulating layer 17*b* in a region overlapping with the semiconductor layer 18, the conductive layer 12*a*, or the conductive layer 12*b*. In addition, the insulating layer 17*a* includes a region in contact with the insulating layer 16 in a region overlapping with neither the semiconductor layer 18, the conductive layer 12*a*, nor the conductive layer 12*b*.

Modification Example 4

Figure 6A:
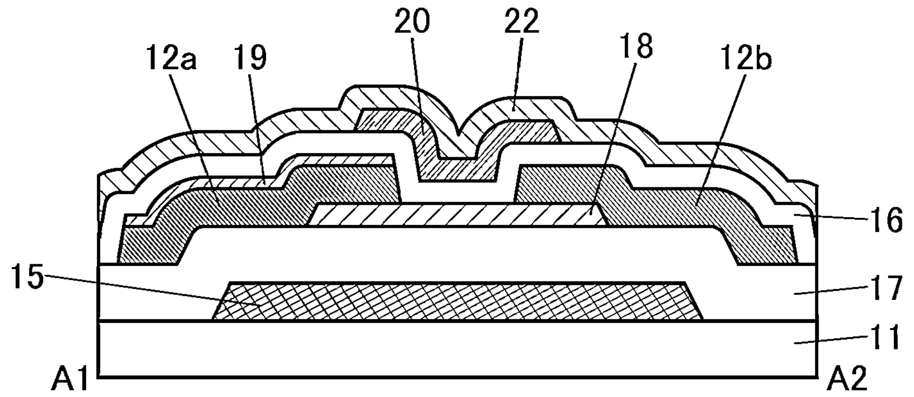
FIG. 6A to FIG. 6C are cross-sectional views illustrating structure examples of a transistor.
Figure 6B:
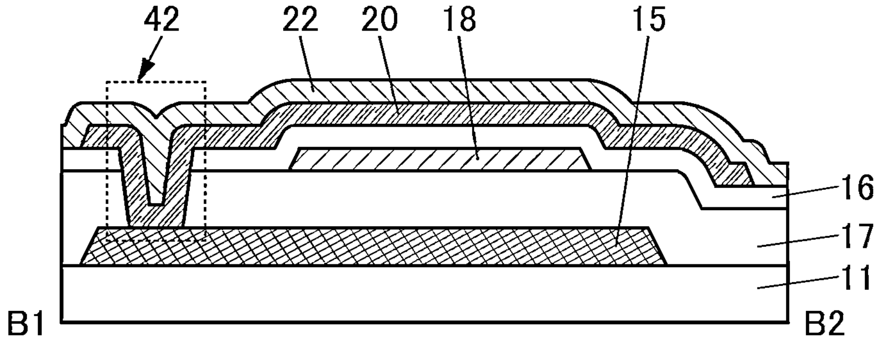

The transistor 10 illustrated in FIG. 6A and FIG. 6B is different from the transistor 10 illustrated in FIG. 1A to FIG. 1C in that the insulating layer 22 is provided to cover the conductive layer 20 and the insulating layer 16. Note that FIG. 6A and FIG. 6B correspond to FIG. 1B and FIG. 1C, respectively.

The insulating layer 22 functions as a protective layer protecting the transistor 10. For the insulating layer 22, an inorganic insulating material such as silicon nitride, silicon nitride oxide, silicon oxide, silicon oxynitride, aluminum oxide, or aluminum nitride can be used. In particular, a material less likely to diffuse oxygen, such as silicon nitride or aluminum oxide, is preferably used for the insulating layer 22, in which case release of oxygen from the semiconductor layer 18 or the insulating layer 16 to the outside through the insulating layer 22 due to heat applied during the fabrication process or the like can be prevented.

For the insulating layer 22, an organic insulating material functioning as a planarization film may be used. Alternatively, a stacked-layer film that includes a film containing an inorganic insulating material and a film containing an organic insulating material may be used for the insulating layer 22.

Modification Example 5

Figure 6C:
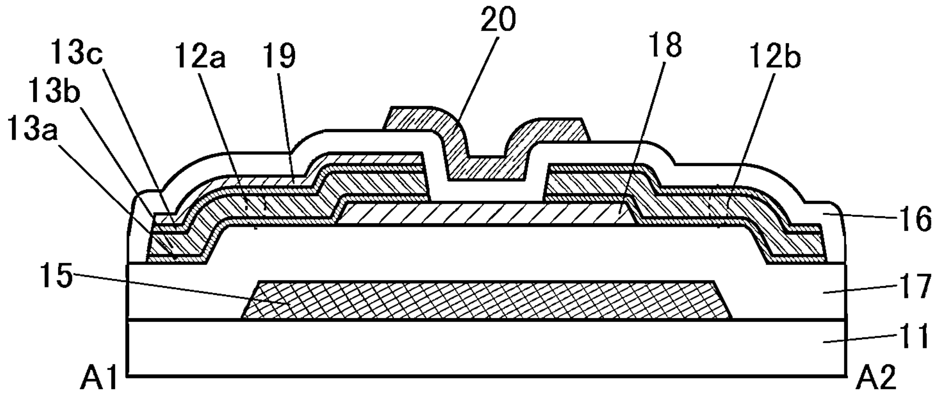

The transistor 10 illustrated in FIG. 6C is different from the transistor 10 illustrated in FIG. 1A to FIG. 1C in that each of the conductive layer 12*a* and the conductive layer 12*b* has a stacked-layer structure in which a conductive layer 13*a*, a conductive layer 13*b*, and a conductive layer 13*c* are stacked in this order from the formation surface side. Note that FIG. 6C corresponds to FIG. 1B.

A low-resistance conductive material is preferably used for the conductive layer 13*b*. The conductive layer 13*b* is preferably formed using a low-resistance conductive material containing copper, silver, gold, aluminum, or the like. It is particularly preferable that the conductive layer 13*b* contain copper or aluminum. For the conductive layer 13*b*, a conductive material having lower resistance than the conductive layer 13*a* and the conductive layer 13*c* is preferably used. In that case, the conductive layer 12*a* and the conductive layer 12*b* can have extremely low resistance.

In each of the conductive layer 12*a* and the conductive layer 12*b*, the topmost conductive layer 13*c* preferably contains a material that is less likely to be bonded to oxygen than a conductive film containing copper, aluminum, or the like, or a material that is less likely to be deprived of its conductivity even when being oxidized. In addition, a material into which oxygen in the semiconductor layer 18 is less likely to diffuse is preferably used for the conductive layer 13*a* that is in contact with the semiconductor layer 18. For the topmost conductive layer 13*c* and the conductive layer 13*a* that is in contact with the semiconductor layer, a conductive material containing titanium, tungsten, molybdenum, chromium, tantalum, zinc, indium, platinum, ruthenium, or the like can be used, for example. The conductive layer 13*a* and the conductive layer 13*c* can be formed using the same conductive material. For example, titanium is used for the conductive layer 13*a* and the conductive layer 13*c* and aluminum is used for the conductive layer 13*b*. Alternatively, the conductive layer 13*a* and the conductive layer 13*c* may be formed using different conductive materials.

When the conductive layer 13*b* containing copper, aluminum, or the like is sandwiched between the conductive layer 13*a* and the conductive layer 13*c* as described above, it is possible to inhibit oxidation of a surface of the conductive layer 13*b* and diffusion of an element contained in the conductive layer 13*b* into neighboring layers. Specifically, provision of the conductive layer 13*a* between the semiconductor layer 18 and the conductive layer 13*b* can prevent diffusion of a metal element contained in the conductive layer 13*a* into the semiconductor layer 18, thereby enabling the transistor 10 to have high reliability.

Note that the structure of each of the conductive layer 12*a* and the conductive layer 12*b* is not limited to the three-layer structure, and may be a two-layer structure or a four-layer structure. For example, the conductive layer 12*a* and the conductive layer 12*b* may each have a two-layer structure in which the conductive layer 13*a* and the conductive layer 13*b* are stacked or a two-layer structure in which the conductive layer 13*b* and the conductive layer 13*c* are stacked.

Although FIG. 6(C) illustrates an example in which the end portions of the conductive layer 13*a*, the conductive layer 13*b*, and the conductive layer 13*c* are aligned with one another or substantially aligned with one another, one embodiment of the present invention is not limited thereto. It is not necessary that any of the end portions of the conductive layer 13*a*, the conductive layer 13*b*, and the conductive layer 13*c* is aligned with the others or substantially aligned with the others.

<Components of Semiconductor Device>

Components included in the semiconductor device of this embodiment will be described below in detail.

[Substrate]

Although there is no particular limitation on a material and the like of the substrate 11, it is necessary that the substrate have heat resistance high enough to withstand at least heat treatment performed later. For example, a single crystal semiconductor substrate or a polycrystalline semiconductor substrate using silicon or silicon carbide as a material, a compound semiconductor substrate of silicon germanium or the like, an SOI substrate, a glass substrate, a ceramic substrate, a quartz substrate, a sapphire substrate, or the like may be used as the substrate 11. Alternatively, any of these substrates over which a semiconductor element is provided may be used as the substrate 11.

A flexible substrate may be used as the substrate 11, and the transistor 10 and the like may be formed directly on the flexible substrate. Alternatively, a separation layer may be provided between the substrate 11 and the transistor 10 and the like. The separation layer can be used when part or the whole of a semiconductor device completed thereover is separated from the substrate 11 and transferred onto another substrate. In that case, the transistor 10 and the like can be transferred onto a substrate having low heat resistance or a flexible substrate as well.

[Insulating Layer 17]

The insulating layer 17 can be formed of a single layer or a stacked layer of an oxide insulating film or a nitride insulating film, for example. To improve the properties of the interface with the semiconductor layer 18, at least a region in the insulating layer 17 that is in contact with the semiconductor layer 18 is preferably formed of an oxide insulating film. Moreover, a film from which oxygen is released by heating is preferably used as the insulating layer 17.

For example, a single layer or a stacked layer using silicon oxide, silicon oxynitride, silicon nitride oxide, silicon nitride, aluminum oxide, hafnium oxide, gallium oxide, a Ga—Zn oxide, or the like can be provided as the insulating layer 17.

In the case where a film other than an oxide film, such as a silicon nitride film, is used for the side of the insulating layer 17 that is in contact with the semiconductor layer 18, pretreatment such as oxygen plasma treatment is preferably performed on a surface in contact with the semiconductor layer 18 to oxidize the surface or the vicinity of the surface.

[Conductive Film]

The conductive films included in the semiconductor device, such as the conductive layer 15 and the conductive layer 20 that function as the gate electrode, the conductive layer 12*a* that functions as the source electrode, and the conductive layer 12*b* that functions as the drain electrode, can each be formed using a metal element selected from chromium, copper, aluminum, gold, silver, zinc, molybdenum, tantalum, titanium, tungsten, manganese, nickel, iron, and cobalt; an alloy containing the metal element as its component; an alloy including a combination of the metal elements; or the like.

For the conductive layer 12*a* that functions as the source electrode and the conductive layer 12*b* that functions as the drain electrode, in particular, a low-resistance conductive material containing copper, silver, gold, aluminum, or the like may be used.

For the conductive films that constitute the semiconductor device, an oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive films that constitute the semiconductor device may each have a stacked-layer structure of a conductive film containing the above-described oxide conductor (metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

A Cu—X alloy film (Xis Mn, Ni, Cr, Fe, Co, Mo, Ta, or Ti) may be used for the conductive layer 15, the conductive layer 20, the conductive layer 12*a*, and the conductive layer 12*b*. The use of a Cu—X alloy film enables the manufacturing cost to be reduced because wet etching process can be used in the processing.

[Insulating Layer 16]

As the insulating layer 16 provided over the semiconductor layer 18, insulating layers containing one or more kinds of a silicon oxide film, a silicon oxynitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like formed by a PECVD method, a sputtering method, an ALD method, or the like can be used. It is particularly preferable to use a silicon oxide film or a silicon oxynitride film formed by a plasma CVD method. Note that the insulating layer 16 may have a stacked-layer structure of two or more layers.

[Insulating Layer 22]

As the insulating layer 22 functioning as a protective layer, an insulating layer containing one or more kinds of a silicon nitride oxide film, a silicon nitride film, an aluminum nitride film, an aluminum nitride oxide film, and the like formed by a PECVD method, a sputtering method, an ALD method, or the like can be used. Note that the insulating layer 22 may have a stacked-layer structure of two or more layers.

[Semiconductor Layer 18]

In the case where the semiconductor layer 18 is an In-M-Zn oxide, a sputtering target used for forming the In-M-Zn oxide preferably has the atomic proportion of In higher than or equal to the atomic proportion of the element M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, and In:M:Zn=5:2:5.

In particular, an In—Ga—Zn oxide (IGZO) can be suitably used for the semiconductor layer 18. In the case where the semiconductor layer 18 is an In—Ga—Zn oxide, a sputtering target used for forming the In—Ga—Zn oxide preferably has the atomic proportion of In higher than or equal to the atomic proportion of the element M. Examples of the atomic ratio of the metal elements in such a sputtering target include In:Ga:Zn=1:1:1, In:Ga:Zn=1:1:1.2, In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, and In:Ga:Zn=5:2:5.

A target containing a polycrystalline oxide is preferably used as the sputtering target, which facilitates formation of the semiconductor layer 18 having crystallinity. Note that the atomic ratio in the semiconductor layer 18 to be formed may vary in the range of +40% from any of the above atomic ratios of the metal elements contained in the sputtering target. For example, in the case where the composition (atomic ratio) of a sputtering target used for the semiconductor layer 18 is In:Ga:Zn=4:2:4.1, the composition (atomic ratio) of the formed semiconductor layer 18 is sometimes In:Ga:Zn=4:2:3 or in the neighborhood thereof.

Note that when the atomic ratio is described as In:Ga:Zn=4:2:3 or in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or in the neighborhood thereof, the case is included where Ga is greater than 0.1 and less than or equal to 2 and Zn is greater than 0.1 and less than or equal to 2 with In being 1.

The energy gap of the semiconductor layer 18 is 2 eV or more, preferably 2.5 eV or more. With the use of such a metal oxide having a wider energy gap than silicon, the off-state current of the transistor can be reduced.

The semiconductor layer 18 preferably has a non-single-crystal structure. The non-single-crystal structure includes, for example, a CAAC structure which will be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. Meanwhile, a clear crystal grain boundary cannot be observed in the CAAC-OS; thus, it can be said that a reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

An example of a crystal structure of a metal oxide is described. Note that a metal oxide formed by a sputtering method using an In—Ga—Zn oxide target (In:Ga:Zn=4:2:4.1<atomic ratio>) is described here as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated.

The above is the description of the components.

Fabrication Method Example

A method for fabricating the semiconductor device of one embodiment of the present invention will be described below with reference to FIG. 7A to FIG. 9C. Here, description will be made giving, as an example, the transistor 10 illustrated in FIG. 1A to FIG. 1C.

Note that thin films that form the semiconductor device (insulating films, semiconductor films, conductive films, and the like) can be formed by a sputtering method, a CVD method, a vacuum evaporation method, a pulsed laser deposition (PLD) method, an ALD method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that form the semiconductor device (insulating films, semiconductor films, conductive films, and the like) can be formed by a method such as spin coating, dipping, spray coating, ink-jetting, dispensing, screen printing, offset printing, a doctor knife, a slit coater, a roll coater, a curtain coater, or a knife coater.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. Furthermore, as the light used for the exposure, extreme ultra-violet light (EUV) or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not necessarily used.

For etching of the thin film, a dry etching method, a wet etching method, a sandblasting method, or the like can be used.

FIG. 7 to FIG. 9 are drawings illustrating an example of a method for fabricating the transistor 10. In each drawing, a cross section in the channel length direction is shown on the left side, and a cross section in the channel width direction is shown on the right side.

[Formation of Conductive Layer 15]

A conductive film is formed over the substrate 11, a resist mask is formed by a lithography process over the conductive film, and then the conductive film is etched, whereby the conductive layer 15 functioning as a bottom gate electrode is formed.

[Formation of Insulating Layer 17]

Figure 7A:
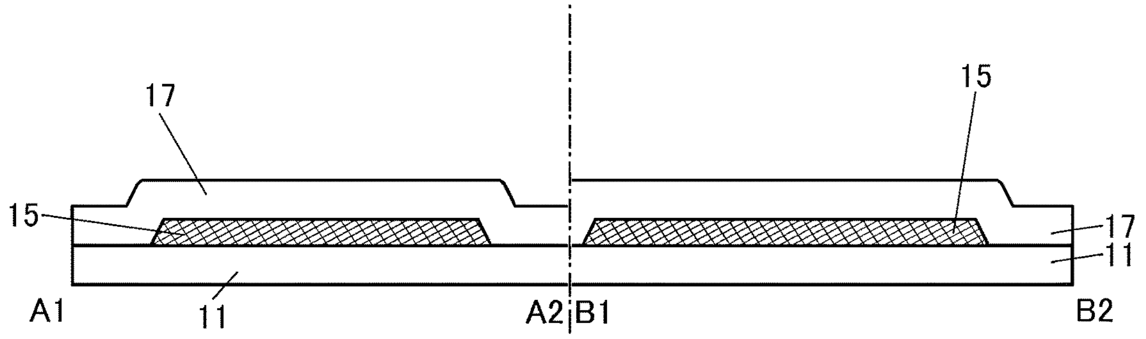
FIG. 7A to FIG. 7D are cross-sectional views illustrating a method of manufacturing a transistor.

Next, an Insulating Layer 17 is Formed to Cover the Conductive Layer 15 and the Substrate 11 (FIG. 7A). The Insulating Layer 17 can be Formed by a PECVD Method or the Like, for Example.

In the case where the insulating layer 17 has a stacked-layer structure of the insulating layer 17*a* and the insulating layer 17*b* as illustrated in FIG. 5A and FIG. 5B, a silicon nitride film may be formed by a PECVD method as the insulating layer 17*a* and a silicon oxynitride film may be formed by a PECVD method as the insulating layer 17*b*.

Heat treatment may be performed after the formation of the insulating layer 17. By the heat treatment, water or hydrogen can be released from the surface and inside of the insulating layer 17.

The heat treatment temperature is preferably higher than or equal to 150° C. and lower than the strain point of the substrate, further preferably higher than or equal to 250° C. and lower than or equal to 450° C., still further preferably higher than or equal to 300° C. and lower than or equal to 450° C. The heat treatment can be performed in an atmosphere containing one or more of a rare gas, nitrogen, and oxygen. As a nitrogen-containing atmosphere or an oxygen-containing atmosphere, clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, or the like into the insulating layer 17 can be prevented as much as possible. An oven, a rapid thermal annealing (RTA) apparatus, or the like can be used for the heat treatment. The use of the RTA apparatus can shorten the heat treatment time.

[Supply of Oxygen]

Figure 7B:
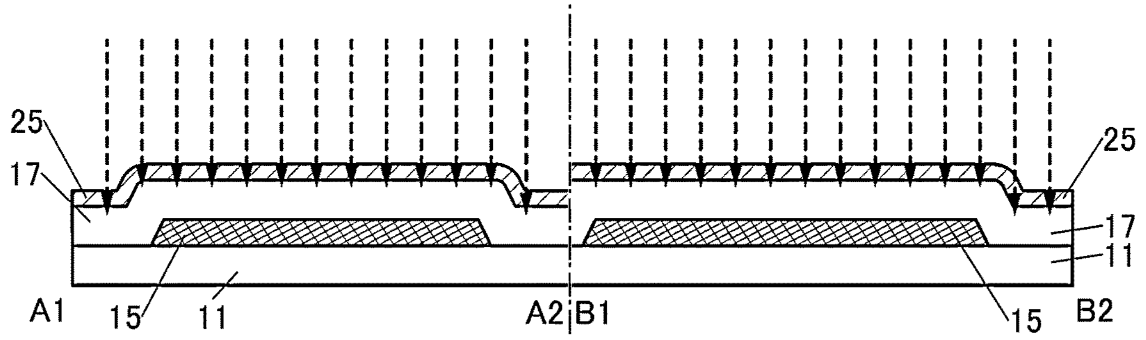

Next, treatment of supplying oxygen to the insulating layer 17 is preferably performed (FIG. 7(B)). As the oxygen supply treatment, an oxygen radical, an oxygen atom, an oxygen atomic ion, an oxygen molecular ion, or the like (indicated by dotted lines in FIG. 7B) is supplied to the insulating layer 17 by an ion doping method, an ion implantation method, plasma treatment, or the like. The plasma treatment is preferably performed in an oxygen-containing atmosphere, for example.

After a mask layer 25 is formed over the insulating layer 17, oxygen may be added to the insulating layer 17 through the film, as illustrated in FIG. 7B. It is preferable to remove the mask layer 25 after the addition of oxygen. The mask layer 25 has a function of inhibiting release of oxygen. By addition of oxygen through the mask layer 25, oxygen in the insulating layer 17 can be prevented from diffusing outward during the addition of oxygen, whereby a sufficient amount of oxygen can be supplied to the insulating layer 17. As the mask layer 25, a conductive film or a semiconductor film containing one or more of indium, zinc, gallium, tin, aluminum, chromium, tantalum, titanium, molybdenum, nickel, iron, cobalt, and tungsten can be used. For example, indium gallium zinc oxide can be used for the mask layer 25. In this case, the mask layer 25 may be formed by a method similar to that of the semiconductor layer 18 to be described later.

A sufficient amount of oxygen is supplied to the insulating layer 17 as described above, so that the off-state current of the transistor 10 can be sufficiently reduced even when the channel length is a submicron size.

[Formation of Semiconductor Layer 18]

Figure 7C:
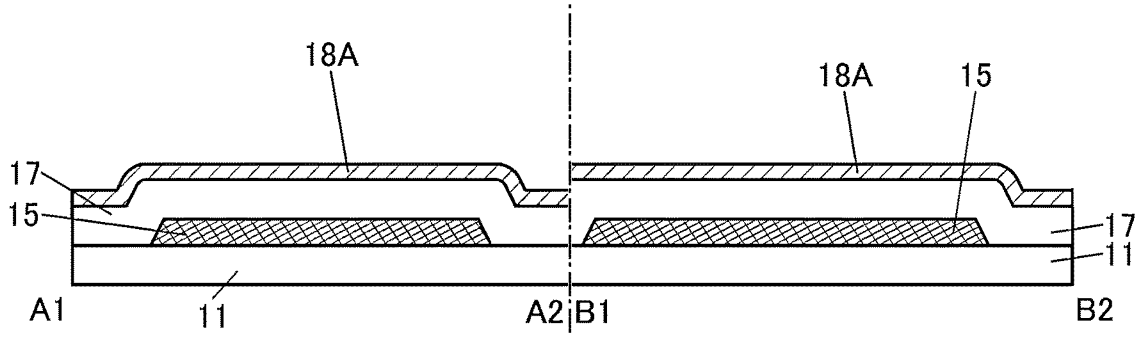

Next, a metal oxide film 18A is formed over the insulating layer 17 (FIG. 7C). The metal oxide film 18A is preferably formed by a sputtering method using a metal oxide target.

The metal oxide film 18A is preferably a dense film with as few defects as possible. The metal oxide film 18A is preferably a highly purified film in which impurities such as hydrogen and water are reduced as much as possible. It is particularly preferable to use a metal oxide film having crystallinity as the metal oxide film 18A.

In forming the metal oxide film 18A, in addition to an oxygen gas, an inert gas (e.g., a helium gas, an argon gas, or a xenon gas) may be mixed. Note that the proportion of the oxygen gas in the whole film formation gas (hereinafter, also referred to as an oxygen flow rate ratio) in forming the metal oxide film can be in the range of 0% to 100% inclusive.

When a metal oxide film with relatively high crystallinity is formed with a high oxygen flow rate ratio, a metal oxide film having high etching resistance and electrical stability can be obtained. By contrast, when a metal oxide film with relatively low crystallinity is formed with a low oxygen flow rate ratio, a metal oxide film having high conductivity can be obtained.

The metal oxide film 18A is formed under the conditions where a substrate temperature is higher than or equal to room temperature and lower than or equal to 200° C., preferably higher than or equal to room temperature and lower than or equal to 140° C., for example. The substrate temperature during formation of the metal oxide film is preferably, for example, higher than or equal to room temperature and lower than 140° C. because the productivity is increased.

The metal oxide film 18A may have a stacked-layer structure. For example, a metal oxide film with relatively low crystallinity which is formed with a low oxygen flow rate ratio may be used as a lower layer and a metal oxide film with relatively high crystallinity which is formed with a high oxygen flow rate ratio may be used as an upper layer. Note that the upper layer and the lower layer of the metal oxide film 18A may have different compositions.

Figure 7D:
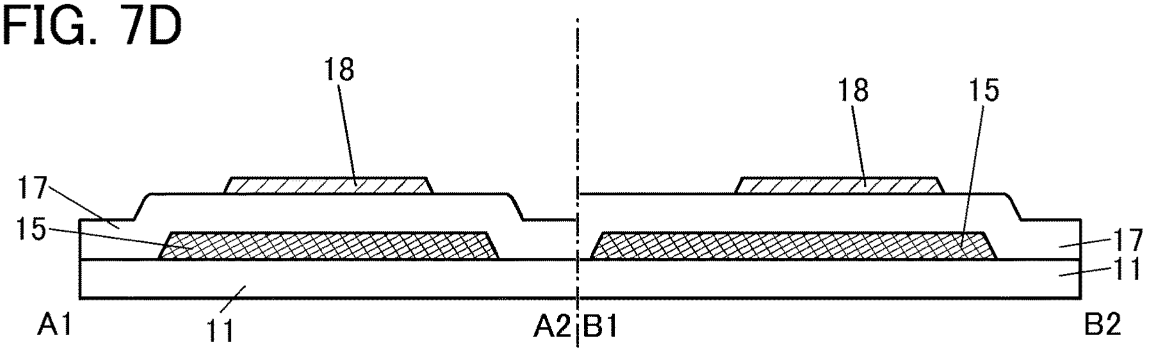

Next, a resist mask is formed over the metal oxide film 18A, the metal oxide film 18A is processed by etching, and then the resist mask is removed, so that the island-shaped semiconductor layer 18 can be formed (FIG. 7D).

For processing of the metal oxide film 18A, one or both of a wet etching method and a dry etching method can be used.

At the time of forming the semiconductor layer 18, the thickness of the insulating layer 17 in a region not overlapping with the semiconductor layer 18 is sometimes smaller than the thickness of the insulating layer 17 in a region overlapping with the semiconductor layer 18.

Heat treatment may be performed after the metal oxide film 18A is formed or processed into the semiconductor layer 18. By the heat treatment, hydrogen or water can be removed from the surface and inside of the metal oxide film 18A or the semiconductor layer 18. In addition, by the heat treatment, the etching rate of the metal oxide film 18A or the semiconductor layer 18 is lowered, which can inhibit the semiconductor layer 18 from being lost in a later step (e.g., the formation of the conductive layer 12*a* and the conductive layer 12*b*).

The heat treatment temperature is preferably higher than or equal to 150° C. and lower than the strain point of the substrate, further preferably higher than or equal to 250° C. and lower than or equal to 450° C., still further preferably higher than or equal to 300° C. and lower than or equal to 450° C. The heat treatment can be performed in an atmosphere containing one or more of a rare gas and nitrogen. Alternatively, heating may be performed in the atmosphere, and then heating may further be performed in an oxygen-containing atmosphere. As a nitrogen-containing atmosphere or an oxygen-containing atmosphere, ultra clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, or the like into the semiconductor layer 18 can be prevented as much as possible. An oven, a rapid thermal annealing (RTA) apparatus, or the like can be used for the heat treatment. The use of the RTA apparatus can shorten the heat treatment time.

[Formation of Conductive Film 12A and Mask Film 19A]

Figure 8A:
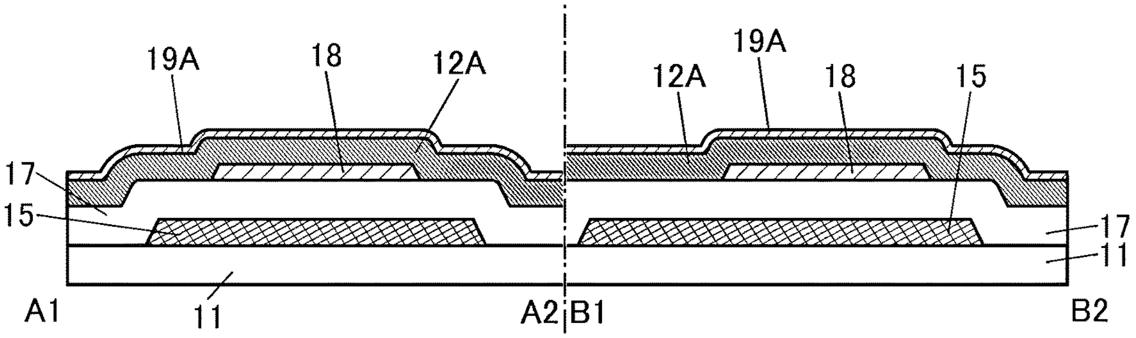
FIG. 8A to FIG. 8D are cross-sectional views illustrating a method of manufacturing a transistor.

Next, a conductive film 12A and a mask film 19A are stacked to cover the insulating layer 17 and the semiconductor layer 18 (FIG. 8A). The conductive film 12A and the mask film 19A can be formed by a sputtering method, an evaporation method, a plating method, or the like. Note that in this specification and the like, the mask film may be referred to as a sacrificial film.

The conductive film 12A is a film to be the conductive layer 12*a* and the conductive layer 12*b* in a later step, and may contain the above conductive material. For example, tungsten deposited by a sputtering method may be used for the conductive film 12A.

The mask film 19A is a film to be the mask layer 19 in a later step, and may contain the above inorganic material. For example, indium gallium zinc oxide deposited by a sputtering method may be used for the mask film 19A.

[Formation of Mask Layer 19]

Figure 8B:
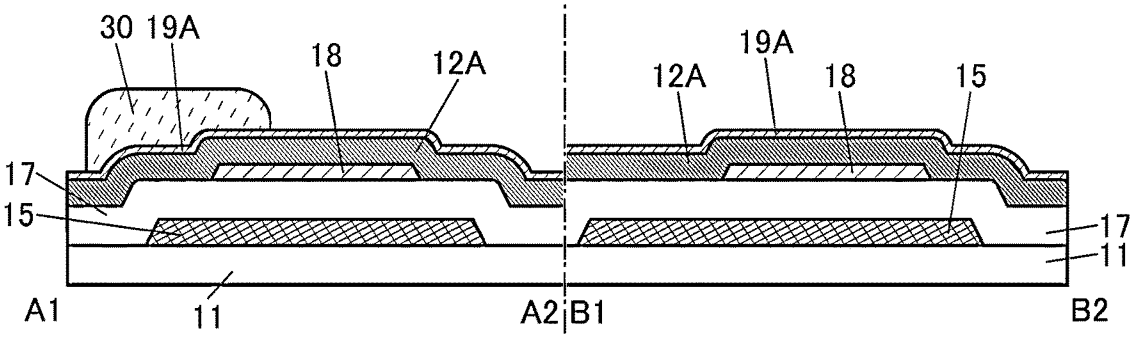

Next, a resist mask 30 is formed in a region where the conductive layer 12*a* is to be formed over the mask film 19A (FIG. 8B). For the resist mask 30, an organic material containing a photosensitive resin such as a positive resist material or a negative resist material can be used.

Figure 8C:
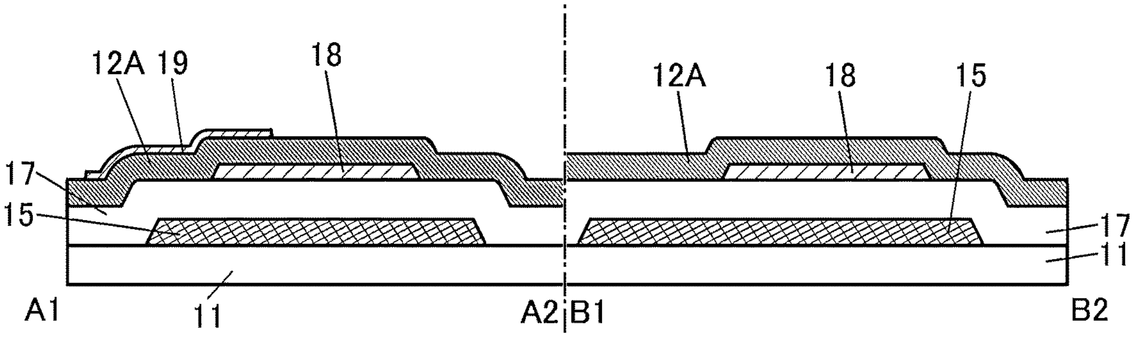

Next, etching treatment is performed with use of the resist mask 30 to process the mask film 19A, whereby the mask layer 19 is formed (FIG. 8C). The mask layer 19 functions as a hard mask at the time of forming the conductive layer 12*a* in a later step. Either a wet etching method or a dry etching method may be used for the etching treatment. Note that this etching treatment is performed under a condition that the etching selectivity with respective to the conductive film 12A is high. For example, in the case where indium gallium zinc oxide is used for the mask film 19A and tungsten is used for the conductive film 12A, wet etching treatment may be performed using an aqueous solution containing a nitric acid, an acetic acid, and a phosphoric acid.

[Formation of Conductive Layer 12*a* and Conductive Layer 12*b*]

Figure 8D:
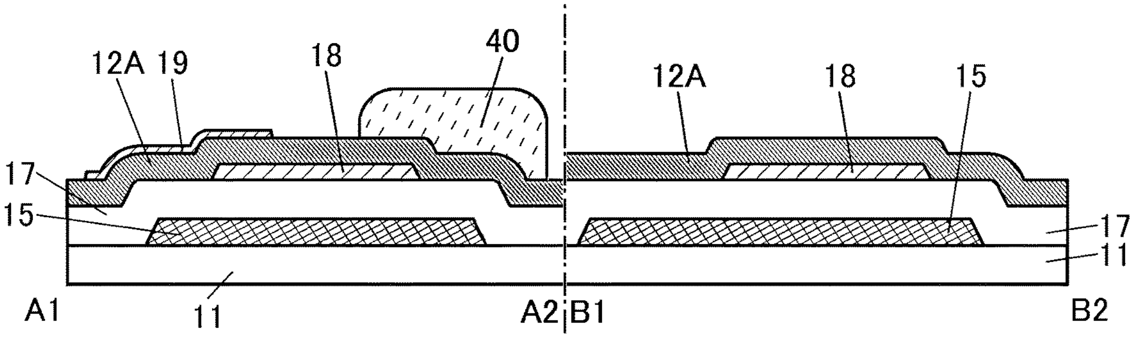

Next, a resist mask 40 is formed in a region where the conductive layer 12*b* is to be formed over the conductive film 12A (FIG. 8D). For the resist mask 40, an organic material containing a photosensitive resin such as a positive resist material or a negative resist material can be used, as well as for the resist mask 30.

Figure 9A:
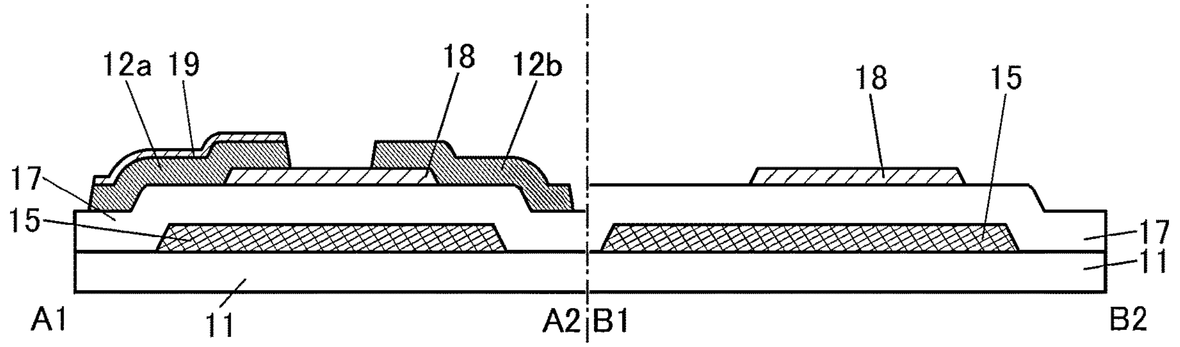
FIG. 9A to FIG. 9C are cross-sectional views illustrating a method of manufacturing a transistor.

Next, etching treatment is performed using the mask layer 19 and the resist mask 40 to process the conductive film 12A, whereby the conductive layer 12*a* and the conductive layer 12*b* are formed (FIG. 9A). Either a wet etching method or a dry etching method may be performed as the etching treatment. Note that this etching treatment is performed under a condition that the etching selectivity with respective to the mask layer 19 is high. For example, in the case where indium gallium zinc oxide is used for the mask layer 19 and tungsten is used for the conductive film 12A, dry etching treatment may be performed using a $SF_6$ gas as an etching gas.

The conductive layer 12*a* and the conductive layer 12*b* are preferably processed to be apart from each other over a channel formation region of the semiconductor layer 18, as illustrated in FIG. 9A. In other words, the conductive layer 12*a* and the conductive layer 12*b* are preferably processed such that the end portions of them, which are opposite to each other, overlap with both the conductive layer 15 and the semiconductor layer 18.

As described above, in this embodiment, the conductive layer 12*a* and the conductive layer 12*b* are formed by patterning with use of different masks. By the double patterning, the distance between opposite end portions of the conductive layer 12*a* and the conductive layer 12*b* can be reduced not to the light exposure limit of photolithography but to the limit of the alignment accuracy of the mask layer 19 and the resist mask 40. Accordingly, the distance between the opposite end portions of the conductive layer 12*a* and the conductive layer 12*b* (channel length L) can be less than or equal to 3 μm, preferably less than or equal to 2 μm, further preferably less than or equal to 1 μm, still further preferably less than or equal to 0.7 μm, yet still further preferably less than or equal to 0.5 μm. Such a structure can increase the on-state current (in other words, improve on-state characteristics) of the transistor 10.

At the time of forming the conductive layer 12*a* and the conductive layer 12*b*, the thickness of the semiconductor layer 18 in a region overlapping with neither the conductive layer 12*a* nor the conductive layer 12*b* is sometimes smaller than the thickness of the semiconductor layer 18 in a region overlapping with the conductive layer 12*a* and the conductive layer 12*b*.

At the time of forming the conductive layer 12*a* and the conductive layer 12*b*, the thickness of the insulating layer 17 in the region overlapping with neither the conductive layer 12*a* nor the conductive layer 12*b* is sometimes smaller than the thickness of the insulating layer 17 in the region overlapping with the conductive layer 12*a* and the conductive layer 12*b*. Note that the mask layer 19 may be removed after the formation of the conductive layer 12*a* and the conductive layer 12*b*.

[Formation of Insulating Layer 16]

Figure 9B:
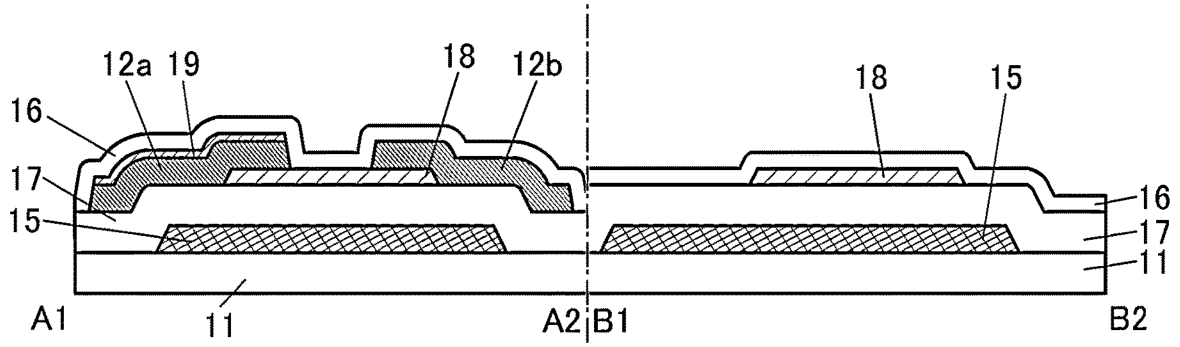

Next, the insulating layer 16 is formed to cover the conductive layer 12*a*, the conductive layer 12*b*, the mask layer 19, the semiconductor layer 18, and the insulating layer 17 (FIG. 9B).

The insulating layer 16 is preferably formed in, for example, an oxygen-containing atmosphere. It is particularly preferable that the insulating layer 16 be formed by a plasma CVD method in an oxygen-containing atmosphere. Thus, the insulating layer 16 with few defects can be formed.

As the insulating layer 16, for example, an oxide film such as a silicon oxide film or a silicon oxynitride film is preferably formed with a plasma-enhanced chemical vapor deposition apparatus (a PECVD apparatus or simply referred to as a plasma CVD apparatus). In that case, a mixed gas including a deposition gas containing silicon and an oxidizing gas is preferably used as a source gas. As the deposition gas containing silicon, the above-described gas can be used. As the oxidizing gas, the above-described gas can be used.

For example, in the case where silicon oxynitride is used for the insulating layer 16, for example, a mixed gas containing monosilane and dinitrogen monoxide may be used for the formation.

It is preferable to perform plasma treatment on the surface of the semiconductor layer 18 before formation of the insulating layer 16. By the plasma treatment, an impurity adsorbed onto the surface of the semiconductor layer 18, such as water, can be reduced. Therefore, impurities at the interface between the semiconductor layer 18 and the insulating layer 16 can be reduced, achieving a highly reliable transistor. For example, the plasma treatment can be performed in an atmosphere containing any one of oxygen, ozone, nitrogen, dinitrogen monoxide, argon, or in an atmosphere containing two or more of them. The plasma treatment and the formation of the insulating layer 16 are preferably performed successively without exposure to the air.

Here, heat treatment may be performed after the formation of the insulating layer 16. By the heat treatment, hydrogen or water contained in the insulating layer 16 or adsorbed on its surface can be removed. Furthermore, the number of defects in the insulating layer 16 can be reduced. For the conditions of the heat treatment, the above description can be referred to.

Note that the heat treatment is not necessarily performed when not needed. The heat treatment is not performed in this step, and heat treatment performed in a later step may also serve as the heat treatment in this step. In some cases, treatment at a high temperature in a later step (e.g., a film formation step) or the like can serve as the heat treatment in this step.

[Formation of Conductive Layer 20]

Then, parts of the insulating layer 17 and the insulating layer 16 are etched to form the opening 42 reaching the conductive layer 15.

Figure 9C:
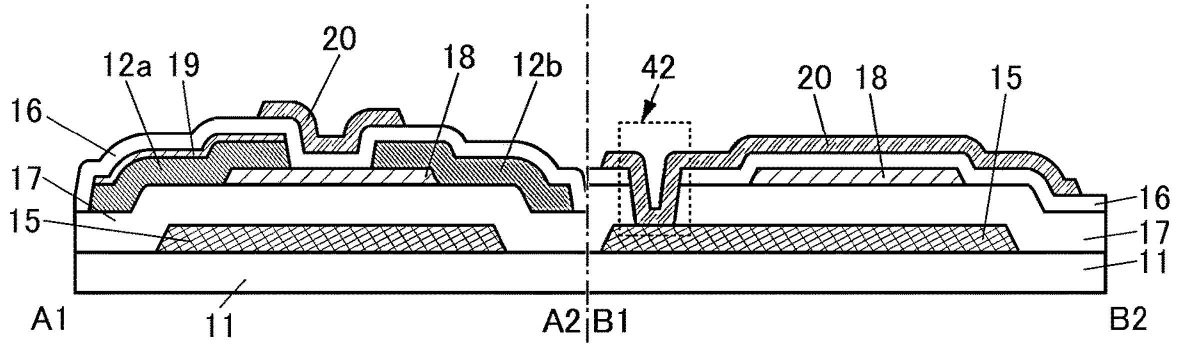

Then, after a conductive film is formed to cover the opening 42, the conductive film is processed, whereby the conductive layer 20 can be formed (FIG. 9C). The above-described conductive material can be used for the conductive layer 20.

Through the above process, the transistor 10 can be fabricated.

At least part of this embodiment can be implemented in combination with any of the other embodiments described in this specification as appropriate.

Embodiment 2

In this embodiment, a structure example of a light-emitting apparatus or a display apparatus for which the semiconductor device of one embodiment of the present invention can be used will be described.

One embodiment of the present invention is a display apparatus including a light-emitting element (also referred to as a light-emitting device). For example, three kinds of light-emitting elements emitting red (R), green (G), and blue (B) light are included, whereby a full-color display apparatus can be achieved. The display apparatus of one embodiment of the present invention may include a light-receiving element (also referred to as a light-receiving device).

In one embodiment of the present invention, patterning of EL layers is performed by a photolithography method without a shadow mask such as a metal mask. With the patterning, a high-resolution display apparatus with a high aperture ratio, which had been difficult to achieve, can be fabricated. Moreover, EL layers can be formed separately, which enables extremely clear images; thus, a display apparatus with a high contrast and high display quality can be fabricated.

Although it is difficult to set the distance between pixels to be less than 10 μm by a formation method using a metal mask, for example, the above method can shorten the distance to be less than or equal to 8 μm, less than or equal to 3 μm, less than or equal to 2 μm, or less than or equal to 1 μm. Here, the distance between pixels can be determined by the distance between opposite end portions of adjacent pixel electrodes. Alternatively, the distance between pixels can be determined by the distance between opposite end portions of adjacent EL layers.

By shortening the distance between pixels in the above manner, the area of a non-light-emitting region that may exist between two light-emitting elements can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

Furthermore, a pattern of the EL layer itself (also referred to as a processing size) can be made much smaller than that in the case of using a metal mask. For example, in the case of using a metal mask for forming EL layers separately, a variation in the thickness occurs between the center and the edge of the EL layer. This causes a reduction in an effective area that can be used as a light-emitting region with respect to the area of the EL layer. In contrast, in the above manufacturing method, an EL layer is formed by processing a film deposited to have a uniform thickness, which enables a uniform thickness in the EL layer. Thus, even in a fine pattern, almost the whole area can be used as a light-emitting region. Therefore, the above manufacturing method makes it possible to obtain a high resolution display apparatus with a high aperture ratio.

In many cases, an organic film formed using a fine metal mask (FMM) has an extremely small taper angle (e.g., a taper angle of greater than 0° and less than 30°) so that the thickness of the film becomes smaller in a portion closer to an end portion. Therefore, it is difficult to clearly observe a side surface of an organic film formed using an FMM because the side surface and a top surface are continuously connected. In contrast, an EL layer included in one embodiment of the present invention is processed without using an FMM, and has a clear side surface. In particular, part of the taper angle of the EL layer included in one embodiment of the present invention is preferably greater than or equal to 30° and less than or equal to 120°, further preferably greater than or equal to 60° and less than or equal to 120°.

Note that in this specification and the like, an end portion of an object having a tapered shape indicates that the end portion of the object has a cross-sectional shape in which the angle between a side surface (a surface) of the object and a bottom surface (a surface on which the object is formed) is greater than 0° and less than 90° in a region of the end portion, and the thickness continuously increases from the end portion. A taper angle refers to an angle between a bottom surface (a surface on which an object is formed) and a side surface (a surface) at an end portion of the object.

As in the above embodiment, the transistor of one embodiment of the present invention can include a region in which the channel length is less than or equal to 3 μm, preferably less than or equal to 2 μm, further preferably less than or equal to 1 μm, still further preferably less than or equal to 0.7 μm, yet still further preferably less than or equal to 0.5 μm. Thus, the transistor of one embodiment of the present invention has high on-state characteristics. Moreover, the channel width can be reduced in a state where the on-state current of the transistor is relatively high. With the use of such a transistor, a reduction in size of a pixel circuit can be achieved.

Accordingly, even when the display apparatus has high resolution and the pixel area is reduced, the pixel circuit can be disposed in the reduced pixel area with use of the transistor described in the above embodiment. Moreover, in the pixel, the transistor described in the above embodiment can be used as a driving transistor which requires a large amount of current.

A more specific example is described below.

Figure 10A:
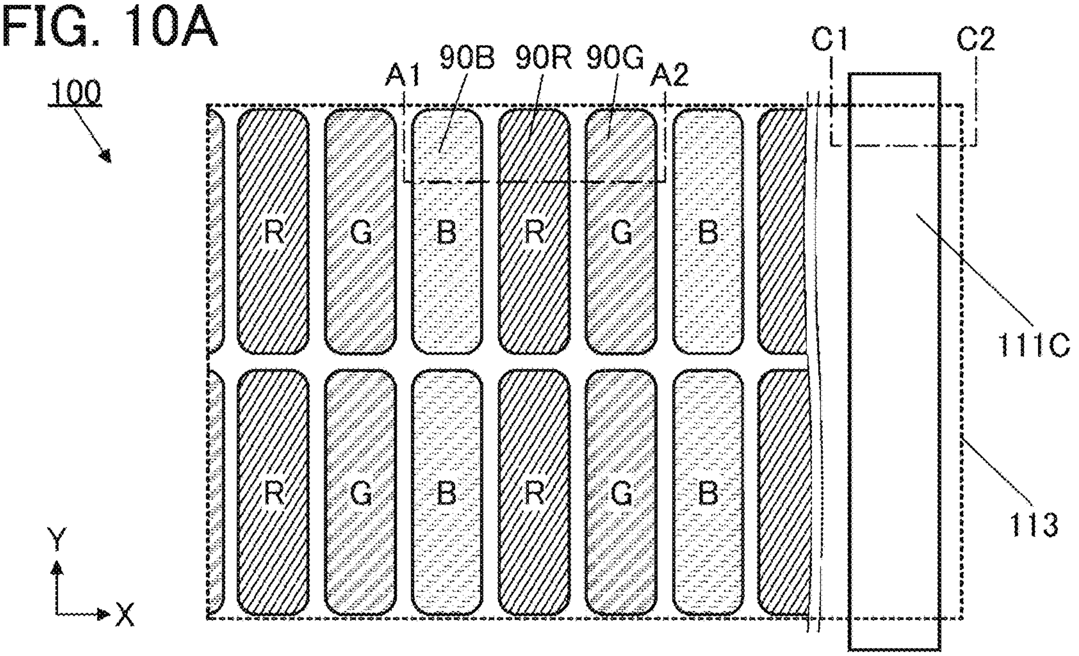
FIG. 10A and FIG. 10B are diagrams illustrating a structure example of a display apparatus.

FIG. 10A is a schematic top view of a display apparatus 100. The display apparatus 100 includes a plurality of light-emitting elements 90R emitting red light, a plurality of light-emitting elements 90G emitting green light, and a plurality of light-emitting elements 90B emitting blue light over a substrate 101 provided with a semiconductor circuit. In FIG. 10A, light-emitting regions of the light-emitting elements are denoted by R, G, and B to easily differentiate the light-emitting elements. Note that the substrate 101 is a substrate over which the transistor described in the above embodiment is formed and the description of the above embodiment can be referred to for the details.

The light-emitting elements 90R, the light-emitting elements 90G, and the light-emitting elements 90B are arranged in a stripe pattern. In FIG. 10A, two elements are alternately arranged in one direction. Note that the arrangement method of the light-emitting elements is not limited thereto; another method such as an S stripe, delta, Bayer, zigzag, PenTile, or diamond arrangement may also be used.

FIG. 10A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 90R and the like are arranged. In FIG. 10A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, the top surface of the connection electrode 111C can have a band shape, an L shape, a square bracket shape, a quadrangular shape, or the like.

Figure 10B:
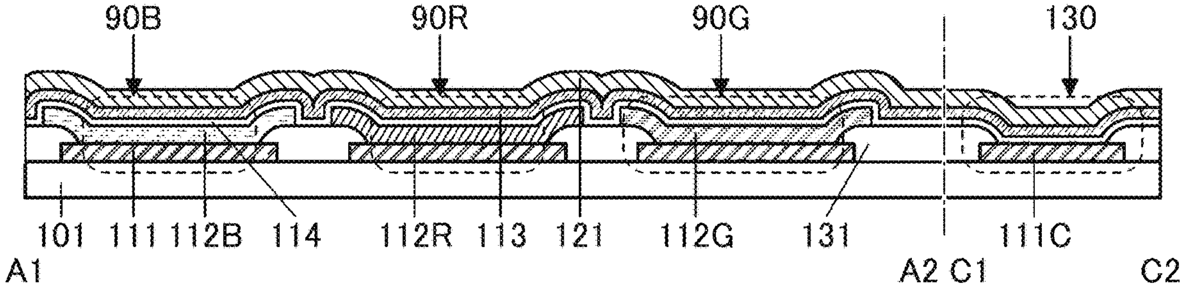

FIG. 10B is a schematic cross-sectional view taken along dashed-dotted lines A1-A2 and C1-C2 in FIG. 10A. FIG. 10B is a schematic cross-sectional view of the light-emitting element 90B, the light-emitting element 90R, the light-emitting element 90G, and the connection electrode 111C.

The light-emitting element 90B includes a pixel electrode 111, an organic layer 112B, an organic layer 114, and the common electrode 113. The light-emitting element 90R includes the pixel electrode 111, an organic layer 112R, the organic layer 114, and the common electrode 113. The light-emitting element 90G includes the pixel electrode 111, an organic layer 112G, the organic layer 114, and the common electrode 113. The organic layer 114 and the common electrode 113 are shared by the light-emitting element 90B, the light-emitting element 90R, and the light-emitting element 90G. The organic layer 114 can also be referred to as a common layer. The pixel electrodes 111 are provided apart from each other between the light-emitting elements and between the light-emitting element and the light-receiving element.

The organic layer 112R contains at least a light-emitting organic compound that emits light with intensity in the red wavelength range. The organic layer 112G contains at least a light-emitting organic compound that emits light with intensity in the green wavelength range. The organic layer 112B contains at least a light-emitting organic compound that emits light with intensity in the blue wavelength range. Each of the organic layer 112R, the organic layer 112G, and the organic layer 112B can also be referred to as an EL layer.

The organic layer 112R, the organic layer 112B, and the organic layer 112G may each include one or more of an electron-injection layer, an electron-transport layer, a hole-injection layer, and a hole-transport layer. The organic layer 114 does not necessarily include the light-emitting layer. For example, the organic layer 114 includes one or more of an electron-injection layer, an electron-transport layer, a hole-injection layer, and a hole-transport layer.

Here, the uppermost layer in the stacked-layer structure of the organic layer 112R, the organic layer 112B, and the organic layer 112G, i.e., the layer in contact with the organic layer 114 is preferably a layer other than the light-emitting layer. For example, a structure is preferable in which an electron-injection layer, an electron-transport layer, a hole-injection layer, a hole-transport layer, or a layer other than those covers the light-emitting layer so as to be in contact with the organic layer 114. When a top surface of the light-emitting layer is protected by another layer in manufacturing each light-emitting element, the reliability of the light-emitting element can be improved.

By processing the EL layers by a photolithography method, the distance between pixels can be shortened to less than or equal to 8 μm, less than or equal to 3 μm, less than or equal to 2 μm, or less than or equal to 1 μm. Here, the distance between pixels can be determined by the distance between opposite end portions of the organic layer 112B and the organic layer 112R, the distance between opposite end portions of the organic layer 112B and the organic layer 112G, and the distance between opposite end portions of the organic layer 112R and the organic layer 112G, for example. Alternatively, the distance between pixels can be determined by the distance between opposite end portions of adjacent EL layers for the same color. Alternatively, the distance between pixels can be determined by the distance between opposite end portions of the adjacent pixel electrodes 111. The distance between pixels is shortened in this manner, whereby a display apparatus with high resolution and a high aperture ratio can be provided.

The pixel electrode 111 is provided for each element. The common electrode 113 and the organic layer 114 are provided as layers common to the light-emitting elements. A conductive film that transmits visible light is used for either the respective pixel electrodes or the common electrode 113, and a reflective conductive film is used for the other. When the respective pixel electrodes are light-transmitting electrodes and the common electrode 113 is a reflective electrode, a bottom-emission display apparatus is obtained. When the respective pixel electrodes are reflective electrodes and the common electrode 113 is a light-transmitting electrode, a top-emission display apparatus is obtained. Note that when both the respective pixel electrodes and the common electrode 113 transmit light, a dual-emission display apparatus can be obtained.

The pixel electrode 111 is electrically connected to a transistor provided in a semiconductor circuit of the substrate 101. The transistor provided on the substrate 101 has a reduced channel length and is miniaturized as described in the above embodiment. For this reason, even when the display apparatus has high resolution and the pixel area is reduced, the pixel circuit can be disposed in the reduced pixel area.

The insulating layer 131 is provided to cover end portions of the pixel electrode 111. The end portions of the insulating layer 131 are preferably tapered. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, and the thickness continuously increases from the end portion.

When an organic resin is used for the insulating layer 131, a surface of the insulating layer 131 can be moderately curved. Thus, coverage with a film formed over the insulating layer 131 can be improved.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

Alternatively, the insulating layer 131 may be formed using an inorganic insulating material. Examples of inorganic insulating materials that can be used for the insulating layer 131 include oxides and nitride films such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

As illustrated in FIG. 10B, there are gaps between the organic layers of two light-emitting elements that emit light of different colors and between the organic layers of the light-emitting element and the light-receiving element, and the organic layers are provided apart from each other. The organic layer 112R, the organic layer 112B, and the organic layer 112G are thus preferably provided so as not to be in contact with each other. This favorably prevents unintentional light emission from being caused by current flowing through adjacent two organic layers. As a result, the contrast can be increased to achieve a display apparatus with high display quality.

The organic layers 112R, 112B, and 112G each preferably have a taper angle of greater than or equal to 30°. In an end portion of each of the organic layer 112R, an organic layer 112G, and the organic layer 112B, the angle between a side surface (a surface) of the layer and a bottom surface of the layer (a surface on which the layer is formed) is preferably greater than or equal to 30° and less than or equal to 120°, further preferably greater than or equal to 45° and less than or equal to 120°, still further preferably greater than or equal to 60° and less than or equal to 120°. Alternatively, the organic layers 112R, 112G, and 112B each preferably have a taper angle of 90° or a neighborhood thereof (greater than or equal to 80° and less than or equal to 100°, for example).

A protective layer 121 is provided over the common electrode 113. The protective layer 121 has a function of preventing diffusion of impurities such as water into each light-emitting element from the above.

The protective layer 121 can have, for example, a single-layer structure or a stacked-layer structure including at least an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, the top surface of the organic insulating film can be flat, and accordingly, coverage with the inorganic insulating film over the organic insulating film is improved, leading to an improvement in barrier properties. Moreover, since the top surface of the protective layer 121 is flat, a preferable effect can be obtained; when a component (e.g., a color filter, an electrode of a touch sensor, or a lens array) is provided above the protective layer 121, the component is less affected by an uneven shape caused by the lower structure.

In the connection portion 130, the common electrode 113 is provided on and in contact with the connection electrode 111C and the protective layer 121 is provided to cover the common electrode 113. In addition, the insulating layer 131 is provided to cover end portions of the connection electrode 111C.

A structure example of a display apparatus that is partly different from that in FIG. 10B is described below. Specifically, an example in which the insulating layer 131 is not provided is described.

Figure 11A:
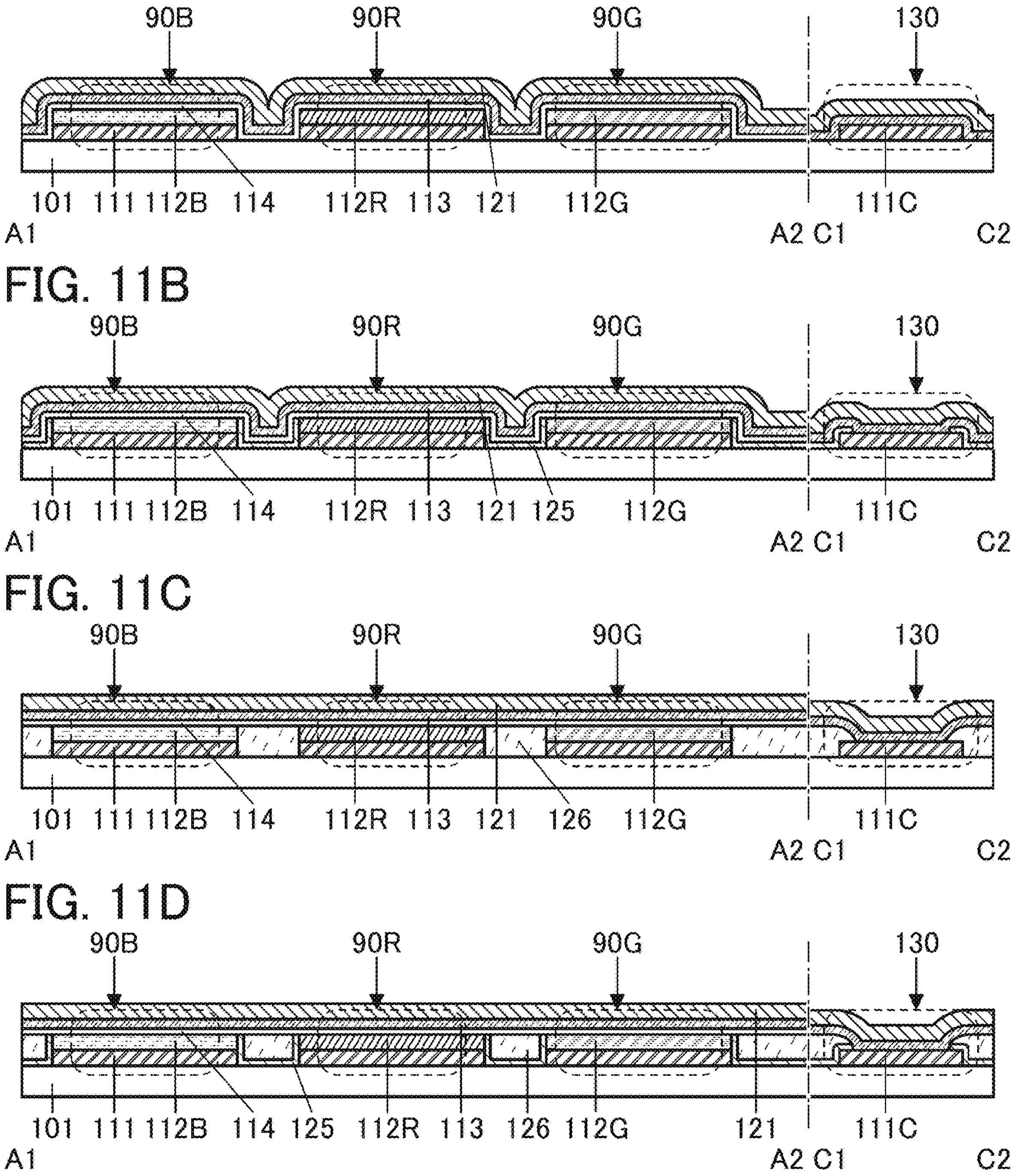

FIGS. 11A to 11C show examples of the case where a side surface of the pixel electrode 111 is substantially aligned with side surfaces of the organic layer 112R, the organic layer 112B, or the organic layer 112G.

In FIG. 11A, the organic layer 114 is provided to cover top surfaces and side surfaces of the organic layer 112R, the organic layer 112B, and the organic layer 112G. The organic layer 114 can prevent the pixel electrode 111 and the common electrode 113 from being in contact with each other and being electrically short-circuited.

FIG. 11B shows an example in which an insulating layer 125 is provided to be in contact with the side surfaces of the organic layer 112R, the organic layer 112B, the organic layer 112G, and the pixel electrode 111. The insulating layer 125 can prevent the pixel electrode 111 and the common electrode 113 from being electrically short-circuited and effectively inhibit leakage current therebetween.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an ALD method is used as the insulating layer 125, the insulating layer 125 has a small number of pin holes and excels in a function of protecting the organic layer.

The insulating layer 125 can be formed by a sputtering method, a CVD method, a PLD method, an ALD method, or the like. The insulating layer 125 is preferably formed by an ALD method achieving good coverage.

In FIG. 11C, resin layers 126 are provided between two adjacent light-emitting elements and between the light-emitting element and the light-receiving element so as to fill the space between two facing pixel electrodes and two facing organic layers. The resin layer 126 can planarize the surface on which the organic layer 114, the common electrode 113, and the like are formed, which prevents disconnection of the common electrode 113 due to poor coverage in a step between adjacent light-emitting elements.

As the resin layer 126, an insulating layer containing an organic material can be favorably used. For example, the resin layer 126 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The resin layer 126 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the resin layer 126 can be formed using a photosensitive resin. A photoresist may be used as the photosensitive resin. The photosensitive resin can be of positive or negative type.

A colored material (e.g., a material containing a black pigment) may be used for the resin layer 126 so that the resin layer 126 has a function of blocking stray light from an adjacent pixel and inhibiting color mixture.

In FIG. 11D, the insulating layer 125 and the resin layer 126 over the insulating layer 125 are provided. Since the insulating layer 125 prevents the organic layer 112R or the like from being in contact with the resin layer 126, impurities such as moisture included in the resin layer 126 can be prevented from being diffused into the organic layer 112R or the like, whereby a highly reliable display apparatus can be provided.

A reflective film (e.g., a metal film containing one or more of silver, palladium, copper, titanium, aluminum, and the like) may be provided between the insulating layer 125 and the resin layer 126 so that light emitted from the light-emitting layer is reflected by the reflective film; hence, the display apparatus may be provided with a function of increasing the light extraction efficiency.

Figure 12A:
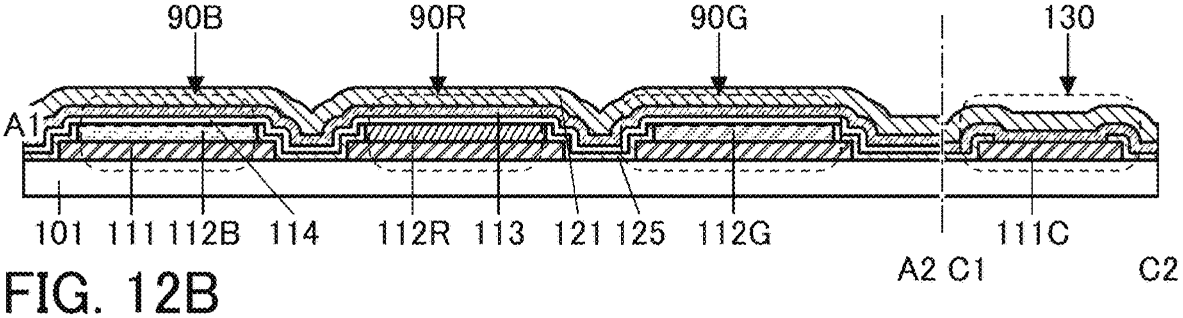
FIG. 12A to FIG. 12C are diagrams illustrating structure examples of a display apparatus.
Figure 12B:
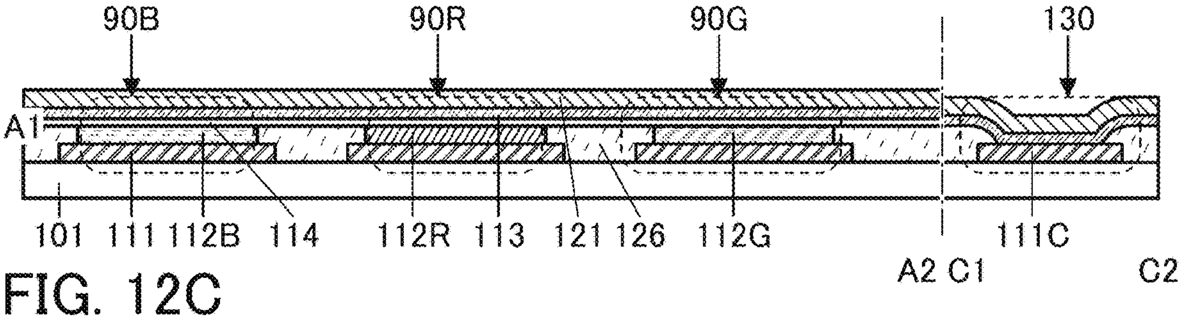
Figure 12C:
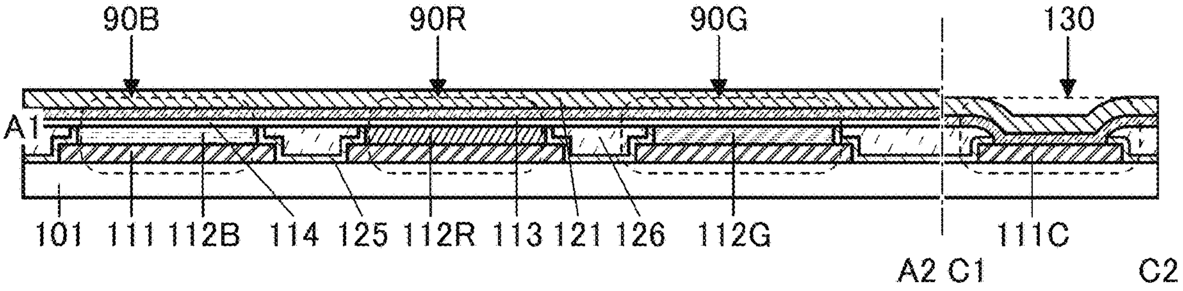

FIGS. 12A to 12C show examples in which the width of the pixel electrode 111 is larger than the width of the organic layer 112R, the organic layer 112B, or the organic layer 112G. The organic layer 112R or the like is provided on the inner side than end portions of the pixel electrode 111.

FIG. 12A shows an example in which the insulating layer 125 is provided. The insulating layer 125 is provided to cover the side surfaces of the organic layers included in the light-emitting element and the light-receiving element and part of a top surface and the side surfaces of the pixel electrode 111.

FIG. 12B shows an example in which the resin layer 126 is provided. The resin layer 126 is positioned between two adjacent light-emitting elements or between the light-emitting element and the light-receiving element, and covers the side surfaces of the organic layers and the top and side surfaces of the pixel electrode 111.

FIG. 12C shows an example in which both the insulating layer 125 and the resin layer 126 are provided. The insulating layer 125 is provided between the organic layer 112R or the like and the resin layer 126.

FIG. 13A to FIG. 13D show examples in which the width of the pixel electrode 111 is smaller than the width of the organic layer 112R, the organic layer 112B, or the organic layer 112G. The organic layer 112R or the like extends to an outer side beyond the end portions of the pixel electrode 111.

Figure 13A:
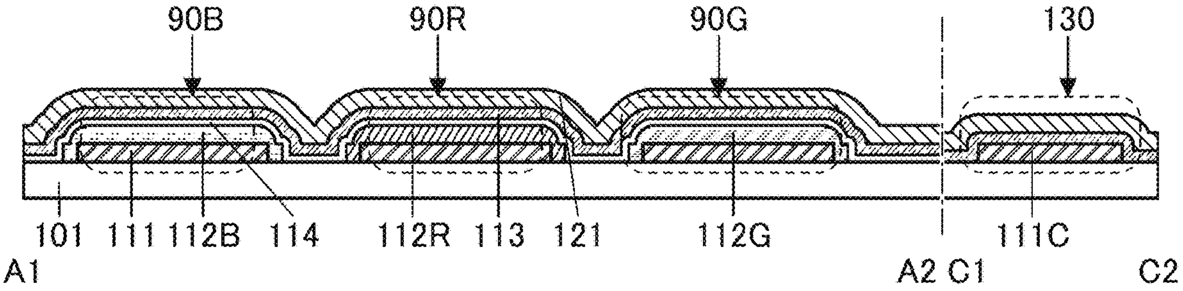
FIG. 13A to FIG. 13D are diagrams illustrating structure examples of a display apparatus.
Figure 13B:
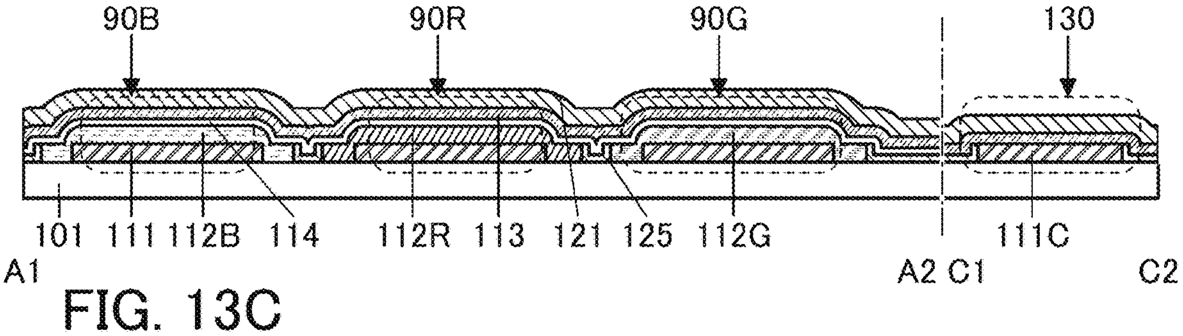

FIG. 13B shows an example in which the insulating layer 125 is provided. The insulating layer 125 is provided in contact with the side surfaces of the organic layers of two adjacent light-emitting elements. The insulating layer 125 may be provided to cover not only the side surface but also part of a top surface of the organic layer 112R or the like.

Figure 13C:
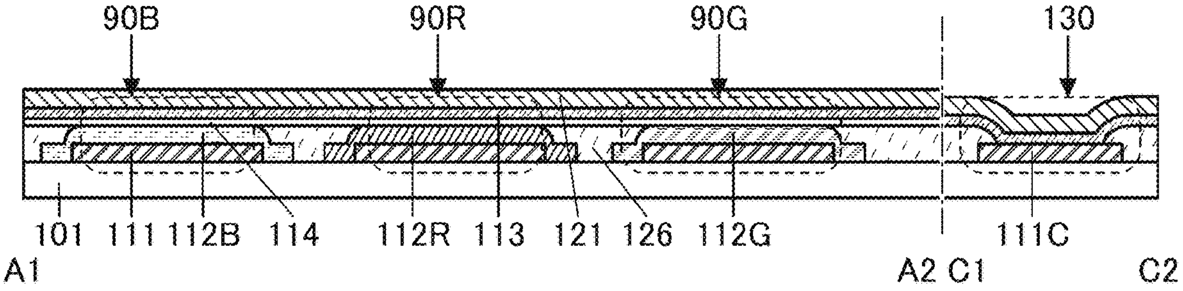

FIG. 13C shows an example in which the resin layer 126 is provided. The resin layer 126 is positioned between two adjacent light-emitting elements and covers the side surface and part of the top surface of the organic layer 112R or the like. The resin layer 126 may be formed to be in contact with the side surface of the organic layer 112R or the like and not to cover the top surface thereof.

Figure 13D:
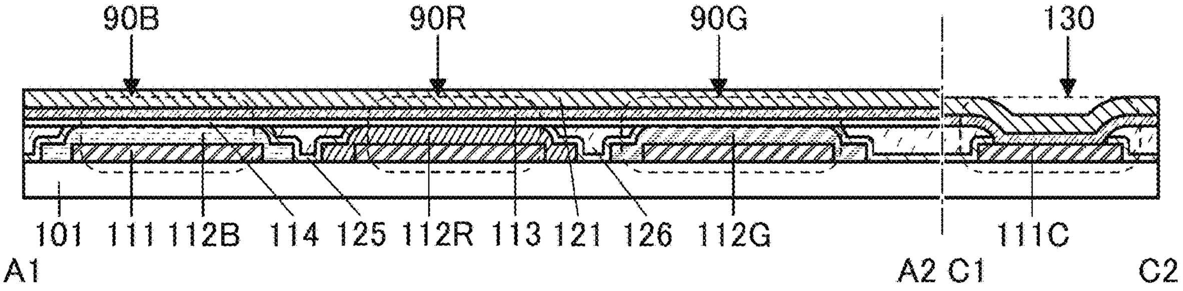

FIG. 13D shows an example in which both the insulating layer 125 and the resin layer 126 are provided. The insulating layer 125 is provided between the organic layer 112R or the like and the resin layer 126.

Here, a structure example of the resin layer 126 is described.

A top surface of the resin layer 126 is preferably as flat as possible; however, the surface of the resin layer 126 may be depressed or projecting depending on an uneven shape of a surface on which the resin layer 126 is formed, the formation conditions of the resin layer 126, or the like.

FIG. 14A to FIG. 15F are each an enlarged view of an end portion of the pixel electrode 111R included in the light-emitting element 90R, an end portion of the pixel electrode 111G included in the light-emitting element 90G, and the vicinity thereof.

Figure 14A:
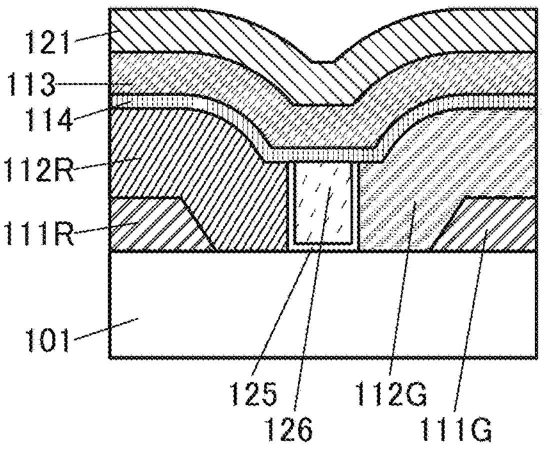
FIG. 14A to FIG. 14F are diagrams illustrating structure examples of a display apparatus.
Figure 14D:
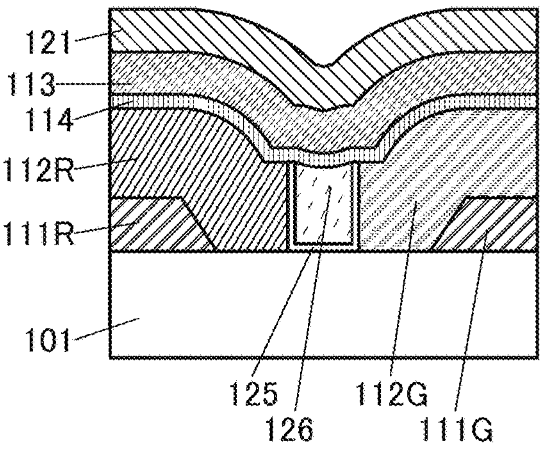
Figure 14B:
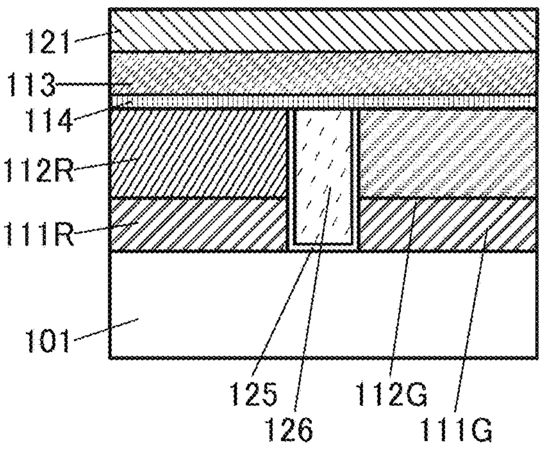
Figure 14E:
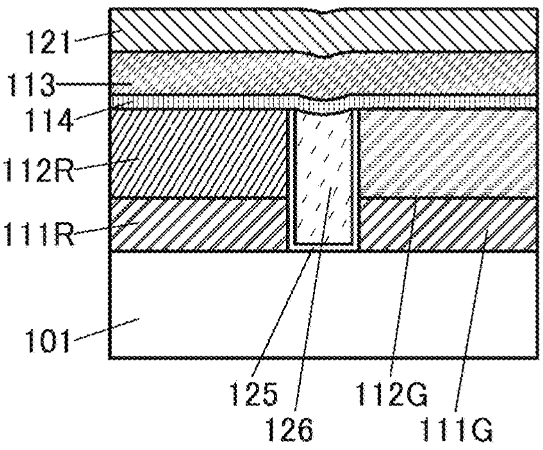
Figure 14C:
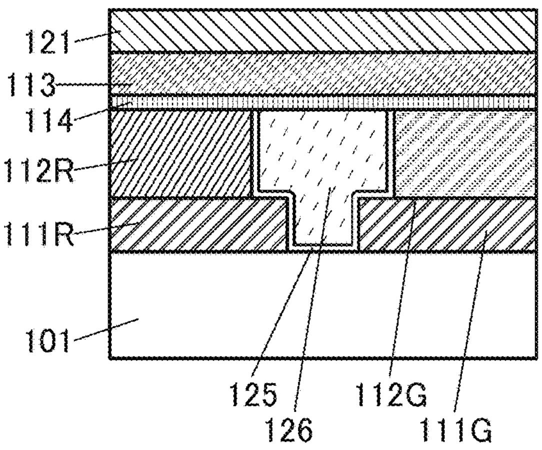

FIG. 14A, FIG. 14B, and FIG. 14C are each an enlarged view of the resin layer 126 having a flat top surface and the vicinity thereof. FIG. 14A shows an example of the case where the organic layer 112R or the like has a larger width than the pixel electrode 111. FIG. 14B shows an example in which these widths are substantially the same. FIG. 14C shows an example of the case where the organic layer 112R or the like has a smaller width than the pixel electrode 111.

The organic layer 112R and the like is provided to cover the end portions of the pixel electrode 111 as illustrated in FIG. 14A, so that the end portion of the pixel electrode 111 is preferably tapered. Accordingly, the step coverage with the organic layer 112R and the like is improved and a highly reliable display apparatus can be provided.

Figure 14F:
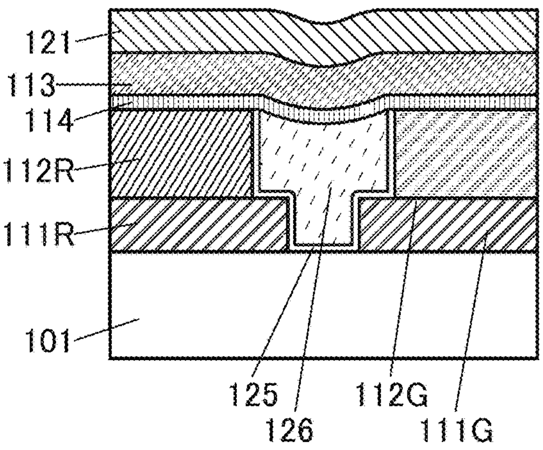

FIG. 14D, FIG. 14E, and FIG. 14F illustrate examples of the case where the top surface of the resin layer 126 has a depressed portion. Here, FIG. 14D corresponds to FIG. 14A, FIG. 14E corresponds to FIG. 14B, and FIG. 14F corresponds to FIG. 14C. In this case, a depressed portion that reflects the depressed top surface of the resin layer 126 is formed on each of top surfaces of the organic layer 114, the common electrode 113, and the protective layer 121.

Figure 15A:
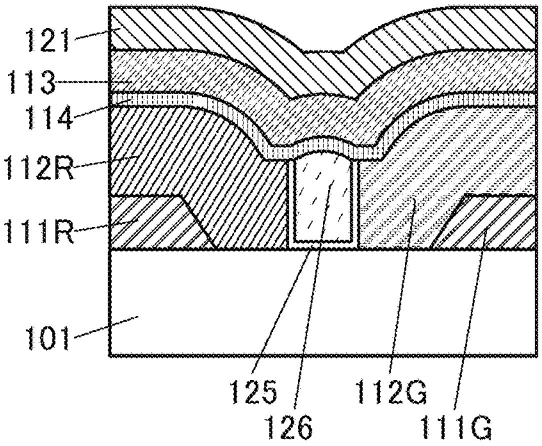
FIG. 15A to FIG. 15F are diagrams illustrating structure examples of a display apparatus.
Figure 15B:
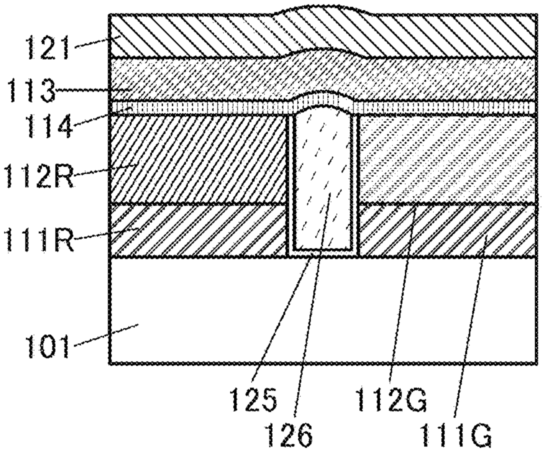
Figure 15C:
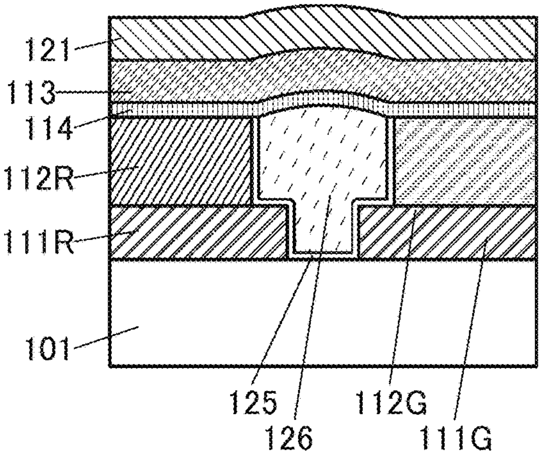

FIG. 15A, FIG. 15B, and FIG. 15C illustrate examples of the case where the top surface of the resin layer 126 has a projecting portion. Here, FIG. 15A corresponds to FIG. 14A, FIG. 15B corresponds to FIG. 14B, and FIG. 15C corresponds to FIG. 14C. In this case, a projecting portion that reflects the projecting top surface of the resin layer 126 is formed on each of top surfaces of the organic layer 114, the common electrode 113, and the protective layer 121.

Figure 15D:
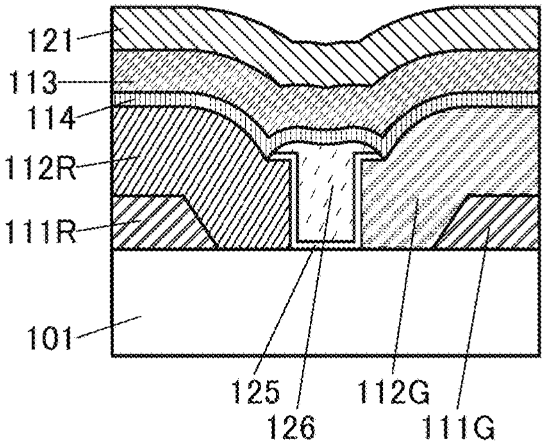
Figure 15E:
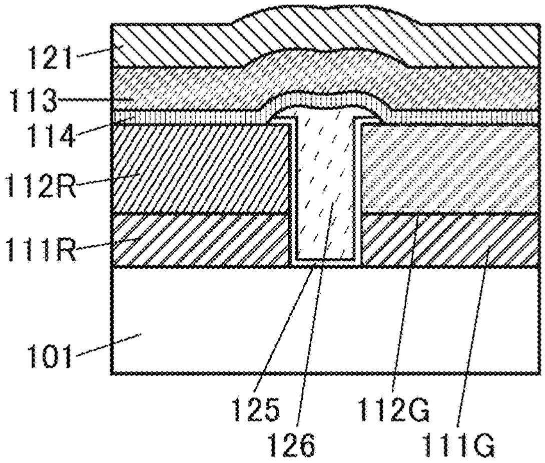
Figure 15F:
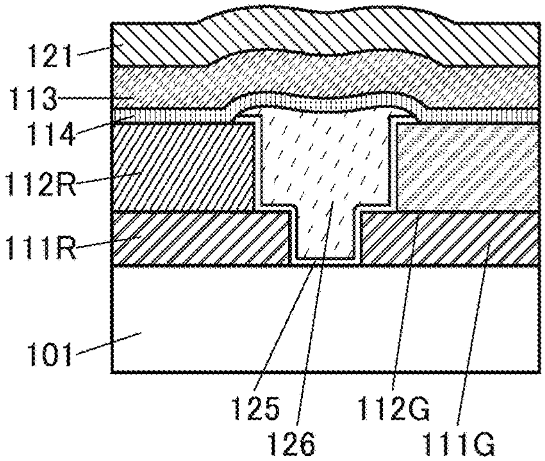

FIG. 15D, FIG. 15E, and FIG. 15F each illustrate an example of the case where part of the resin layer 126 covers an upper end portion and part of a top surface of the organic layer 112R and an upper end portion and part of a top surface of the organic layer 112G. Here, FIG. 15D corresponds to FIG. 14A, FIG. 15E corresponds to FIG. 14B, and FIG. 15F corresponds to FIG. 14C. Here, the insulating layer 125 is provided between the resin layer 126 and the top surfaces of the organic layer 112R and the organic layer 112G.

FIG. 15D, FIG. 15E, and FIG. 15F show examples of the case where the top surface of the resin layer 126 is partly depressed. In this case, unevenness that reflects the shape of the resin layer 126 is formed on each of the organic layer 114, the common electrode 113, and the protective layer 121.

The above is the description of the structure example of the resin layer.

[Pixel Layout]

Next, pixel layouts different from that in FIG. 10A will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

Examples of a top surface shape of the subpixel include polygons such as a triangle, a tetragon (including a rectangle and a square), and a pentagon; polygons with rounded corners; an ellipse; and a circle. Here, the top surface shape of the subpixel corresponds to the top surface shape of a light-emitting region of the light-emitting element.

Figure 16A:
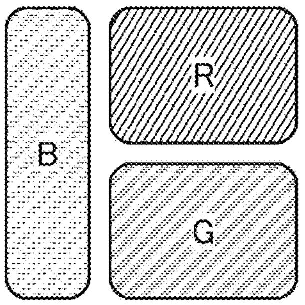
FIG. 16A to FIG. 16E are top views illustrating structure examples of a pixel.

The pixel illustrated in FIG. 16A employs S-stripe arrangement. The pixel illustrated in FIG. 16A includes three subpixels: a red subpixel R, a green subpixel G, and a blue subpixel B. The positions of the subpixel R, the subpixel G, and the subpixel B may be interchanged with one another.

Figure 16B:
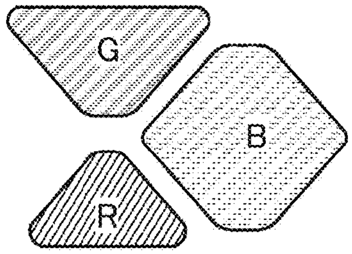

The pixel illustrated in FIG. 16B includes the subpixel R whose top surface shape is a rough trapezoid with rounded corners, the subpixel G whose top surface shape is a rough triangle with rounded corners, and the subpixel B whose top surface shape is a rough tetragon or rough hexagon with rounded corners. In addition, the subpixel G has a larger light-emitting area than the subpixel R. In this manner, the shapes and sizes of the subpixels can be determined independently. For example, the size of a subpixel including a light-emitting element with higher reliability can be smaller. Note that the positions of the subpixel R, the subpixel G, and the subpixel B may be interchanged with one another.

Figure 16C:
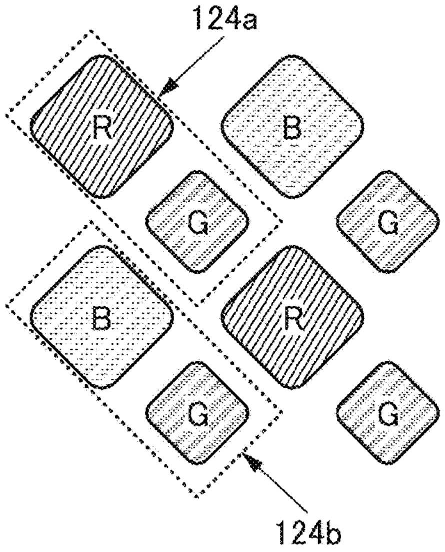

A pixel 124*a* and a pixel 124*b* illustrated in FIG. 16C employ PenTile arrangement. FIG. 16C illustrates an example where the pixels 124*a* including the subpixel R and the subpixel G and the pixels 124*b* including the subpixel G and the subpixel B are alternately arranged. Note that the positions of the subpixel R, the subpixel G, and the subpixel B may be interchanged with one another.

Figure 16D:
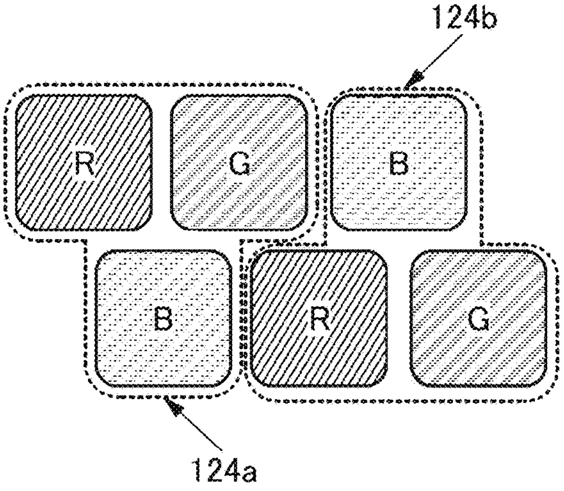

The pixel 124*a* and the pixel 124*b* illustrated in FIG. 16D employ delta arrangement. The pixel 124*a* includes two subpixels (subpixel R and subpixel G) in the upper row (first row) and one subpixel (subpixel B) in the lower row (second row). The pixel 124*b* includes one subpixel (subpixel B) in the upper row (first row) and two subpixels (subpixel R and subpixel G) in the lower row (second row). Note that the positions of the subpixel R, the subpixel G, and the subpixel B may be interchanged with one another.

Although FIG. 16D illustrates an example in which a top surface shape of each subpixel is a rough trapezoidal shape with rounded corners, the top surface shape is not limited to this; for example, the top surface shape of each subpixel may be a circular shape.

Figure 16E:
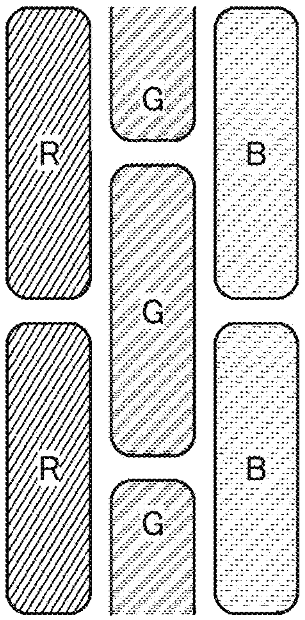

FIG. 16E illustrates an example where subpixels of different colors are arranged in a zigzag manner. Specifically, the positions of the top sides of two subpixels arranged in the column direction (e.g., the subpixel R and the subpixel G or the subpixel G and the subpixel B) are not aligned in the top view. Note that the positions of the subpixel R, the subpixel G, and the subpixel B may be interchanged with one another.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method of manufacturing the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a design pattern agrees with a transferred pattern (an OPC (Optical Proximity Correction) technique) may be used. Specifically, with the OPC technique, a pattern for correction is added to a corner portion or the like of a figure on a mask pattern.

[Display Apparatus Including Light-Receiving Element]

Figure 17A:
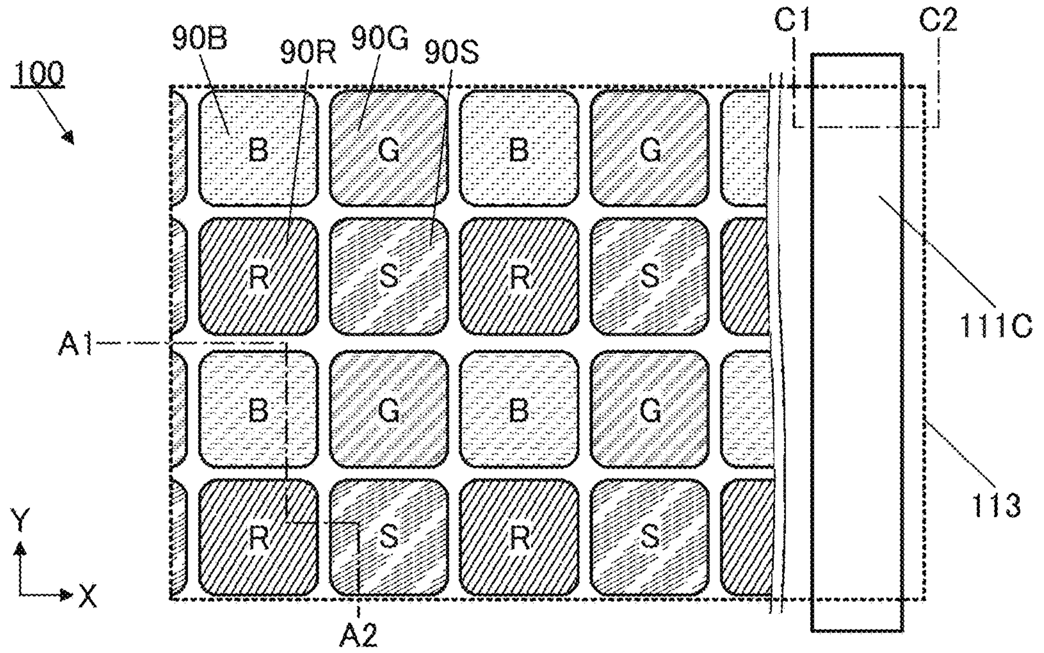
FIG. 17A and FIG. 17B are diagrams illustrating a structure example of a display apparatus.

The display apparatus 100 of one embodiment of the present invention may further include a light-receiving element 90S. FIG. 17A is a schematic top view of the display apparatus 100. The display apparatus 100 includes a plurality of light-emitting elements 90R emitting red light, a plurality of light-emitting elements 90G emitting green light, a plurality of light-emitting elements 90B emitting blue light, and a plurality of light-receiving elements 90S. In FIG. 10A, light-emitting regions of the light-emitting elements and the light-receiving elements are denoted by R, G, B, and S to easily differentiate the light-emitting elements.

The light-emitting elements 90R, the light-emitting elements 90G, the light-emitting elements 90B, and the light-receiving elements 90S are arranged in a matrix. In FIG. 17A, two elements are alternately arranged in one direction. Note that the arrangement method of the light-emitting elements is not limited thereto; another method such as a stripe, S stripe, delta, Bayer, zigzag, PenTile, or diamond arrangement may also be used.

Figure 17B:
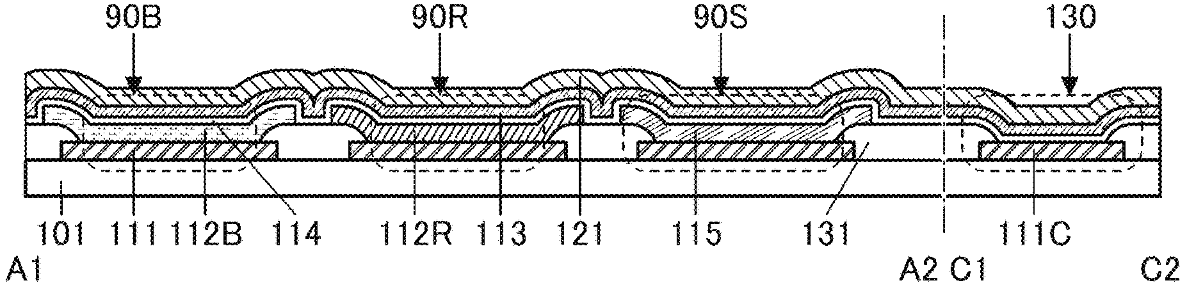

FIG. 17B is a schematic cross-sectional view taken along the dashed-dotted line A1-A2 and the dashed-dotted line C1-C2 in FIG. 17A. Note that the display apparatus 100 illustrated in FIG. 17A and FIG. 17B has the same structure as the display apparatus 100 illustrated in FIG. 10A and FIG. 10B except for including the light-receiving element 90S. The components which are the same as those of the display apparatus 100 illustrated in FIG. 10A and FIG. 10B have the same reference numerals, and the above description can be referred to for the details.

FIG. 17B is a schematic cross-sectional view of the light-emitting element 90B, the light-emitting element 90R, the light-receiving element 90S, and the connection electrode 111C. Note that the light-emitting element 90G that is not illustrated in the schematic cross-sectional view can have a structure similar to that of the light-emitting element 90B or the light-emitting element 90R.

The light-receiving element 90S includes the pixel electrode 111, an organic layer 115, the organic layer 114, and the common electrode 113. The organic layer 114 and the common electrode 113 are shared by the light-emitting element 90B, the light-emitting element 90R, and the light-receiving element 90S.

The organic layer 115 contains a photoelectric conversion material that has sensitivity in the visible light or infrared light wavelength range. The organic layer 115 may include one or more of an electron-injection layer, an electron-transport layer, a hole-injection layer, and a hole-transport layer.

As illustrated in FIG. 17B, there are gaps between the organic layers of two light-emitting elements that emit light of different colors and between the organic layers of the light-emitting element and the light-receiving element, and the organic layers are provided apart from each other. The organic layer 112R, the organic layer 112B, and the organic layer 115 are thus preferably provided so as not to be in contact with each other. This favorably prevents unintentional light emission from being caused by current flowing through adjacent two organic layers. As a result, the contrast can be increased to achieve a display apparatus with high display quality.

The organic layer 115 preferably has a taper angle of greater than or equal to 30°. In an end portion of the organic layer 115, the angle between a side surface (a surface) of the layer and a bottom surface of the layer (a surface on which the layer is formed) is preferably greater than or equal to 30° and less than or equal to 120°, further preferably greater than or equal to 45° and less than or equal to 120°, still further preferably greater than or equal to 60° and less than or equal to 120°. Alternatively, the organic layer 115 preferably has a taper angle of 90° or a neighborhood thereof (greater than or equal to 80° and less than or equal to 100°, for example).

The organic layer 115 included in the light-receiving element 90S may have the structure illustrated in FIG. 11 to FIG. 15 as well as the organic layer 112R included in the light-emitting element 90R or the like.

At least part of this embodiment can be implemented in combination with any of the other embodiments described in this specification, as appropriate.

Embodiment 3

In this embodiment, a light-emitting apparatus including the light-receiving element of one embodiment of the present invention (hereinafter referred to as a light-emitting and light-receiving apparatus in some cases) will be described. A display apparatus exemplified below can be favorably used for the light-emitting and light-receiving portion of the display apparatus described in the above embodiment.

A light-emitting and light-receiving portion of the light-emitting and light-receiving apparatus of one embodiment of the present invention includes light-receiving elements (also referred to as light-receiving devices) and light-emitting elements (also referred to as light-emitting devices). The light-emitting and light-receiving portion has a function of displaying an image with the use of the light-emitting elements. Furthermore, the light-emitting and light-receiving portion has one or both of a function of capturing an image with the use of the light-receiving elements and a sensing function. Thus, the light-emitting and light-receiving apparatus of one embodiment of the present invention can be expressed as a display apparatus, and the light-emitting and light-receiving portion can be expressed as a display portion.

Alternatively, the light-emitting and light-receiving apparatus of one embodiment of the present invention may have a structure including light-emitting and light-receiving elements (also referred to as light-emitting and light-receiving devices) and light-emitting elements.

First, a light-emitting and light-receiving apparatus including light-receiving elements and light-emitting elements is described.

The light-emitting and light-receiving apparatus of one embodiment of the present invention includes a light-receiving element and a light-emitting element in a light-emitting and light-receiving portion. In the light-emitting and light-receiving apparatus of one embodiment of the present invention, the light-emitting elements are arranged in a matrix in the light-emitting and light-receiving portion, and an image can be displayed on the light-emitting and light-receiving portion. Furthermore, the light-receiving elements are arranged in a matrix in the light-emitting and light-receiving portion, and the light-emitting and light-receiving portion has one or both of an image capturing function and a sensing function. The light-emitting and light-receiving portion can be used as an image sensor, a touch sensor, or the like. That is, by detecting light with the light-emitting and light-receiving portion, an image can be captured and touch operation of an object (e.g., a finger or a stylus) can be detected. Furthermore, in the light-emitting and light-receiving apparatus of one embodiment of the present invention, the light-emitting elements can be used as a light source of the sensor. Accordingly, a light-receiving portion and a light source do not need to be provided separately from the light-emitting and light-receiving apparatus; hence, the number of components of an electronic device can be reduced.

In the light-emitting and light-receiving apparatus of one embodiment of the present invention, when an object reflects (or scatters) light emitted from the light-emitting element included in the light-emitting and light-receiving portion, the light-receiving element can detect the reflected light (or the scattered light); thus, image capturing, touch operation detection, or the like is possible even in a dark place.

The light-emitting element included in the light-emitting and light-receiving apparatus of one embodiment of the present invention functions as a display element (also referred to as a display device).

As the light-emitting element, an EL element (also referred to as an EL device) such as an OLED or a QLED is preferably used. Examples of a light-emitting substance contained in the EL element include a substance exhibiting fluorescence (a fluorescent material), a substance exhibiting phosphorescence (a phosphorescent material), an inorganic compounds (e.g., quantum dot materials), and a substance exhibiting thermally activated delayed fluorescence (a thermally activated delayed fluorescent (TADF) material). An LED such as a micro LED can also be used as the light-emitting element.

The light-emitting and light-receiving apparatus of one embodiment of the present invention has a function of detecting light with the use of a light-receiving element.

When the light-receiving elements are used as an image sensor, the light-emitting and light-receiving apparatus can capture an image using the light-receiving elements. For example, the light-emitting and light-receiving apparatus can be used as a scanner.

An electronic device including the light-emitting and light-receiving apparatus of one embodiment of the present invention can obtain data related to biological information such as a fingerprint or a palm print by using a function of an image sensor. That is, a biometric authentication sensor can be incorporated in the light-emitting and light-receiving apparatus. When the light-emitting and light-receiving apparatus incorporates a biometric authentication sensor, the number of components of an electronic device can be reduced as compared to the case where a biometric authentication sensor is provided separately from the light-emitting and light-receiving apparatus; thus, the size and weight of the electronic device can be reduced.

When the light-receiving elements are used as the touch sensor, the light-emitting and light-receiving apparatus can detect touch operation of an object with the use of the light-receiving elements.

As the light-receiving element, a pn photodiode or a pin photodiode can be used, for example. The light-receiving element functions as a photoelectric conversion element (also referred to as a photoelectric conversion device) that detects light entering the light-receiving element and generates electric charge. The amount of electric charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

In the case where all the layers of the organic EL elements and the organic photodiodes are formed separately, the number of deposition steps becomes extremely large. However, a large number of layers of the organic photodiodes can have a structure in common with the organic EL elements; thus, concurrently depositing the layers that can have a common structure can inhibit an increase in the number of deposition steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer may be a layer shared by the light-receiving element and the light-emitting element. When the light-receiving element and the light-emitting element include common layers in such a manner, the number of deposition steps and the number of masks can be reduced, whereby the number of manufacturing steps and the manufacturing cost of the light-emitting and light-receiving apparatus can be reduced. Furthermore, the light-emitting and light-receiving apparatus including the light-receiving element can be manufactured using an existing manufacturing apparatus and an existing manufacturing method for the display apparatus.

Next, a light-emitting and light-receiving apparatus including light-emitting and light-receiving elements and light-emitting elements is described. Note that functions, behavior, effects, and the like similar to those in the above are not described in some cases.

In the light-emitting and light-receiving apparatus of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the light-emitting and light-receiving portion of the light-emitting and light-receiving apparatus of one embodiment of the present invention has a function of displaying an image using both light-emitting and light-receiving elements and light-emitting elements.

The light-emitting and light-receiving element functions as both a light-emitting element and a light-receiving element, whereby the pixel can have a light-receiving function without an increase in the number of subpixels included in the pixel. Thus, the light-emitting and light-receiving portion of the light-emitting and light-receiving apparatus can be provided with one or both of an image capturing function and a sensing function while keeping the aperture ratio of the pixel (aperture ratio of each subpixel) and the resolution of the light-emitting and light-receiving apparatus. Accordingly, in the light-emitting and light-receiving apparatus of one embodiment of the present invention, the aperture ratio of the pixel can be more increased and the resolution can be increased more easily than in a light-emitting and light-receiving apparatus provided with a subpixel including a light-receiving element separately from a subpixel including a light-emitting element.

In the light-emitting and light-receiving portion of the light-emitting and light-receiving apparatus of one embodiment of the present invention, the light-emitting and light-receiving elements and the light-emitting elements are arranged in a matrix, and an image can be displayed on the light-emitting and light-receiving portion. The light-emitting and light-receiving portion can be used as an image sensor, a touch sensor, or the like. In the light-emitting and light-receiving apparatus of one embodiment of the present invention, the light-emitting elements can be used as a light source of the sensor. Thus, image capturing, touch operation detection, or the like is possible even in a dark place.

The light-emitting and light-receiving element can be manufactured by combining an organic EL element and an organic photodiode. For example, by adding an active layer of an organic photodiode to a stacked-layer structure of an organic EL element, the light-emitting and light-receiving element can be manufactured. Furthermore, in the light-emitting and light-receiving element formed of a combination of an organic EL element and an organic photodiode, concurrently depositing layers that can be shared with the organic EL element can inhibit an increase in the number of deposition steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer may be a layer shared by the light-emitting and light-receiving element and the light-emitting element.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element.

The light-emitting and light-receiving apparatus of this embodiment has a function of displaying an image with the use of the light-emitting elements and the light-emitting and light-receiving elements. That is, the light-emitting elements and the light-emitting and light-receiving elements function as display elements.

The light-emitting and light-receiving apparatus of this embodiment has a function of detecting light with the use of the light-emitting and light-receiving elements. The light-emitting and light-receiving element can detect light having a shorter wavelength than light emitted from the light-emitting and light-receiving element itself.

When the light-emitting and light-receiving elements are used as an image sensor, the light-emitting and light-receiving apparatus of this embodiment can capture an image using the light-emitting and light-receiving elements. When the light-emitting and light-receiving elements are used as a touch sensor, the light-emitting and light-receiving apparatus of this embodiment can detect touch operation of an object with the use of the light-emitting and light-receiving elements.

The light-emitting and light-receiving element functions as a photoelectric conversion element. The light-emitting and light-receiving element can be manufactured by adding an active layer of the light-receiving element to the above-described structure of the light-emitting element. For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of devices.

The display apparatus that is an example of the light-emitting and light-receiving apparatus of one embodiment of the present invention is specifically described below with reference to drawings.

Structure Example of Display Apparatus

Structure Example

Figure 18A:
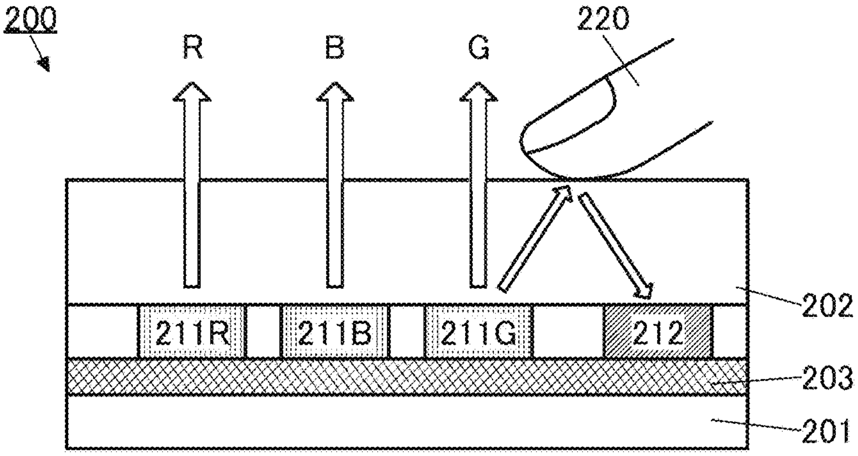
FIG. 18A, FIG. 18B, and FIG. 18D are cross-sectional views illustrating examples of a display apparatus.

FIG. 18A is a schematic view of a display panel 200. The display panel 200 includes a substrate 201, a substrate 202, a light-receiving element 212, a light-emitting element 211R, a light-emitting element 211G, a light-emitting element 211B, a functional layer 203, and the like.

The light-emitting element 211R, the light-emitting element 211G, the light-emitting element 211B, the light-receiving element 212 are provided between the substrate 201 and the substrate 202. The light-emitting element 211R, the light-emitting element 211G, and the light-emitting element 211B emit red (R) light, green (G) light, and blue (B) light, respectively. Note that in the following description, the term "light-emitting element 211" may be used when the light-emitting element 211R, the light-emitting element 211G, and the light-emitting element 211B are not distinguished from each other.

The display panel 200 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 212. The light-receiving element 212 may be provided in all the pixels or may be provided in some of the pixels. In addition, one pixel may include a plurality of light-receiving elements 212.

FIG. 18A illustrates a finger 220 touching a surface of the substrate 202. Part of light emitted from the light-emitting element 211G is reflected at a contact portion of the substrate 202 and the finger 220. In the case where part of the reflected light is incident on the light-receiving element 212, the contact of the finger 220 with the substrate 202 can be detected. That is, the display panel 200 can function as a touch panel.

The functional layer 203 includes a circuit for driving the light-emitting element 211R, the light-emitting element 211G, and the light-emitting element 211B and a circuit for driving the light-receiving element 212. The functional layer 203 is provided with a switch, a transistor, a capacitor, a wiring, and the like. Note that in the case where the light-emitting element 211R, the light-emitting element 211G, the light-emitting element 211B, and the light-receiving element 212 are driven by a passive-matrix method, a structure not provided with a switch, a transistor, or the like may be employed.

Figure 18B:
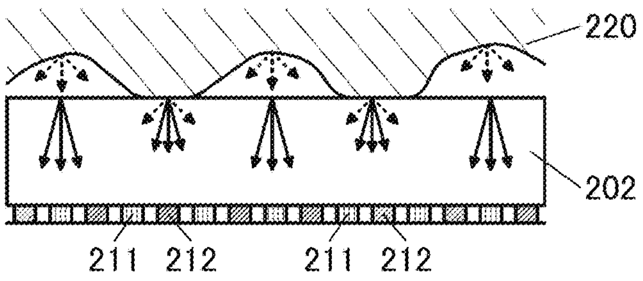

The display panel 200 preferably has a function of detecting a fingerprint of the finger 220. FIG. 18B schematically illustrates an enlarged view of the contact portion in a state where the finger 220 touches the substrate 202. FIG. 18B illustrates light-emitting elements 211 and the light-receiving elements 212 that are alternately arranged.

The fingerprint of the finger 220 is formed of depressions and projections. Therefore, as illustrated in FIG. 18B, the projections of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving elements 212 positioned directly below the contact surfaces or the non-contact surfaces is the sum of intensities of regularly reflected light and diffusely reflected light. As described above, regularly reflected light (indicated by solid arrows) is dominant near the depressions of the finger 220, where the finger 220 is not in contact with the substrate 202; whereas diffusely reflected light (indicated by dashed arrows) from the finger 220 is dominant near the projections of the finger 220, where the finger 220 is in contact with the substrate 202. Thus, the intensity of light received by the light-receiving element 212 positioned directly below the depression is higher than the intensity of light received by the light-receiving element 212 positioned directly below the projection. Accordingly, a fingerprint image of the finger 220 can be captured.

In the case where an arrangement interval between the light-receiving elements 212 is smaller than a distance between two projections of a fingerprint, preferably a distance between a depression and a projection adjacent to each other, a clear fingerprint image can be obtained. The distance between a depression and a projection of a human's fingerprint is approximately 200 μm; thus, the arrangement interval between the light-receiving elements 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 18C:
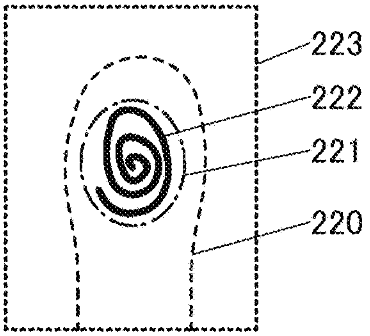
FIG. 18C and FIG. 18E are diagrams illustrating examples of images.

FIG. 18C illustrates an example of a fingerprint image captured by the display panel 200. In an image-capturing range 223 in FIG. 18C, the outline of the finger 220 is indicated by a dashed line and the outline of a contact portion 221 is indicated by a dashed-dotted line. In the contact portion 221, a high-contrast image of a fingerprint 222 can be captured owing to a difference in the amount of light incident on the light-receiving elements 212.

Figure 18D:
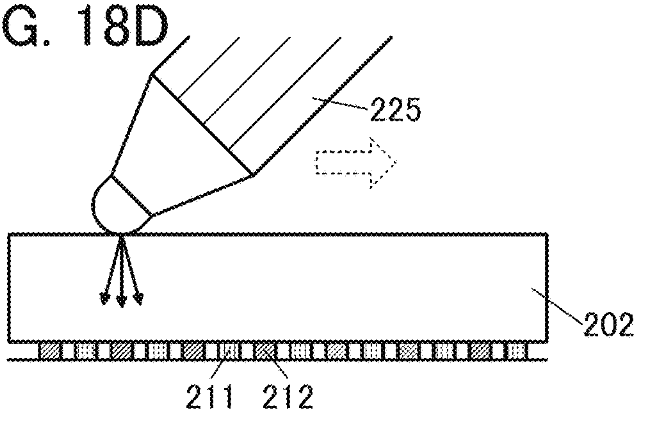

The display panel 200 can also function as a touch panel or a pen tablet. FIG. 18D illustrates a state where a tip of a stylus 225 slides in a direction indicated with a dashed arrow while the tip of the stylus 225 touches the substrate 202.

As illustrated in FIG. 18D, when diffusely reflected light that is diffused at the contact surface of the tip of the stylus 225 and the substrate 202 is incident on the light-receiving element 212 that overlaps with the contact surface, the position of the tip of the stylus 225 can be detected with high accuracy.

Figure 18E:
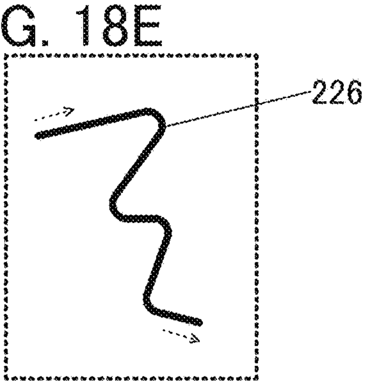

FIG. 18E illustrates an example of a path 226 of the stylus 225 that is detected by the display panel 200. The display panel 200 can detect the position of a detection target, such as the stylus 225, with high position accuracy, so that high-resolution drawing can be performed using a drawing application or the like. Unlike the case of using a capacitive touch sensor, an electromagnetic induction touch pen, or the like, the display panel 200 can detect even the position of a highly insulating object to be detected, the material of a tip portion of the stylus 225 is not limited, and a variety of writing materials (e.g., a brush, a glass pen, a quill pen, and the like) can be used.

Figure 18F:
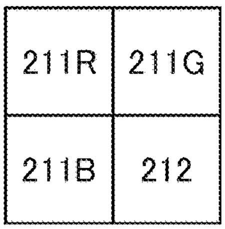
FIG. 18F to FIG. 18H are top views illustrating examples of a pixel.
Figure 18G:
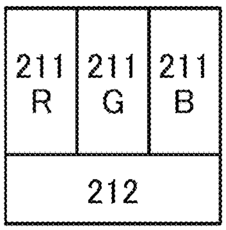
Figure 18H:
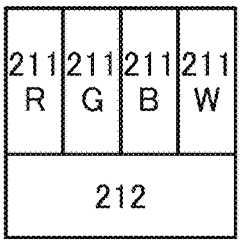

Here, FIG. 18F to FIG. 18H illustrate examples of a pixel that can be used in the display panel 200.

The pixels illustrated in FIG. 18F and FIG. 18G each include the light-emitting element 211R for red (R), the light-emitting element 211G for green (G), the light-emitting element 211B for blue (B), and the light-receiving element 212. The pixels each include a pixel circuit for driving the light-emitting element 211R, the light-emitting element 211G, the light-emitting element 211B, and the light-receiving element 212.

FIG. 18F illustrates an example in which three light-emitting elements and one light-receiving element are provided in a matrix of 2×2. FIG. 18G illustrates an example in which three light-emitting elements are arranged in one line and one laterally long light-receiving element 212 is provided below the three light-emitting elements.

The pixel illustrated in FIG. 18H is an example including a light-emitting element 211W for white (W). Here, four light-emitting elements are arranged in one line and the light-receiving element 212 is provided below the four light-emitting elements.

Note that the pixel structure is not limited to the above structure, and a variety of arrangement methods can be employed.

At least part of this embodiment can be implemented in combination with the other embodiments described in this specification as appropriate.

Embodiment 4

In this embodiment, a light-emitting element (also referred to as a light-emitting device) and a light-receiving element (also referred to as a light-receiving device) that can be used in the display apparatus of one embodiment of the present invention will be described.

In this specification and the like, a display apparatus fabricated using a metal mask or an FMM (fine metal mask or a high-resolution metal mask) may be referred to as a display apparatus having an MM (metal mask) structure. In this specification and the like, a display apparatus fabricated without using a metal mask or an FMM may be referred to as a display apparatus having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

[Light-Emitting Device]

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission in a single structure, two or more light-emitting layers are selected such that emission colors of the light-emitting layers are complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, a structure in which white light emission can be obtained by combining light from light-emitting layers of a plurality of light-emitting units is employed. Note that a combination of emission colors for obtaining white light emission is similar to that of the case of a single structure. In the device having a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Structure Example of Light-Emitting Device

Figure 19A:
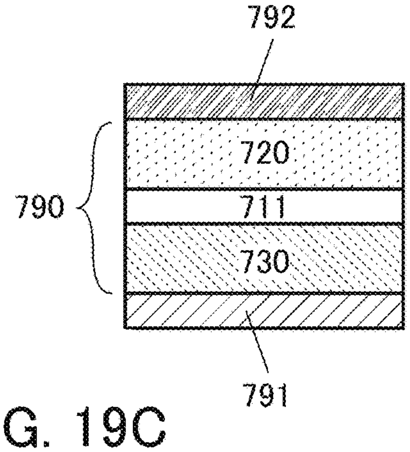
FIG. 19A to FIG. 19F are diagrams illustrating structure examples of a light-emitting device.

As illustrated in FIG. 19A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 19A is referred to as a single structure in this specification.

Figure 19B:
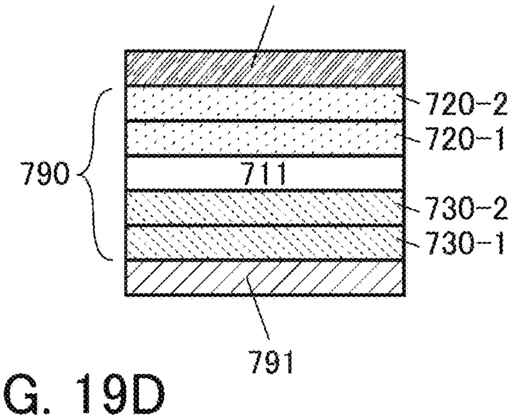

FIG. 19B is a modification example of the EL layer 790 included in the light-emitting device illustrated in FIG. 19A. Specifically, the light-emitting device illustrated in FIG. 19B includes a layer 730-1 over the lower electrode 791, a layer 730-2 over the layer 730-1, the light-emitting layer 711 over the layer 730-2, a layer 720-1 over the light-emitting layer 711, a layer 720-2 over the layer 720-1, and the upper electrode 792 over the layer 720-2. For example, when the lower electrode 791 is an anode and the upper electrode 792 is a cathode, the layer 730-1 functions as a hole-injection layer, the layer 730-2 functions as a hole-transport layer, the layer 720-1 functions as an electron-transport layer, and the layer 720-2 functions as an electron-injection layer. Alternatively, when the lower electrode 791 is a cathode and the upper electrode 792 is an anode, the layer 730-1 functions as an electron-injection layer, the layer 730-2 functions as an electron-transport layer, the layer 720-1 functions as a hole-transport layer, and the layer 720-2 functions as a hole-injection layer. With such a layered structure, carriers can be efficiently injected to the light-emitting layer 711, and the efficiency of the recombination of carriers in the light-emitting layer 711 can be enhanced.

Figure 19C:
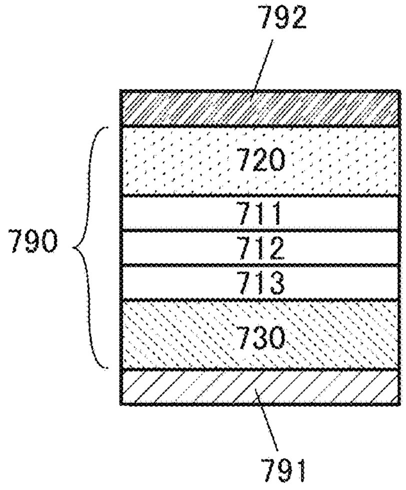
Figure 19D:
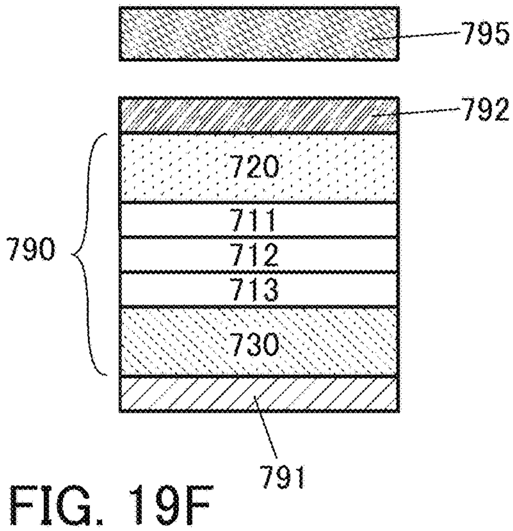

Note that structures in which a plurality of light-emitting layers (light-emitting layers 711, 712, and 713) are provided between the layer 720 and the layer 730 as illustrated in FIG. 19C and FIG. 19D are variations of the single structure.

Figure 19E:
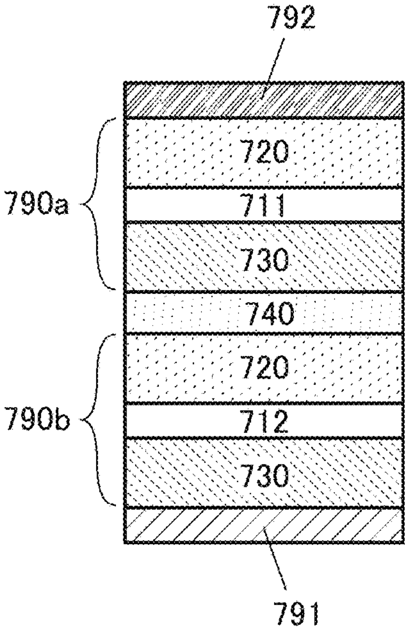
Figure 19F:
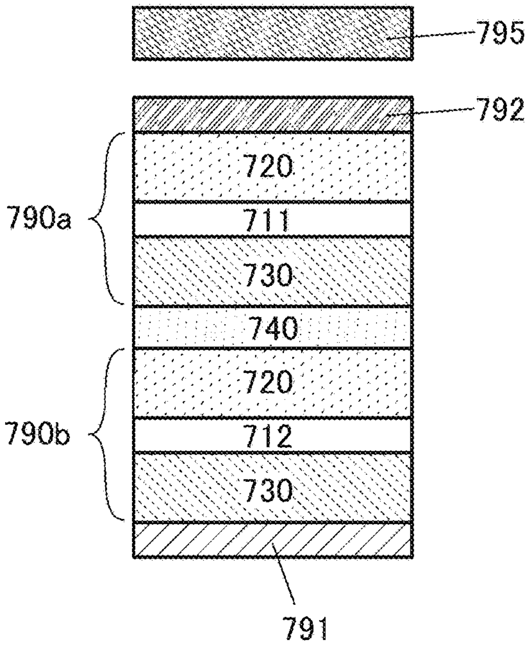

Structures in which a plurality of light-emitting units (EL layer 790*a* and EL layer 790*b*) are connected in series with an intermediate layer (charge-generation layer) 740 therebetween as illustrated in FIG. 19E and FIG. 19F are referred to as a tandem structure in this specification. In this specification and the like, the structures illustrated in FIG. 19E and FIG. 19F are referred to as a tandem structure; however, without being limited to this, a tandem structure may be referred to as a stack structure, for example. The tandem structure enables a light-emitting device capable of high-luminance light emission.

In FIG. 19C, light-emitting materials that emit light of the same color may be used for the light-emitting layer 711, the light-emitting layer 712, and the light-emitting layer 713.

Alternatively, different light-emitting materials may be used for the light-emitting layer 711, the light-emitting layer 712, and the light-emitting layer 713. For example, white light can be obtained from light emitted by the light-emitting layer 711, the light-emitting layer 712, and the light-emitting layer 713. FIG. 19D illustrates an example in which a coloring layer 795 functioning as a color filter is provided. When white light passes through a color filter, light of a desired color can be obtained.

In FIG. 19E, the same light-emitting material may be used for the light-emitting layer 711 and the light-emitting layer 712. Alternatively, light-emitting materials that emit light of different colors may be used for the light-emitting layer 711 and the light-emitting layer 712. White light can be obtained when the light-emitting layer 711 and the light-emitting layer 712 emit light of complementary colors. FIG. 19F illustrates an example in which the coloring layer 795 is further provided In FIG. 19C, FIG. 19D, FIG. 19E, and FIG. 19F, the layer 720 and the layer 730 may each have a layered structure of two or more layers as illustrated in FIG. 19B.

In FIG. 19D, the same light-emitting material may be used for the light-emitting layer 711, the light-emitting layer 712, and the light-emitting layer 713. Similarly, in FIG. 19F, the same light-emitting material may be used for the light-emitting layer 711 and the light-emitting layer 712. In that case, by using a color conversion layer instead of the coloring layer 795, light of a desired color different from the emission color of the light-emitting material can be obtained. For example, a blue-light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

A structure in which light-emitting layers (here, blue (B), green (G), and red (R)) are separately formed is referred to as an SBS (Side By Side) structure in some cases The emission color of the light-emitting device can be red, green, blue, cyan, magenta, yellow, white, or the like depending on the material of the EL layer 790. Furthermore, the color purity can be further increased when the light-emitting device has a microcavity structure.

The light-emitting device that emits white light preferably contains two or more kinds of light-emitting substances in the light-emitting layer. In the case of obtaining white light emission with the use of two kinds of light-emitting substances, two or more kinds of light-emitting substances may be selected such that their emission colors are complementary colors. For example, when an emission color of a first light-emitting layer and an emission color of a second light-emitting layer are complementary colors, the light-emitting device as a whole can be configured to emit white light. In the case of a light-emitting device including three or more kinds of light-emitting substances, the light-emitting device is configured to emit white light as a whole by combining emission colors of the three or more kinds of light-emitting substances.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

[Light-Receiving Device]

Figure 20A:
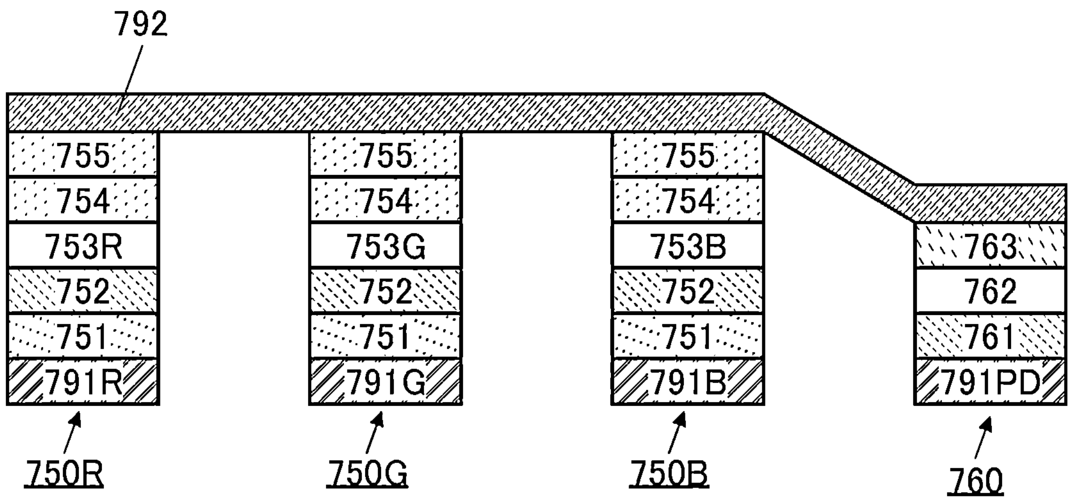
FIG. 20A and FIG. 20B are diagrams illustrating structure examples of light-emitting devices and a light-receiving device.

FIG. 20A is a schematic cross-sectional view of a light-emitting device 750R, a light-emitting device 750G, a light-emitting device 750B, and a light-receiving device 760. The light-emitting device 750R, the light-emitting device 750G, the light-emitting device 750B, and the light-receiving device 760 share an upper electrode 792.

The light-emitting device 750R includes a pixel electrode 791R, a layer 751, a layer 752, a light-emitting layer 753R, a layer 754, a layer 755, and the upper electrode 792. The light-emitting device 750G includes the pixel electrode 791G and a light-emitting layer 753G. The light-emitting device 750B includes the pixel electrode 791B and a light-emitting layer 753B.

The layer 751 includes, for example, a layer containing a substance with a high hole-injection property (a hole-injection layer). The layer 752 includes, for example, a layer containing a substance with a high hole-transport property (a hole-transport layer). The layer 754 includes, for example, a layer containing a substance with a high electron-transport property (an electron-transport layer). The layer 755 includes, for example, a layer containing a substance with a high electron-injection property (an electron-injection layer).

Alternatively, the layer 751 may include an electron-injection layer, the layer 752 may include an electron-transport layer, the layer 754 may include a hole-transport layer, and the layer 755 may include a hole-injection layer.

FIG. 20A illustrates the layer 751 and the layer 752 separately; however, one embodiment of the present invention is not limited thereto. For example, the layer 752 may be omitted when the layer 751 has functions of both a hole-injection layer and a hole-transport layer or the layer 751 has functions of both an electron-injection layer and an electron-transport layer.

Note that the light-emitting layer 753R included in the light-emitting device 750R contains a light-emitting substance that emits red light, the light-emitting layer 753G included in the light-emitting device 750G contains a light-emitting substance that emits green light, and the light-emitting layer 753B included in the light-emitting device 750B contains a light-emitting substance that emits blue light. Note that the light-emitting device 750G and the light-emitting device 750B have a structure in which the light-emitting layer 753R included in the light-emitting device 750R is replaced with the light-emitting layer 753G and the light-emitting layer 753B, respectively, and the other components are similar to those of the light-emitting device 750R.

The structure (e.g., material and thickness) of the layer 751, the layer 752, the layer 754, and the layer 755 may be the same or different from each other among the light-emitting devices of different colors.

The light-receiving device 760 includes a pixel electrode 791PD, a layer 761, a layer 762, a layer 763, and the upper electrode 792. The light-receiving device 760 can be configured not to include a hole-injection layer or an electron-injection layer.

The layer 762 includes an active layer (also referred to as a photoelectric conversion layer). The layer 762 has a function of absorbing light in a specific wavelength range and generating carriers (electrons and holes).

The layer 761 and the layer 763 each include, for example, a hole-transport layer or an electron-transport layer. In the case where the layer 761 includes a hole-transport layer, the layer 763 includes an electron-transport layer. In the case where the layer 761 includes an electron-transport layer, the layer 763 includes a hole-transport layer.

In the light-receiving device 760, the pixel electrode 791PD may be an anode and the upper electrode 792 may be a cathode, or the pixel electrode 791PD may be a cathode and the upper electrode 792 may be an anode.

Figure 20B:
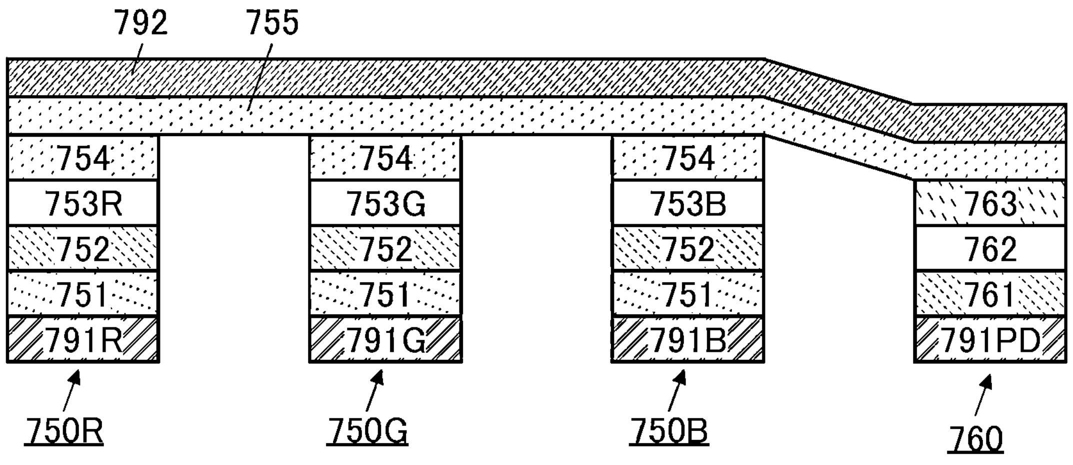

FIG. 20B is a modification example of FIG. 20A. FIG. 20B illustrates an example in which the light-emitting elements and the light-receiving element share the layer 755 as well as the upper electrode 792. In this case, the layer 755 can be referred to as a common layer. The light-emitting elements and the light-receiving element share one or more common layers in this manner, whereby the manufacturing process can be simplified, resulting in reduced manufacturing cost.

Here, the layer 755 functions as an electron-injection layer or a hole-injection layer of the light-emitting device 750R and the like. In this case, the layer 755 functions as an electron-transport layer or a hole-transport layer of the light-receiving device 760. Thus, the light-receiving device 760 illustrated in FIG. 20B is not necessarily provided with the layer 763 functioning as an electron-transport layer or a hole-transport layer.

[Light-Emitting Device]

A specific structure example of the light-emitting device will be described here.

The light-emitting devices include at least a light-emitting layer. The light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, an electron-blocking material, a substance with a bipolar property (a substance with a high electron-transport property and a high hole-transport property), or the like.

Either a low molecular compound or a high molecular compound can be used for the light-emitting devices, and an inorganic compound may also be included. Each layer included in the light-emitting device can be formed by a method such as an evaporation method (including a vacuum evaporation method), a transfer method, a printing method, an inkjet method, or a coating method.

For example, the light-emitting device can include one or more of a hole-injection layer, a hole-transport layer, a hole-blocking layer, an electron-blocking layer, an electron-transport layer, and an electron-injection layer.

The hole-injection layer is a layer that injects holes from an anode to a hole-transport layer and contains a material with a high hole-injection property. Examples of the material with a high hole-injection property include an aromatic amine compound, and a composite material containing a hole-transport material and an acceptor material (an electron-accepting material).

The hole-transport layer is a layer that transports holes, which are injected from the anode by the hole-injection layer, to the light-emitting layer. The hole-transport layer is a layer that contains a hole-transport material. As the hole-transport material, a substance having a hole mobility greater than or equal to $1\times10^{-6}$ $cm^2/Vs$ is preferable. Note that other substances can also be used as long as the substances have a hole-transport property higher than an electron-transport property. As the hole-transport material, materials with a high hole-transport property, such as a T-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by the electron-injection layer, to the light-emitting layer. The electron-transport layer is a layer that contains an electron-transport material. As the electron-transport material, a substance having an electron mobility greater than or equal to $1\times10^{-6}$ $cm^2/Vs$ is preferable. Note that other substances can also be used as long as the substances have an electron-transport property higher than a hole-transport property. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

For the electron-injection layer, it is possible to use, for example, an alkali metal, an alkaline earth metal, or a compound thereof, such as lithium, cesium, ytterbium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. In addition, the electron-injection layer may have a stacked-layer structure of two or more layers. In the stacked-layer structure, for example, lithium fluoride can be used for the first layer and ytterbium can be used for the second layer.

Alternatively, an electron-transport material may be used for the electron-injection layer. For example, a compound having an unshared electron pair and an electron deficient heteroaromatic ring can be used for the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer that contains a light-emitting substance. The light-emitting layer can include one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (in particular, an iridium complex) having a 4H-triazole skeleton, a 1H-triazole skeleton, an imidazole skeleton, a pyrimidine skeleton, a pyrazine skeleton, or a pyridine skeleton; an organometallic complex (in particular, an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength is to be overlapped with the wavelength of the lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

[Light-Receiving Device]

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor included in the active layer. An organic semiconductor is preferably used, in which case the light-emitting layer and the active layer can be formed by the same method (e.g., a vacuum evaporation method) and thus the same manufacturing apparatus can be used.

Examples of an n-type semiconductor material contained in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, an electron-donating property (donor property) usually increases; however, having a spherical shape, fullerene has a high electron-accepting property even when π-electron conjugation widely spreads therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of the fullerene derivative include [6,6]-Phenyl-C71-butyric acid methyl ester (abbreviation: PC70BM), [6,6]-Phenyl-C61-butyric acid methyl ester (abbreviation: PC60BM), and 1',1",4',4"-Tetrahydro-di[1,4]methanonaphthaleno[1,2:2',3',56,60:2",3"][5,6]fullerene-C60 (abbreviation: ICBA).

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of the p-type semiconductor material include a carbazole derivative, a thiophene derivative, a furan derivative, and a compound having an aromatic amine skeleton. Furthermore, other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of the same kind, which have molecular orbital energy levels close to each other, can improve a carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing a substance with a high hole-transport property, a substance with a high electron-transport property, a substance with a bipolar property (a substance with a high electron-transport property and a high hole-transport property), or the like. Without limitation to the above, the light-receiving device may further include a layer containing a substance with a high hole-injection property, a hole-blocking material, a material with a high electron-injection property, an electron-blocking material, or the like.

Either a low molecular compound or a high molecular compound can be used in the light-receiving device, and an inorganic compound may also be included. Each layer included in the light-receiving device can be formed by a method such as an evaporation method (including a vacuum evaporation method), a transfer method, a printing method, an inkjet method, or a coating method.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO) or an organic compound such as polyethylenimine ethoxylated (PEIE) can be used. The light-receiving device may include a mixed film of PEIE and ZnO, for example.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to expand the wavelength range. In that case, the third material may be a low molecular compound or a high molecular compound.

The above is the description of the light-receiving device.

At least part of this embodiment can be implemented in combination with the other embodiments described in this specification as appropriate.

Embodiment 5

In this embodiment, a structure example of a display apparatus for which the semiconductor device of one embodiment of the present invention can be used will be described.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Apparatus 400]

Figure 21:
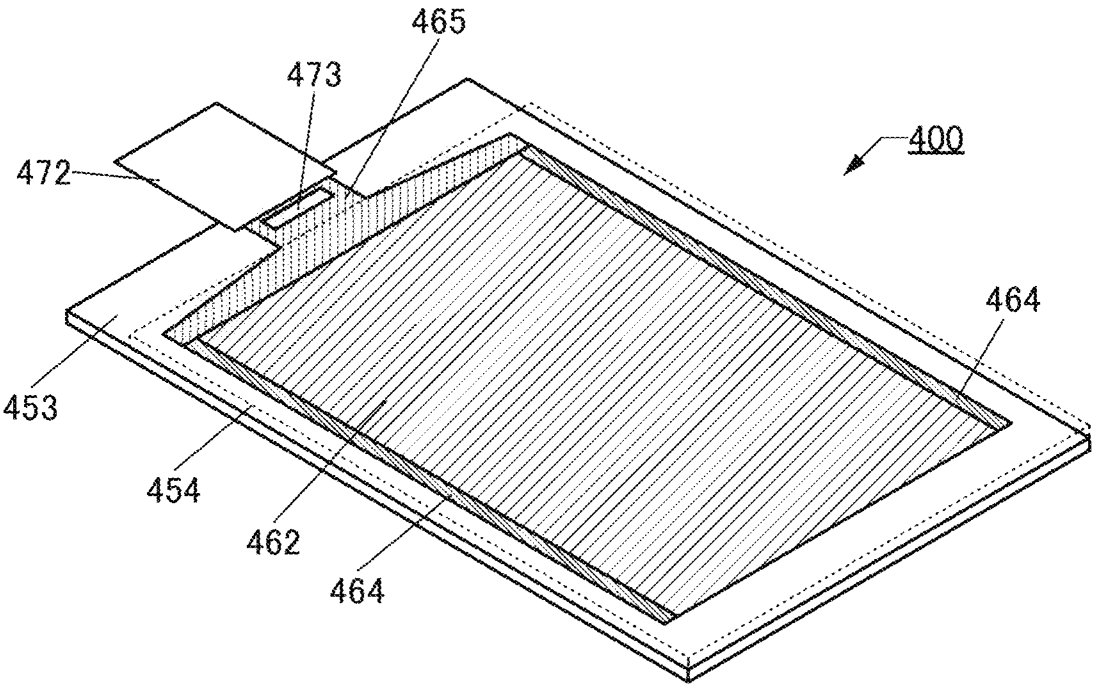
FIG. 21 is a diagram illustrating a structure example of a display apparatus.
Figure 22:
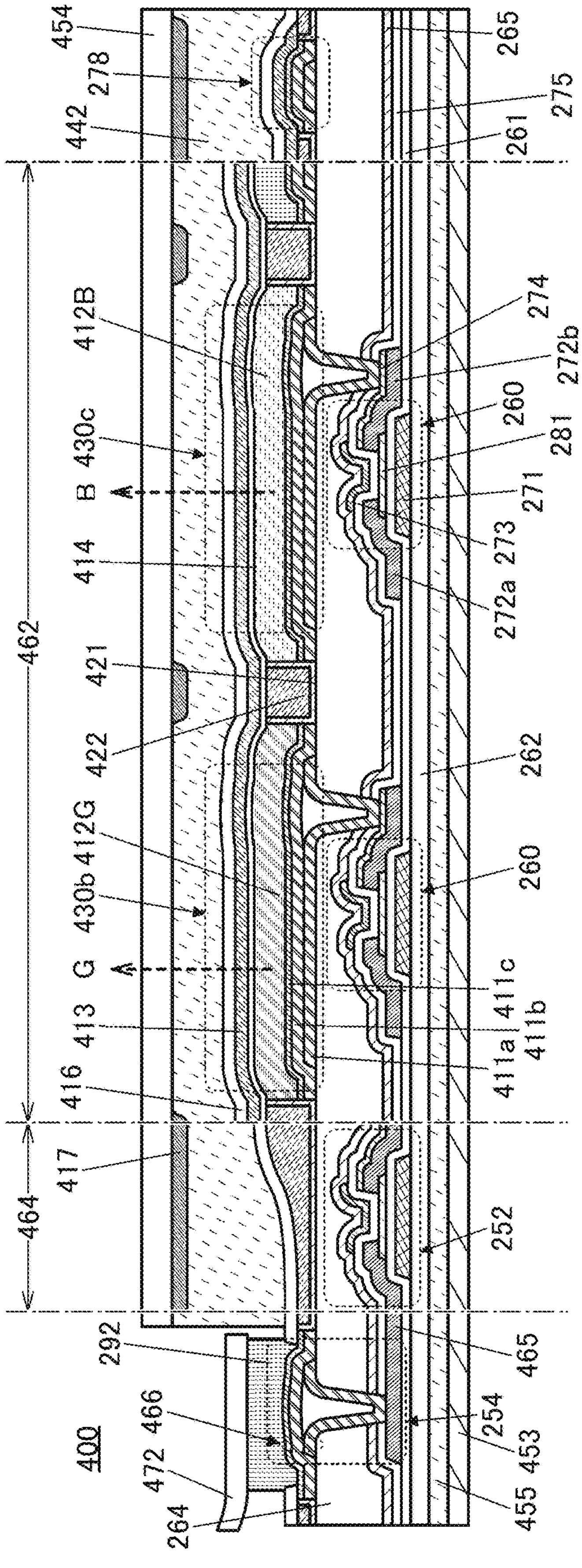
FIG. 22 is a cross-sectional view illustrating an example of a display apparatus.

FIG. 21 is a perspective view of a display apparatus 400, and FIG. 22 is a cross-sectional view of the display apparatus 400.

The display apparatus 400 has a structure in which a substrate 454 and a substrate 453 are bonded to each other. In FIG. 21, the substrate 454 is denoted by a dashed line.

The display apparatus 400 includes a display portion 462, a circuit 464, a wiring 465, and the like. FIG. 21 illustrates an example in which an IC 473 and an FPC 472 are integrated on the display apparatus 400. Thus, the structure illustrated in FIG. 21 can be regarded as a display module including the display apparatus 400, the IC (integrated circuit), and the FPC.

As the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 21 illustrates an example in which the IC 473 is provided over the substrate 453 by a COG (Chip On Glass) method, a COF (Chip On Film) method, or the like. An IC including a scan line driver circuit, a signal line driver circuit, or the like can be used as the IC 473, for example. Note that the display apparatus 400 and the display module are not necessarily provided with an IC. The IC may be mounted on the FPC by a COF method or the like.

FIG. 22 illustrates an example of cross sections of part of a region including the FPC 472, part of the circuit 464, part of the display portion 462, and part of a region including a connection portion in the display apparatus 400. FIG. 22 specifically illustrates an example of a cross section of a region including a light-emitting element 430*b* that emits green light (G) and a light-emitting element 430*c* that emits blue light (B) in the display portion 462.

The display apparatus 400 illustrated in FIG. 22 includes a transistor 252, a transistor 260, the light-emitting element 430*b*, the light-emitting element 430*c*, and the like between the substrate 453 and the substrate 454. Here, the transistor 252 is a transistor included in the circuit 464 (e.g., a scan line driver circuit). The transistor 260 is a transistor included in a pixel circuit provided in the display portion 462.

As the transistor 252 and the transistor 260, the transistors exemplified above can be used. The light-emitting element described above can be used for the light-emitting element 430*b* and the light-emitting element 430*c*.

Here, in the case where the pixel of the display apparatus includes three kinds of subpixels including light-emitting elements that emit light of different colors, as the three subpixels, subpixels of three colors of red (R), green (G), and blue (B), subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given. Alternatively, the subpixel may include a light-emitting element that emits infrared light.

A light-receiving element may be provided as described in the above embodiment. As the light-receiving element, a photoelectric conversion element having sensitivity to light in a red, green, or blue wavelength range or a photoelectric conversion element having sensitivity to light in an infrared wavelength range can be used.

The substrate 454 and the protective layer 416 are bonded to each other with the adhesive layer 442. The adhesive layer 442 is provided to overlap with the light-emitting element 430*b* and the light-emitting element 430*c*; that is, the display apparatus 400 employs a solid sealing structure. The substrate 454 is provided with a light-blocking layer 417.

The light-emitting element 430*b* and the light-emitting element 430*c* each include a conductive layer 411*a*, a conductive layer 411*b*, and a conductive layer 411*c* as a pixel electrode. The conductive layer 411*b* has a property of reflecting visible light and functions as a reflective electrode. The conductive layer 411*c* has a property of transmitting visible light and functions as an optical adjustment layer.

The conductive layer 411*a* included in each of the light-emitting element 430*b* and the light-emitting element 430*c* is connected to a mask layer 274 included in the transistor 260 through an opening provided in an insulating layer 264, an insulating layer 265, and an insulating layer 275. The transistor 260 has a function of controlling driving of the light-emitting element.

An EL layer 412G or an EL layer 412B is provided to cover the pixel electrode. An insulating layer 421 is provided in contact with a side surface of the EL layer 412G and a side surface of the EL layer 412B, and a resin layer 422 is provided to fill a depressed portion of the insulating layer 421. An organic layer 414, a common electrode 413, and the protective layer 416 are provided to cover the EL layer 412G and the EL layer 412B. With provision of the protective layer 416 that covers the light-emitting element, entry of impurities such as water into the light-emitting element can be inhibited, leading to an increase in the reliability of the light-emitting element.

Each EL layer is processed by a photolithography method, whereby the distance between pixels can be reduced to less than or equal to 8 μm, less than or equal to 3 μm, less than or equal to 2 μm, or less than or equal to 1 μm. Here, the distance between pixels can be determined by the distance between opposite end portions of the EL layer 412G and the EL layer 412B, for example. Although not illustrated in FIG. 22, the distance between pixels can be determined by the distance between opposite end portions of an EL layer emitting red light and the EL layer 412G or the EL layer 412B. Alternatively, the distance between pixels can be determined by the distance between opposite end portions of adjacent EL layers emitting light of the same color. Alternatively, the distance between pixels can be determined by the distance between opposite end portions of adjacent pixel electrodes (any of the conductive layer 411*a*, the conductive layer 411*b*, and the conductive layer 411*c*). The distance between pixels is shortened in this manner, whereby a display apparatus with high resolution and a high aperture ratio can be provided.

Light G emitted from the light-emitting element 430*b* and light B emitted from the light-emitting element 430*c* are emitted toward the substrate 454 side. For the substrate 454, a material having a high visible-light-transmitting property is preferably used.

The transistor 252 and the transistor 260 are formed over the substrate 453. These transistors can be fabricated using the same material in the same step.

Note that the transistor 252 and the transistor 260 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials and/or have different thicknesses.

The substrate 453 and an insulating layer 262 are bonded to each other with an adhesive layer 455.

In a manufacturing method of the display apparatus 400, first, a formation substrate provided with the insulating layer 262, the transistors, the light-emitting elements, the light-receiving element, and the like is bonded to the substrate 454 provided with the light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display apparatus 400.

A connection portion 254 is provided in a region of the substrate 453 that does not overlap with the substrate 454. In the connection portion 254, the wiring 465 is electrically connected to the FPC 472 through a conductive layer 466 and a connection layer 292. The conductive layer 466 can be obtained by processing the same conductive film as the pixel electrode. Thus, the connection portion 254 and the FPC 472 can be electrically connected to each other through the connection layer 292.

The transistor 252 and the transistor 260 each include a conductive layer 271 functioning as a bottom gate, an insulating layer 261 functioning as a bottom gate insulating layer, a semiconductor layer 281 including a channel formation region, a conductive layer 272*a* functioning as one of a source and a drain, a conductive layer 272*b* functioning as the other of the source and the drain, a mask layer 274 functioning as a hard mask, an insulating layer 275 functioning as a top gate insulating layer, a conductive layer 273 functioning as a top gate, and an insulating layer 265 covering the conductive layer 273.

As the transistor 252 and the transistor 260, the transistors described in the above embodiment can be used. This embodiment describes an example in which the transistor illustrated in FIG. 6A and FIG. 6B is provided as each of the transistor 252 and the transistor 260.

Here, the conductive layer 271 corresponds to the conductive layer 15 in the above embodiment, the insulating layer 261 corresponds to the insulating layer 17 in the above embodiment, the semiconductor layer 281 corresponds to the semiconductor layer 18 in the above embodiment, the conductive layer 272*a* corresponds to the conductive layer 12*a* in the above embodiment, the conductive layer 272*b* corresponds to the conductive layer 12*b* in the above embodiment, the mask layer 274 corresponds to the mask layer 19 in the above embodiment, the insulating layer 275 corresponds to the insulating layer 16 in the above embodiment, the conductive layer 273 corresponds to the conductive layer 20 in the above embodiment, and the insulating layer 265 corresponds to the insulating layer 22 in the above embodiment. Therefore, the description in the above embodiment can be referred to for details of the transistor and components of the transistor. Note that the mask layer 274 is provided over the conductive layer 272*b* in each of the transistor 252 and the transistor 260, the position of which is opposite to that of the mask layer 19 provided over the conductive layer 12*a* in the transistor illustrated in FIG. 6A and FIG. 6B.

As illustrated in FIG. 22, a top surface of the mask layer 274 is in contact with a bottom surface of the conductive layer 411*a* included in the pixel electrode. Thus, the conductive layer 272*b* functioning as the other of a source and a drain of the transistor 260 is electrically connected to the conductive layer 411*a* included in the pixel electrode with the mask layer 274 having conductivity positioned therebetween.

Note that in the case where an inorganic insulating film is used as the mask layer 274, an opening may be provided also in the mask layer 274 to form a structure in which a top surface of the conductive layer 272*b* is in direct contact with a top surface of the conductive layer 411*a*. The mask layer 274 may be provided over the conductive layer 272*a*. Also in that case, the top surface of the conductive layer 272*b* is in direct contact with the top surface of the conductive layer 411*a*.

As described in the above embodiment, the transistor 260 can include a region in which the distance between the opposite end portions of the conductive layer 272*a* and the conductive layer 272*b* (channel length L) can be less than or equal to 3 μm, preferably less than or equal to 2 μm, further preferably less than or equal to 1 μm, still further preferably less than or equal to 0.7 μm, yet still further preferably less than or equal to 0.5 μm. With this structure, the on-state current of the transistor 260 can be increased (in other words, the on-state characteristics can be improved). Alternatively, the channel width can be reduced in a state where the on-state current of the transistor 260 is relatively high.

Thus, even when the display portion 462 has high resolution (for example, the distance between adjacent pixels is less than or equal to 8 μm) and an area of each pixel is reduced, a pixel circuit can be formed with use of the transistor 260. The transistor 260 can be used as a driving transistor that requires a large amount of current.

Similarly, the on-state current of the transistor 252 can be increased. Alternatively, the channel width can be reduced in a state where the on-state current of the transistor 260 is relatively high.

Thus, the transistor 252 can be used in a scan line driver circuit or the like which requires a large amount of current. Furthermore, a reduction in the size of the transistor 260 can reduce the size of the scan line driver circuit. Therefore, the display apparatus can have a narrower frame.

Note that although this embodiment describes the structure in which the transistor illustrated in FIG. 6A and FIG. 6B is provided in the display apparatus 400, the present invention is not limited to this. In accordance with a circuit configuration or the like of the display apparatus, any of the transistors described in the above embodiments can be provided as appropriate.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A material through which impurities such as water and hydrogen do not easily diffuse is preferably used for at least one of the insulating layers covering the transistors. Such an insulating layer can function as a barrier layer. Such a structure can effectively inhibit diffusion of impurities into the transistors from the outside and increase the reliability of a display apparatus.

An inorganic insulating film is preferably used as each of the insulating layer 261, the insulating layer 262, the insulating layer 265, and the insulating layer 275. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that its end portion is positioned on the inner side compared to the end portion of the display apparatus 400, to prevent the organic insulating film from being exposed at the end portion of the display apparatus 400.

An organic insulating film is suitable for the insulating layer 264 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on a surface of the substrate 454 on the substrate 453 side. A variety of optical members can be arranged on the outer surface of the substrate 454. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 454.

FIG. 22 illustrates a connection portion 278. In the connection portion 278, the common electrode 413 is electrically connected to a wiring. FIG. 22 illustrates an example of the case in which the wiring has the same stacked-layer structure as the pixel electrode.

For each of the substrate 453 and the substrate 454, glass, quartz, ceramics, sapphire, a resin, a metal, an alloy, a semiconductor, or the like can be used. The substrate on the side from which light from the light-emitting element is extracted is formed using a material which transmits the light. When the substrate 453 and the substrate 454 are formed using a flexible material, the flexibility of the display apparatus can be increased and a flexible display can be achieved. Furthermore, a polarizing plate may be used as the substrate 453 or the substrate 454.

For each of the substrate 453 and the substrate 454, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 453 and the substrate 454.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 292, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display apparatus, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given. At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 6

In this embodiment, a metal oxide (also referred to as an oxide semiconductor) that can be used in the transistor described in the above embodiment is described.

The metal oxide used in the transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more kinds selected from gallium, aluminum, yttrium, and tin, and further preferably M is gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide film deposited at room temperature is in an intermediate state, which is neither a single crystal nor polycrystal nor an amorphous state, and it cannot be concluded that In—Ga—Zn oxide film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductors include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor having a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of flexibility of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<Structure of Oxide Semiconductor>

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof and these regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used for a film formation gas. The proportion of the flow rate of an oxygen gas in the total flow rate of the film formation gas during deposition is preferably as low as possible. For example, the proportion of the flow rate of an oxygen gas in the total flow rate of the film formation gas is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (u) can be achieved.

On the other hand, the second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

A transistor using the CAC-OS has high reliability. Thus, the CAC-OS is the most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times 10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 7

In this embodiment, electronic devices of one embodiment of the present invention will be described with reference to FIG. 23 to FIG. 26.

An electronic device in this embodiment includes the display device of one embodiment of the present invention. Resolution, definition, and sizes of the display device of one embodiment of the present invention are easily increased. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of electronic devices include electronic devices with a relatively large screen, such as a television device, a desktop or notebook personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display device of one embodiment of the present invention can have a high resolution, and thus can be suitably used for an electronic device having a relatively small display portion. As such an electronic device, a watch-type or bracelet-type information terminal (wearable device); and a wearable device worn on a head, such as a device for VR (Virtual Reality) such as a head-mounted display and a glasses-type device for AR (Augmented Reality) can be given, for example. Examples of wearable devices include a device for SR (Substitutional Reality) and a device for MR (Mixed Reality).

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680× 4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device with high definition and high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
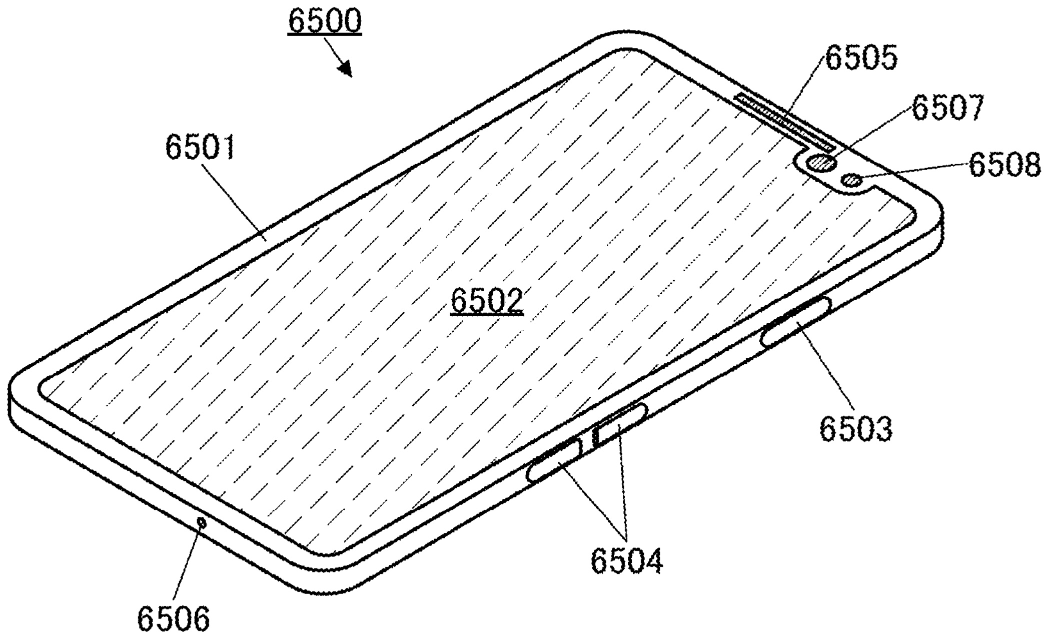
FIG. 23A and FIG. 23B are diagrams illustrating an example of an electronic device.

An electronic device 6500 illustrated in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502.

Figure 23B:
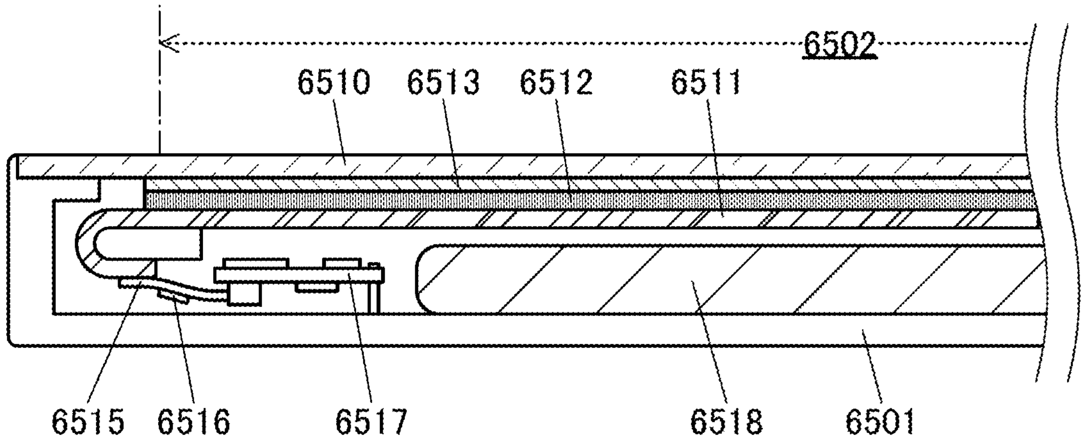

FIG. 23B is a schematic cross-sectional view including the end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of the pixel portion, whereby an electronic device with a narrow bezel can be achieved.

Figure 24A:
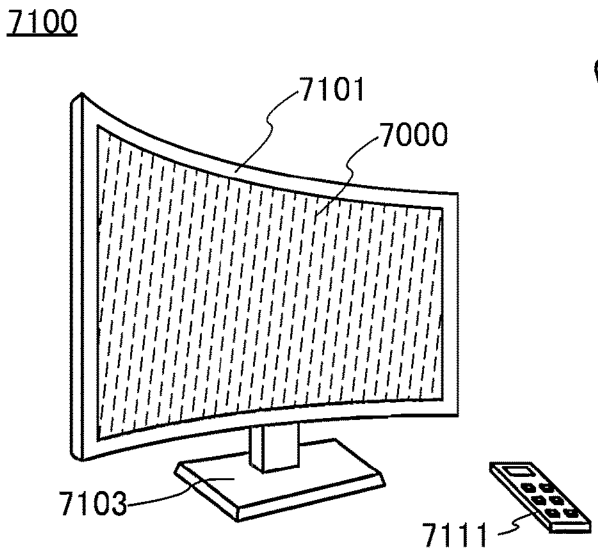
FIG. 24A to FIG. 24D are diagrams illustrating examples of electronic devices.

FIG. 24A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 24A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 24B:
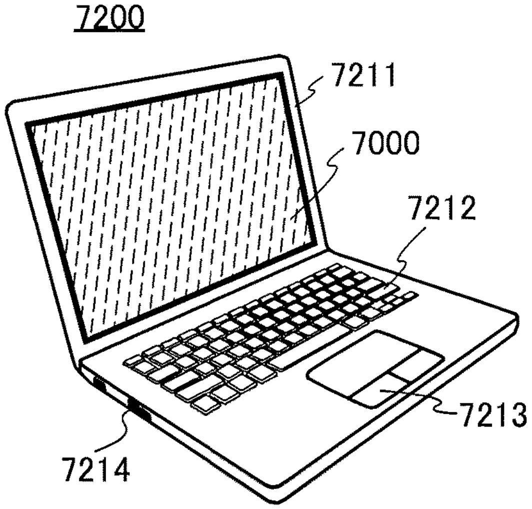

FIG. 24B illustrates an example of a notebook personal computer. A notebook personal computer 7200 includes a housing 7211, a keyboard 7212, a pointing device 7213, an external connection port 7214, and the like. In the housing 7211, the display portion 7000 is incorporated. The display device of one embodiment of the present invention can be used for the display portion 7000.

Figure 24C:
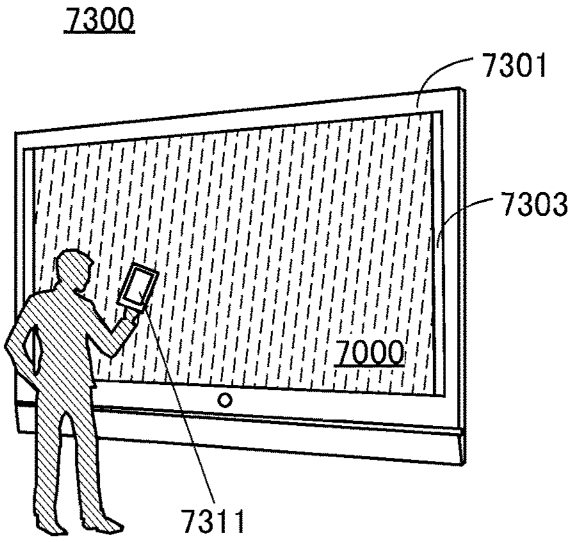
Figure 24D:
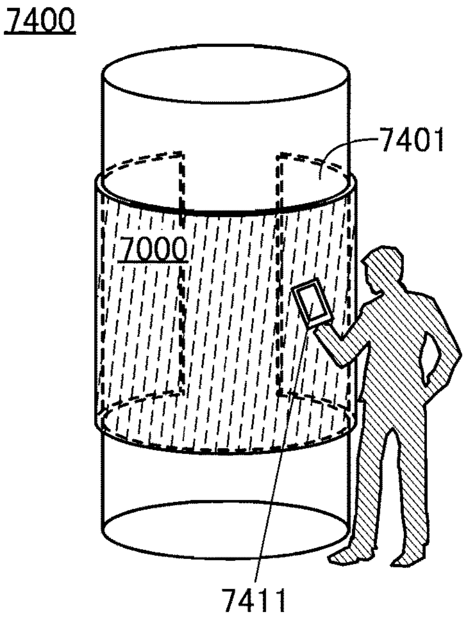

FIG. 24C and FIG. 24D illustrate examples of digital signage.

Digital signage 7300 illustrated in FIG. 24C includes a housing 7301, the display portion 7000, a speaker 7303, and the like. In addition, an LED lamp, an operation key (including a power switch or an operation switch), a connection terminal, a variety of sensors, a microphone, and the like can be included.

FIG. 24D illustrates digital signage 7400 mounted on a cylindrical pillar 7401. The digital signage 7400 includes the display portion 7000 provided along a curved surface of the pillar 7401.

The display device of one embodiment of the present invention can be used in the display portion 7000 in each of FIG. 24C and FIG. 24D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 24C and FIG. 24D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 25A:
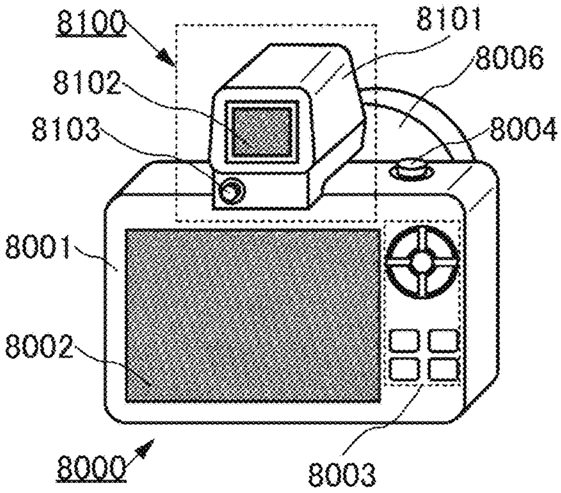
FIG. 25A to FIG. 25F are diagrams illustrating examples of electronic devices.

FIG. 25A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power button or the like.

The display device of one embodiment of the present invention can be used in the display portion 8002 of the camera 8000 and the display portion 8102 of the finder 8100. Note that a finder may be incorporated in the camera 8000.

Figure 25B:
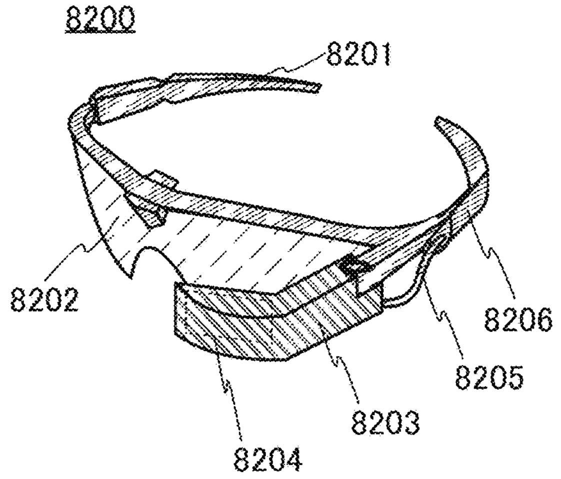

FIG. 25B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive video information and display it on the display portion 8204. The main body 8203 includes a camera, and information on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The display device of one embodiment of the present invention can be used for the display portion 8204.

Figure 25C:
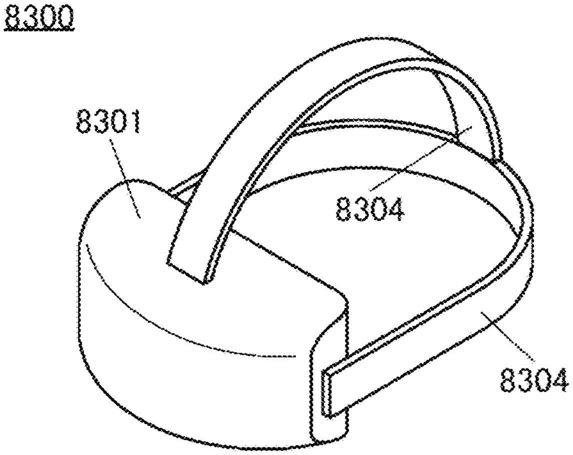
Figure 25D:
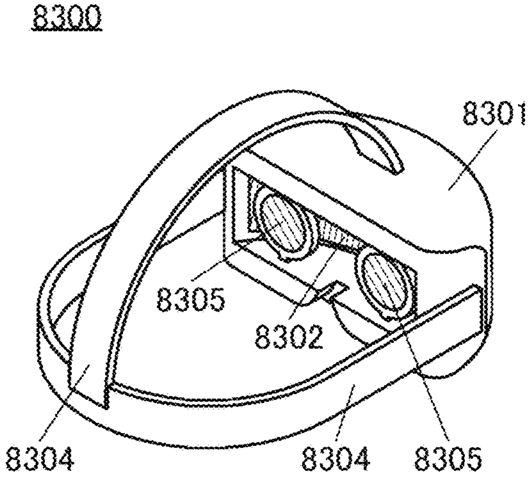
Figure 25E:
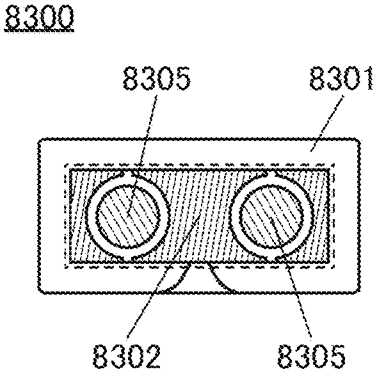

FIG. 25C to FIG. 25E are diagrams illustrating the appearance of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved so that the user can feel high realistic sensation. Another image displayed on another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display device of one embodiment of the present invention can be used for the display portion 8302. The display device of one embodiment of the present invention achieves an extremely high resolution. For example, a pixel is not easily seen by the user even when the user sees display that is magnified by the use of the lenses 8305 as illustrated in FIG. 25E. In other words, a video with a strong sense of reality can be seen by the user with the use of the display portion 8302.

Figure 25F:
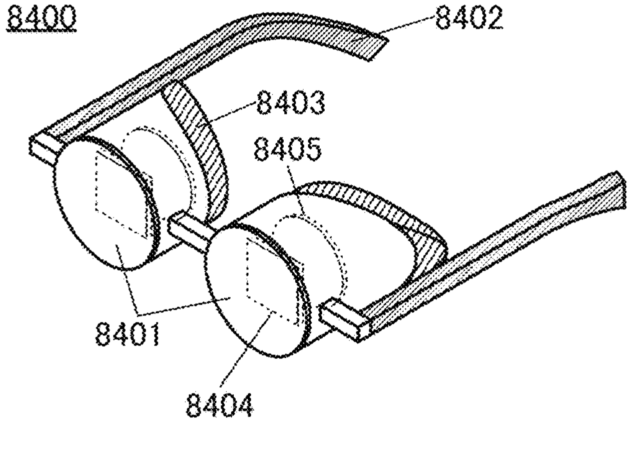

FIG. 25F is an external view of a goggles-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism, and the focus adjustment mechanism can adjust the position of the lens 8405 according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy videos and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 26A to FIG. 26F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays), a microphone 9008, and the like.

The electronic devices illustrated in FIG. 26A to FIG. 26F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic devices illustrated in FIG. 26A to FIG. 26F will be described in detail below.

Figure 26A:
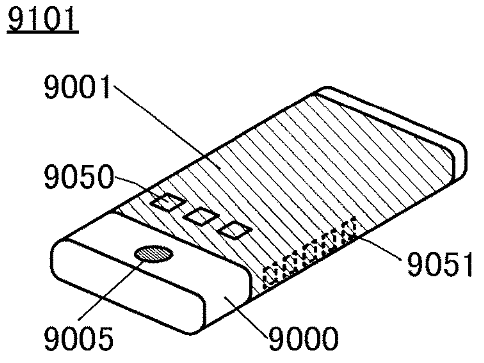
FIG. 26A to FIG. 26F are diagrams illustrating examples of electronic devices.

FIG. 26A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 26A illustrates an example in which three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the reception strength of an antenna. Alternatively, the icon 9050 or the like may be displayed at the position where the information 9051 is displayed.

Figure 26B:
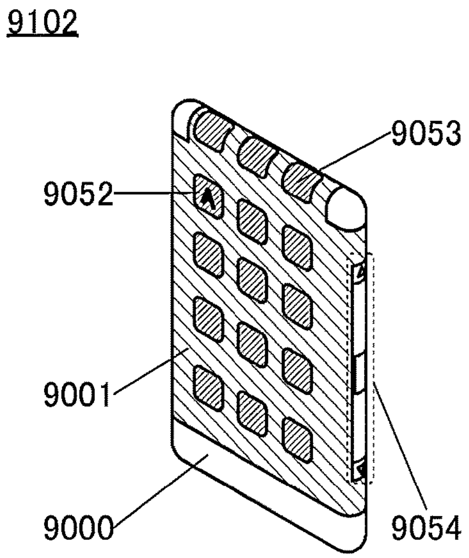

FIG. 26B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 26C:
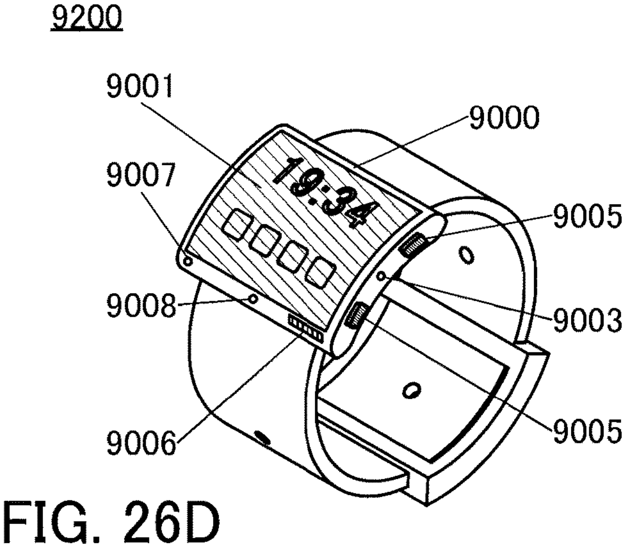

FIG. 26C is a perspective view illustrating a watch-type portable information terminal 9200. For example, the portable information terminal 9200 can be used as a Smartwatch (registered trademark). The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 26D:
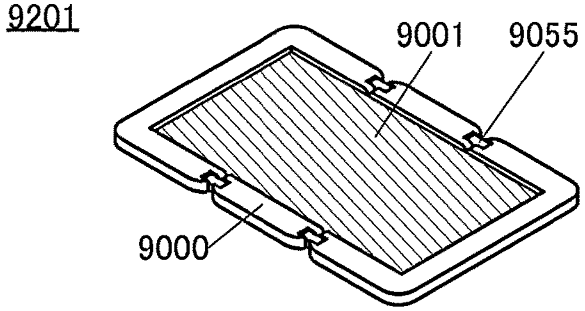
Figure 26E:
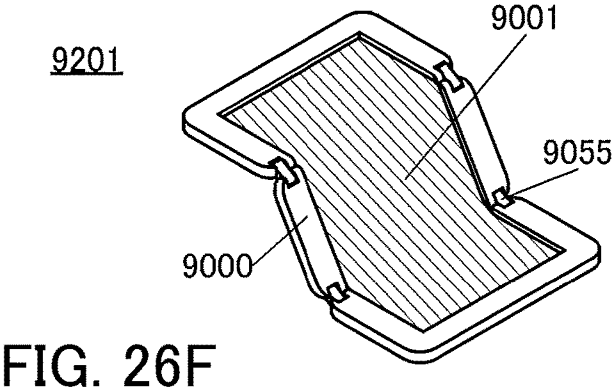
Figure 26F:
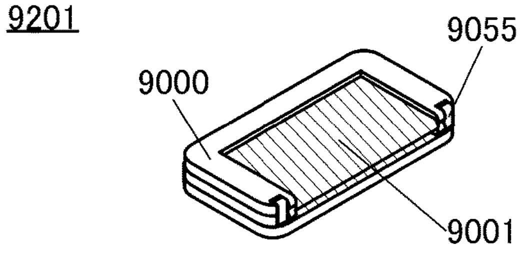

FIG. 26D to FIG. 26F are perspective views illustrating a foldable portable information terminal 9201. FIG. 26D is a perspective view of an opened state of the portable information terminal 9201, FIG. 26F is a perspective view of a folded state thereof, and FIG. 26E is a perspective view of a state in the middle of change from one of FIG. 26D and FIG. 26F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

Example

In this example, transistors were fabricated by the manufacturing method of one embodiment of the present invention, and observation of cross-sectional STEM images and measurement of electrical characteristics were performed.

<Fabrication of Samples>

In this example, Sample A to Sample D each including a plurality of transistors which have similar structures as the structure of the transistor 10 illustrated in FIG. 1 were fabricated by the method illustrated in FIG. 7 to FIG. 9. Note that the designed value of a channel length in Sample A was 0.5 μm, the designed value of a channel length in Sample B was 0.7 μm, the designed value of a channel length in Sample C was 1.0 μm, and the designed value of a channel length in Sample D was 1.5 μm. Note that in Sample A to Sample D, the designed value of a channel width was 5.0 μm.

First, a glass substrate was prepared as the substrate 11. Next, the conductive layer 15 was formed over the substrate 11. As the conductive layer 15, a tungsten film with a thickness of approximately 100 nm deposited by a sputtering method was used. Note that the conductive layer 15 functioning as a back gate was not provided in some of the plurality of transistors in Sample A to Sample D.

Next, the insulating layer 17 was formed to cover the conductive layer 15. In this example, the insulating layer 17 has a stacked-layer structure of the insulating layer 17*a* and the insulating layer 17*b* over the insulating layer 17*a*. As the insulating layer 17*a*, a silicon nitride film with a thickness of approximately 50 nm deposited by a PECVD method was used. As the insulating layer 17*b*, a silicon oxynitride film with a thickness of approximately 100 nm deposited by a PECVD method was used.

Next, the mask layer 25 with a thickness of 5 nm was provided over the insulating layer 17, and plasma treatment was performed to add oxygen ions to the insulating layer 17*a*. The mask layer 25 was formed by a sputtering method using an In—Ga—Zn oxide target (In:Ga:Zn=4:2:4.1 [atomic ratio]). The plasma treatment was performed under the following conditions: 300 sccm of an $O_2$ gas was used, the pressure was 25.06 Pa, the power of the upper electrode was 1000 W, the power of the lower electrode was 4750 W, and the treatment time was 120 seconds. After the addition of oxygen ions, the mask layer 25 was removed.

Next, the semiconductor layer 18 with a thickness of approximately 40 nm was formed over the insulating layer 17. The semiconductor layer 18 was formed by a sputtering method using an In—Ga—Zn oxide target (In:Ga:Zn=4:2:4.1 [atomic ratio]). The deposition conditions were as follows: the pressure was 0.6 Pa, the power supply was 2.5 kW, and the substrate temperature was 130° ° C. A mixed gas of an oxygen gas and an argon gas was used as a film formation gas, and the oxygen flow rate ratio was 50%.

Next, heat treatment was performed at a temperature of 450° C. in a nitrogen atmosphere for 30 minutes and subsequently, heat treatment was performed at 450° C. in a mixed atmosphere of oxygen and nitrogen for 30 minutes.

Next, the conductive film 12A with a thickness of approximately 100 nm to be the conductive layer 12*a* and the conductive layer 12*b* was formed, and the mask film 19A with a thickness of approximately 50 nm to be the mask layer 19 was formed thereover. The conductive film 12A was formed by a sputtering method. The mask film 19A was formed by a sputtering method using an In—Ga—Zn oxide target (In:Ga:Zn=5:1:3 [atomic ratio]). The deposition conditions were as follows: the pressure was 0.6 Pa, the power supply was 2.5 kW, and the substrate temperature was room temperature. An argon gas was used as a film formation gas.

Next, the resist mask 30 was formed in a region where the conductive layer 12*a* is to be formed, and the mask film 19A was processed by a wet etching method using the resist mask 30, whereby the mask layer 19 was formed. By the wet etching method, treatment was performed with use of a mixed acid aluminum solution for 30 seconds. The mixed acid aluminum solution is an aqueous solution containing less than 5% nitric acid, less than 10% acetic acid, and less than 80% phosphoric acid.

Next, the resist mask 40 was formed in a region where the conductive layer 12*b* is to be formed, and the conductive film 12A was processed by a dry etching method using the mask layer 19 and the resist mask 40, whereby the conductive layer 12*a* and the conductive layer 12*b* were formed. By the dry etching method, treatment was performed under the following conditions: 900 sccm of an $SF_6$ gas was used as an etching gas, the pressure was 2.5 Pa, the power of the upper electrode was 2000 W, the power of the lower electrode was 1000 W, and the treatment time was 60 seconds.

Here, the distance between the conductive layer 12*a* and the conductive layer 12*b* in Sample A was set to approximately 0.5 μm; the distance between the conductive layer 12*a* and the conductive layer 12*b* in Sample B was set to approximately 0.7 μm; the distance between the conductive layer 12*a* and the conductive layer 12*b* in Sample C was set to approximately 1.0 μm; and the distance between the conductive layer 12*a* and the conductive layer 12*b* in Sample D was set to approximately 1.5 μm.

Next, plasma treatment was performed. The plasma treatment was performed under the following conditions: a dinitrogen monoxide gas at a flow rate of 10000 sccm was used, the pressure was 200 Pa, the power was 150 W, the substrate temperature was 350° C., and the treatment time was 30 seconds.

Next, after the plasma treatment, the insulating layer 16 with a thickness of approximately 100 nm was successively formed without being exposed to the air. The insulating layer 16 is a stacked-layer film of a first silicon oxynitride film with a thickness of approximately 10 nm, a second silicon oxynitride film with a thickness of approximately 70 nm, and a third silicon oxynitride film with a thickness of approximately 20 nm which are formed by a PECVD method. The first silicon oxynitride film was formed under the following conditions: 50 sccm of an $SiH_4$ gas and 18000 sccm of an $N_2O$ gas were used as film formation gases; the pressure was 200 Pa; the power was 500 W; and the substrate temperature was 350° C. The second silicon oxynitride film was formed under the following conditions: 200 sccm of an $SiH_4$ gas and 12000 sccm of an $N_2O$ gas were used as film formation gases, the pressure was 300 Pa, the power was 700 W, and the substrate temperature was 350° C. The third silicon oxynitride film was formed under the following conditions: 70 sccm of an $SiH_4$ gas and 10500 sccm of an $N_2O$ gas were used as film formation gases, the pressure was 100 Pa, the power was 700 W, and the substrate temperature was 350° C.

Next, the conductive layer 20 was formed over the insulating layer 16. The conductive layer 20 is a stacked-layer film of a 20-nm-thick metal oxide film and a 100-nm-thick Mo—Nb alloy film formed thereover by a sputtering method. The metal oxide film was formed by a sputtering method using an In—Ga—Zn oxide target (In:Ga:Zn=4:2:4.1 [atomic ratio]). The deposition conditions were as follows: the pressure was 0.6 Pa, the power supply was 2.5 kW, and the substrate temperature was 130° ° C. An oxygen gas was used as a film formation gas. After the metal oxide film was formed, heat treatment was performed at 300° C. in an oxygen atmosphere for one hour.

Next, an acrylic resin with a thickness of approximately 1.5 μm was deposited to cover the formed transistor. Then, heat treatment was performed at 250° C. in a nitrogen atmosphere for one hour.

Through the above steps, Sample A to Sample D of this example were fabricated.

<Observation of Cross-Sectional STEM Image of Transistor>

Figure 27A:
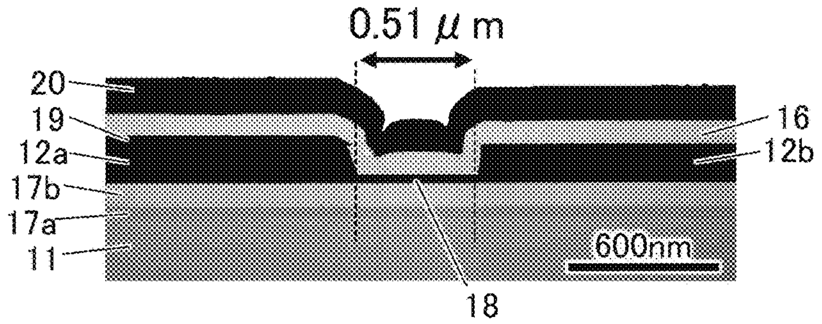
FIG. 27A to FIG. 27D are cross-sectional STEM images of this example.
Figure 27B:
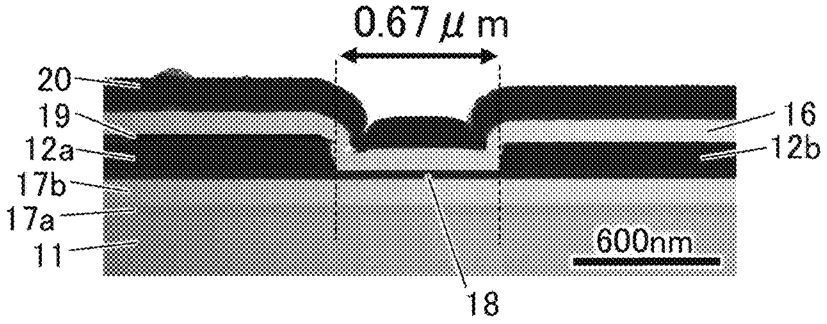
Figure 27C:
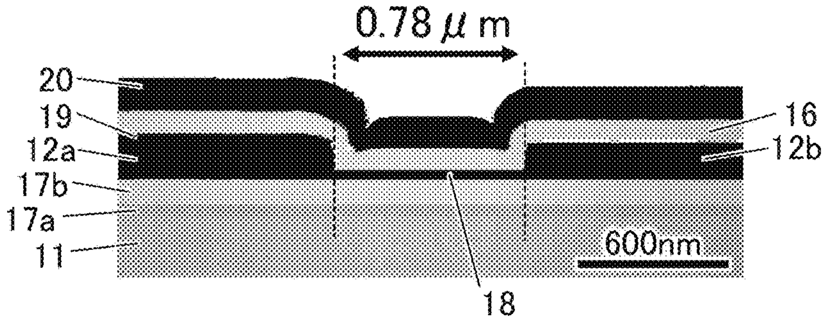
Figure 27D:
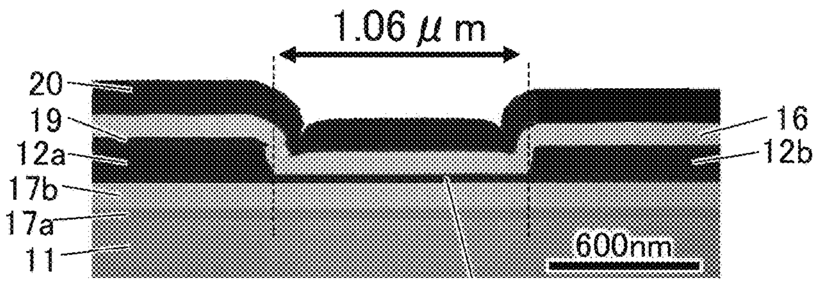

FIG. 27A to FIG. 27D show cross-sectional STEM images of Sample A to Sample C. As for Sample B, images of two points were taken (hereinafter referred to as Sample B1 and Sample B2). FIG. 27A is a cross-sectional STEM image of Sample A, FIG. 27B is a cross-sectional STEM image of Sample B1, FIG. 27C is a cross-sectional STEM image of Sample B2, and FIG. 27D is a cross-sectional STEM image of Sample C. Note that the images of Sample A to Sample C were taken with a scanning transmission electron microscope (STEM) manufactured by Hitachi High-Tech Corporation (model number: HD-2300), with an acceleration voltage of 50 kV. In this image taking, images of transistors without including the conductive layer 15 functioning as a back gate were taken.

As shown in FIG. 27A to FIG. 27D, Sample A had a channel length of 0.51 μm, Sample B1 had a channel length of 0.67 μm, Sample B2 had a channel length of 0.78 μm, and Sample C had a channel length of 1.06 μm; accordingly, almost the desired channel lengths were able to be obtained.

Furthermore, 20 points in Sample B having a submicron-sized channel length were measured, and the results of variations in the plane of the substrate were favorable: the average value of the channel lengths was 0.75 μm and 30=0.14 μm. It was shown that transistors having submicron-sized channel lengths can be formed while variations in the plane of the substrate are reduced by double patterning etching with use of the mask layer 19 and the resist mask 40 in the above manner.

<ID-VG Characteristics of Transistor>

Figure 28A:
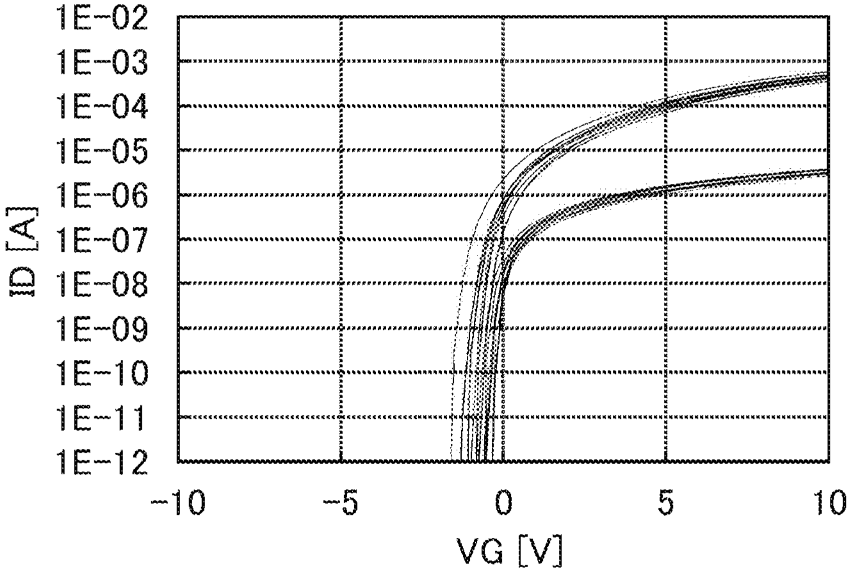
FIG. 28A and FIG. 28B are graphs showing ID-VG measurement results.
Figure 28B:
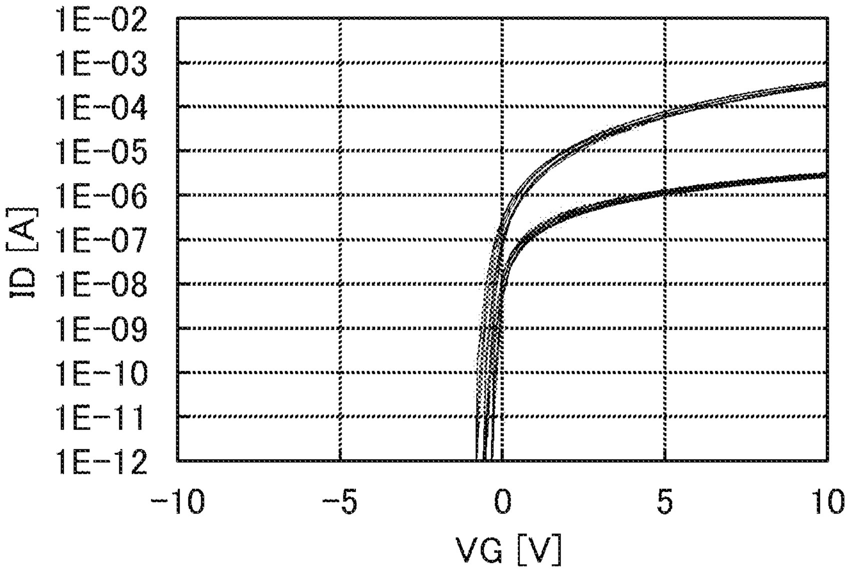
Figure 29A:
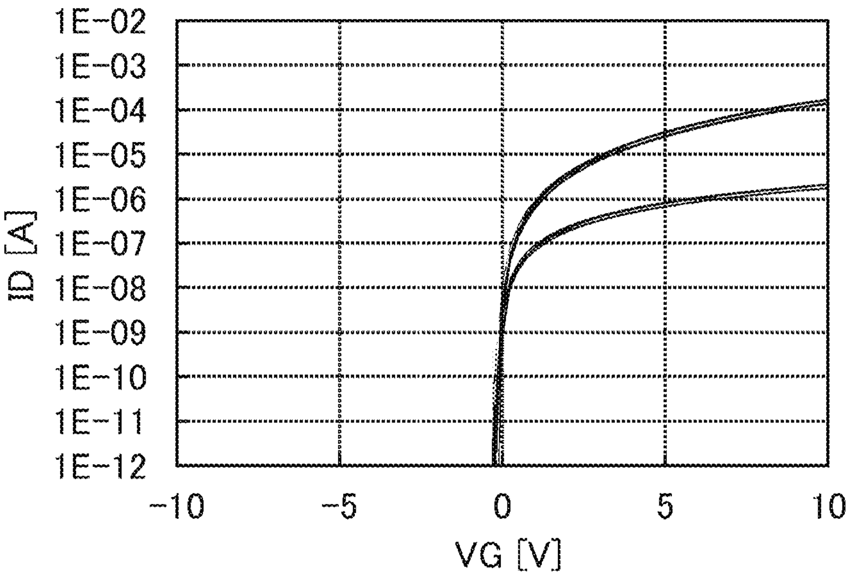
FIG. 29A and FIG. 29B are graphs showing ID-VG measurement results.
Figure 29B:
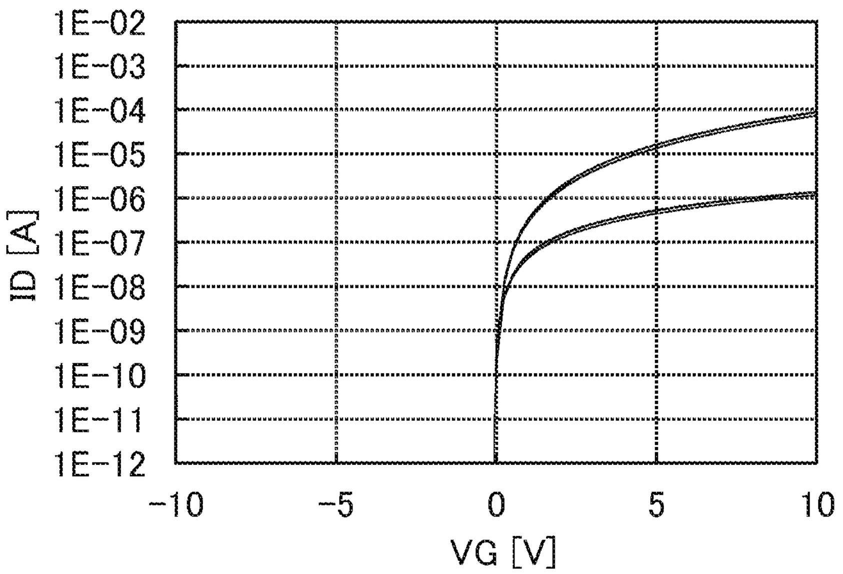

Next, FIG. 28A, FIG. 28B, FIG. 29A, and FIG. 29B show the measurement results of ID-VG characteristics of the transistors in Sample A to Sample D. FIG. 28A shows ID-VG characteristics of Sample A, FIG. 28B shows ID-VG characteristics of Sample B, FIG. 29A shows ID-VG characteristics of Sample C, and FIG. 29B shows ID-VG characteristics of Sample D. Note that in each of Sample A to Sample D, the ID-VG characteristics were measured at ten points.

As the conditions for measuring the ID-VG characteristics of the transistors, a voltage applied to the gate electrode (hereinafter also referred to as a gate voltage (VG)) was applied from −10 V to +10 V in steps of 0.25 V. Moreover, voltage applied to the source electrode (hereinafter also referred to as a source voltage (VS)) was 0 V, and voltage applied to the drain electrode (hereinafter also referred to as a drain voltage (VD)) was 0.1 V and 10 V. FIG. 28 and FIG. 29 show the result of measuring current flowing through the drain electrode (hereinafter also referred to as a drain voltage (VD)) under the above conditions.

As shown in FIG. 28 and FIG. 29, favorable electrical characteristics were obtained in each of Sample A to Sample D. In Sample A having a channel length of approximately 0.5 μm, slight variations in electrical characteristics were observed, whereas in Sample B having a channel length of approximately 0.7 μm, variations in electrical characteristics were able to be reduced.

Figure 30A:
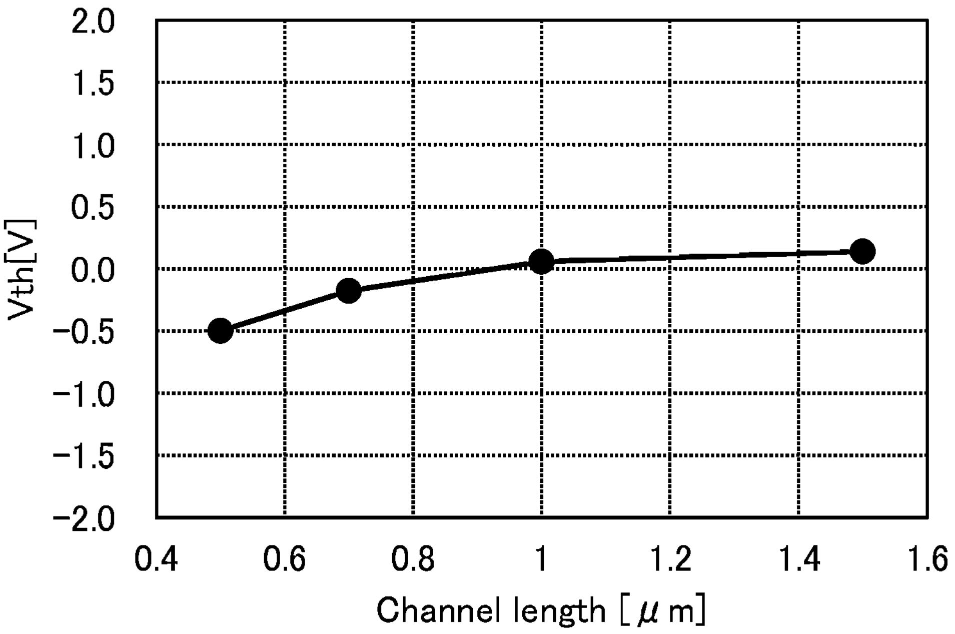
FIG. 30A is a graph showing threshold voltage calculation results.
Figure 30B:
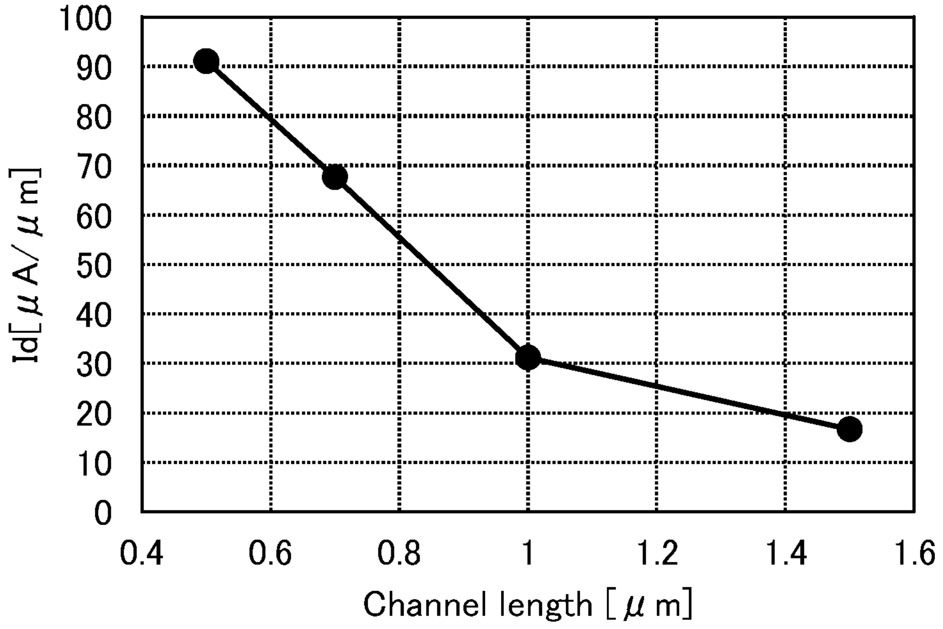
FIG. 30B is a graph showing on-state current calculation results.

Moreover, FIG. 30A and FIG. 30B show calculation results of threshold voltage (Vth) and on-state current (Id) in Sample A to Sample D. FIG. 30A is a graph in which the horizontal axis represents the channel length [μm] and the vertical axis represents Vth [V]. FIG. 30B is a graph in which the horizontal axis represents the channel length [μm] and the vertical axis represents Id [μA/μm]. Note that the on-state current (Id) is the average value of ten points of the drain current ID which was obtained under conditions of VD=VG=10 V and Vs=0 V and then normalized with the channel width.

As shown in FIG. 30A, Sample A to Sample D each obtained Vth within a range from −0.5 V to 0.5 V. Specifically, the Vth of Sample A having a channel length of approximately 0.5 μm was approximately −0.50 V, the Vth of Sample B having a channel length of approximately 0.7 μm was approximately −0.18V, the Vth of Sample C having a channel length of approximately 1.0 μm was approximately 0.06 V, and the Vth of Sample D having a channel length of approximately 1.5 μm was approximately 0.14 V.

As shown in FIG. 30B, a correlation was found between the channel length and the on-state current Id. In addition, in Sample A and Sample B having a short channel length, a significant improvement in on-state current was observed.

Figure 31A:
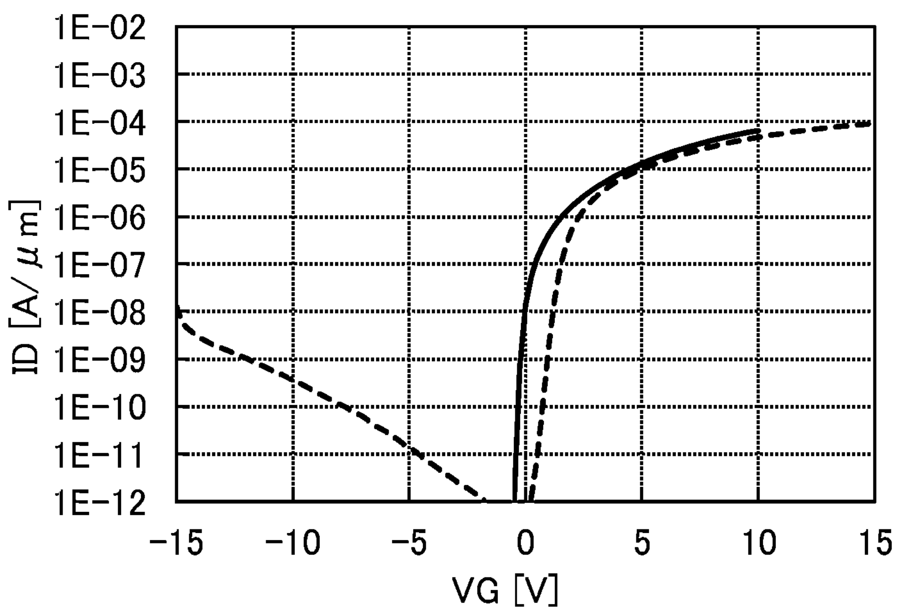
FIG. 31A is a graph showing ID-VG measurement results.
Figure 31B:
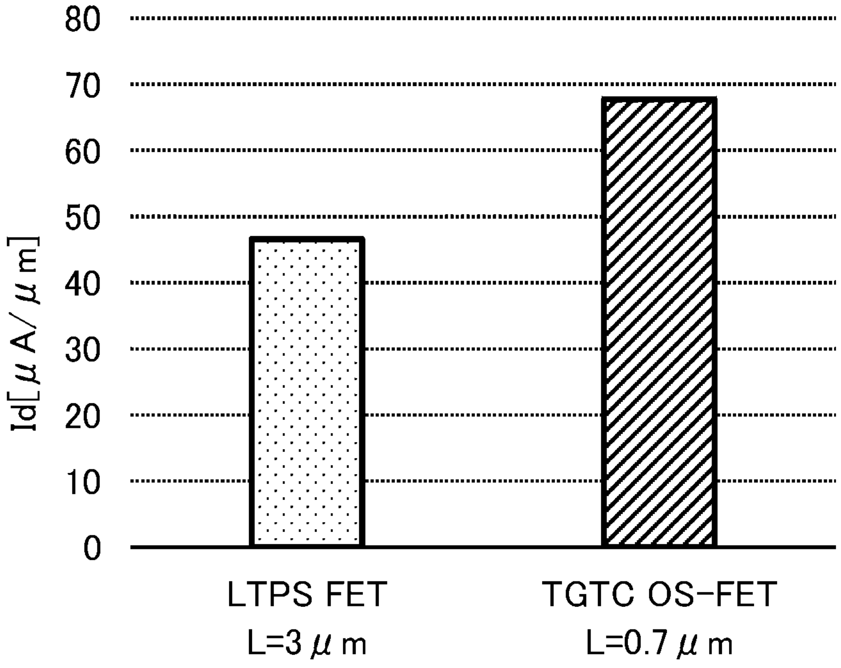
FIG. 31B is a graph showing comparison of on-state currents.

Moreover, FIG. 31A and FIG. 31B show the result of comparison of electrical characteristics between Sample B and an LTPS (Low Temperature Polycrystalline Silicon)-FET. FIG. 31A is a graph showing comparison of ID-VG characteristics between Sample B (solid line) and the LTPS-FET (dotted line). FIG. 31B is a graph showing comparison of on-state current (Id) between Sample B and the LTPS-FET. Here, an n-channel transistor having a channel length of approximately 3 μm was used as the LTPS-FET.

As shown in FIG. 31B, Sample B having a channel length of approximately 0.7 μm obtained more favorable characteristics than the LTPS-FET having a channel length of approximately 3 μm. Furthermore, as shown in FIG. 31A, the off-state current of Sample B having a submicron-sized channel length is lower than or equal to the lower detection limit.

Since the transistor in this example can be suitably used as a switching element (e.g., a driving transistor in a pixel circuit or a transistor included in a gate driver) which requires a large amount of current because of having favorable on-state characteristics as described above. Furthermore, the channel width can be reduced, leading to a circuit miniaturization. For example, the gate driver can be reduced, narrowing the frame of a display apparatus.

<Reliability of Transistor>

Next, reliability of Sample B was evaluated.

A gate bias stress test (a GBT test) was performed for the reliability evaluation. In this example, a PBTS (Positive Bias Temperature Stress) test and an NBTIS (Negative Bias Temperature Illumination Stress) test were performed.

In the PBTS test, a substrate over which the transistors were formed was held at 60° C., a voltage of 0 V was applied to the source and the drain of the transistors, and a voltage of +20 V was applied to the gate; this state was held for one hour. The test environment was a dark state.

In the NBTIS test, a substrate over which the transistors were formed was held at 60° C., a voltage of 0 V was applied to the source and the drain of the transistors and a voltage of −20 V was applied to the gate in a state where irradiation with white LED light at 10000 1× was performed; this state was held for one hour. The irradiation with white LED light was performed from the surface side of the glass substrate.

Figure 32:
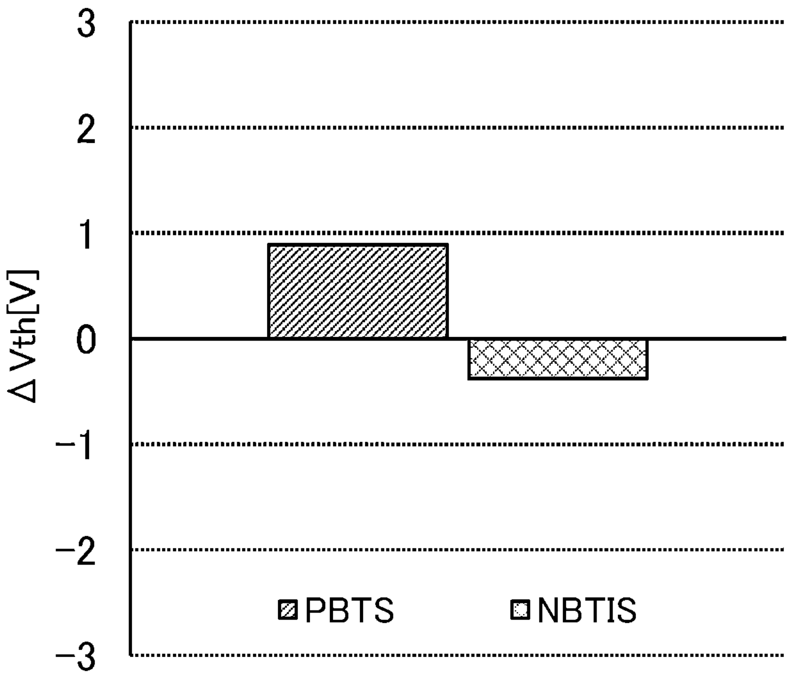
FIG. 32 is a graph showing reliability measurement results.

FIG. 32 shows the amounts of change in the threshold voltage (AVth) of Sample B between before and after the PBTS test and between before and after the NBTIS test.

As shown in FIG. 32, the amount of change in the threshold voltage in Sample B by each of the PBTS test and NBTIS test was less than 1 V, which shows favorable reliability.

The above results demonstrate that the transistors of one embodiment of the present invention have favorable electrical characteristics and high reliability.

REFERENCE NUMERALS

10: transistor, 11: substrate, 12*a*: conductive layer, 12A: conductive film, 12*b*: conductive layer, 13*a*: conductive layer, 13*b*: conductive layer, 13*c*: conductive layer, 15: conductive layer, 16: insulating layer, 17: insulating layer, 17*a*: insulating layer, 17*b*: insulating layer, 18: semiconductor layer, 18A: metal oxide film, 19: mask layer, 19A: mask film, 20: conductive layer, 22: insulating layer, 25: mask layer, 30: resist mask, 40: resist mask, 42: opening, 90B: light-emitting element, 90G: light-emitting element, 90R: light-emitting element, 90S: light-receiving element, 100: display apparatus, 101: substrate, 111: pixel electrode, 111C: connection electrode, 111G: pixel electrode, 111R: pixel electrode, 112B: organic layer, 112G: organic layer, 112R: organic layer, 113: common electrode, 114: organic layer, 115: organic layer, 121: protective layer, 124*a*: pixel, 124*b*: pixel, 125: insulating layer, 126: resin layer, 130: connection portion, 131: insulating layer, 200: display panel, 201: substrate, 202: substrate, 203: functional layer, 211: light-emitting element, 211B: light-emitting element, 211G: light-emitting element, 211R: light-emitting element, 211W: light-emitting element, 212: light-receiving element, 220: finger, 221: contact portion, 222: fingerprint, 223: image-capturing range, 225:

stylus, 226: path, 252: transistor, 254: connection portion, 260: transistor, 261: insulating layer, 262: insulating layer, 264: insulating layer, 265: insulating layer, 271: conductive layer, 272*a*: conductive layer, 272*b*: conductive layer, 273: conductive layer, 274: mask layer, 275: insulating layer, 278: connection portion, 281: semiconductor layer, 292: connection layer, 400: display apparatus, 411*a*: conductive layer, 411*b*: conductive layer, 411*c*: conductive layer, 412B: EL layer, 412G: EL layer, 413: common electrode, 414: organic layer, 416: protective layer, 417: light-blocking layer, 421: insulating layer, 422: resin layer, 430*b*: light-emitting element, 430*c*: light-emitting element, 442: adhesive layer, 453: substrate, 454: substrate, 455: adhesive layer, 462: display portion, 464: circuit, 465: wiring, 466: conductive layer, 472: FPC, 473: IC, 711: light-emitting layer, 712: light-emitting layer, 713: light-emitting layer, 720: layer, 720-1: layer, 720-2: layer, 730: layer, 730-1: layer, 730-2: layer, 750B: light-emitting device, 750G: light-emitting device, 750R: light-emitting device, 751: layer, 752: layer, 753B: light-emitting layer, 753G: light-emitting layer, 753R: light-emitting layer, 754: layer, 755: layer, 760: light-receiving device, 761: layer, 762: layer, 763: layer, 790: EL layer, 790*a*: EL layer, 790*b*: EL layer, 791: lower electrode, 791B: pixel electrode, 791G: pixel electrode, 791PD: pixel electrode, 791R: pixel electrode, 792: upper electrode, 795: coloring layer, 6500: electronic device, 6501: housing, 6502: display portion, 6503: power supply button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A semiconductor device comprising:

an oxide semiconductor layer over a substrate;

a source electrode and a drain electrode being apart from each other over the oxide semiconductor layer;

a mask layer in contact with a top surface of one of the source electrode and the drain electrode;

a first insulating layer covering the oxide semiconductor layer, the source electrode, the drain electrode, and the mask layer; and a first gate electrode being over the first insulating layer and overlapping with the oxide semiconductor layer, wherein the mask layer is not provided on the other of the source electrode and the drain electrode, wherein a side surface of the mask layer is aligned with a side surface of the one of the source electrode and the drain electrode, wherein the first insulating layer is in contact with a top surface and the side surface of the mask layer, the side surface of the one of the source electrode and the drain electrode, a top surface and a side surface of the other of the source electrode and the drain electrode, and a top surface of the oxide semiconductor layer, and wherein the semiconductor device comprises a region in which a distance between opposite end portions of the source electrode and the drain electrode is less than or equal to 1 μm.

2. The semiconductor device according to claim 1, further comprising:

a second gate electrode; and a second insulating layer, wherein the second gate electrode is provided between the oxide semiconductor layer and the substrate, and wherein the second insulating layer is provided between the oxide semiconductor layer and the second gate electrode.

3. The semiconductor device according to claim 2, wherein an opening is formed in the first insulating layer and the second insulating layer, and wherein the first gate electrode is in contact with the second gate electrode through the opening.

4. The semiconductor device according to claim 1, wherein the mask layer comprises a metal oxide, wherein the metal oxide comprises a same metal element as the oxide semiconductor layer, and wherein the source electrode and the drain electrode comprise at least one metal element selected from chromium, copper, aluminum, gold, silver, zinc, molybdenum, tantalum, titanium, tungsten, manganese, nickel, iron, and cobalt.

5. The semiconductor device according to claim 4, wherein the metal oxide comprises at least one of indium, an element M (the element M is one or more selected from gallium, aluminum, and yttrium), and zinc.

6. The semiconductor device according to claim 4, wherein the source electrode and the drain electrode each comprise tungsten.

7. A display apparatus comprising the semiconductor device according to claim 1.

8. The display apparatus according to claim 7, further comprising:

a first pixel; and a second pixel adjacent to the first pixel, wherein the first pixel comprises a first pixel electrode, a first EL layer over the first pixel electrode, and a common electrode over the first EL layer, wherein the second pixel comprises a second pixel electrode, a second EL layer over the second pixel electrode, and the common electrode over the second EL layer, and wherein the display apparatus comprises a region in which a distance between the first pixel electrode and the second pixel electrode is less than or equal to 8 μm.

9. The semiconductor device according to claim 1, wherein the oxide semiconductor layer comprises at least one of indium, an element M (the element M is one or more selected from gallium, aluminum, and yttrium), and zinc.

10. A semiconductor device comprising:

an oxide semiconductor layer over a substrate;

a source electrode and a drain electrode being apart from each other over the oxide semiconductor layer;

a mask layer in contact with a top surface of one of the source electrode and the drain electrode;

a first insulating layer covering the oxide semiconductor layer, the source electrode, the drain electrode, and the mask layer; and a first gate electrode being over the first insulating layer and overlapping with the oxide semiconductor layer, wherein the mask layer is not provided on the other of the source electrode and the drain electrode, wherein a side surface of the mask layer is aligned with a side surface of the one of the source electrode and the drain electrode, wherein the first insulating layer is in contact with a top surface and the side surface of the mask layer, the side surface of the one of the source electrode and the drain electrode, a top surface and a side surface of the other of the source electrode and the drain electrode, and a top surface of the oxide semiconductor layer, wherein in the oxide semiconductor layer, a thickness of a first region that overlaps with neither the source electrode nor the drain electrode is smaller than a thickness of a second region that overlaps with the other of the source electrode and the drain electrode, and wherein a length of the first region of the oxide semiconductor layer is less than or equal to 1 μm.

11. The semiconductor device according to claim 10, further comprising:

a second gate electrode; and a second insulating layer, wherein the second gate electrode is provided between the oxide semiconductor layer and the substrate, and wherein the second insulating layer is provided between the oxide semiconductor layer and the second gate electrode.

12. The semiconductor device according to claim 11, wherein an opening is formed in the first insulating layer and the second insulating layer, and wherein the first gate electrode is in contact with the second gate electrode through the opening.

13. The semiconductor device according to claim 10, wherein the mask layer comprises a metal oxide, wherein the metal oxide comprises a same metal element as the oxide semiconductor layer, and wherein the source electrode and the drain electrode comprise at least one metal element selected from chromium, copper, aluminum, gold, silver, zinc, molybdenum, tantalum, titanium, tungsten, manganese, nickel, iron, and cobalt.

14. The semiconductor device according to claim 13, wherein the metal oxide comprises at least one of indium, an element M (the element M is one or more selected from gallium, aluminum, and yttrium), and zinc.

15. The semiconductor device according to claim 13, wherein the source electrode and the drain electrode each comprise tungsten.

16. The semiconductor device according to claim 10, wherein the oxide semiconductor layer comprises at least one of indium, an element M (the element M is one or more selected from gallium, aluminum, and yttrium), and zinc.

17. A display apparatus comprising the semiconductor device according to claim 10.

18. The display apparatus according to claim 17, further comprising:

a first pixel; and a second pixel adjacent to the first pixel, wherein the first pixel comprises a first pixel electrode, a first EL layer over the first pixel electrode, and a common electrode over the first EL layer, wherein the second pixel comprises a second pixel electrode, a second EL layer over the second pixel electrode, and the common electrode over the second EL layer, and wherein the display apparatus comprises a region in which a distance between the first pixel electrode and the second pixel electrode is less than or equal to 8 μm.

* * * * *